(12) United States Patent
Kurokawa

(10) Patent No.: US 7,999,716 B2
(45) Date of Patent: Aug. 16, 2011

(54) ANALOG-DIGITAL CONVERSION CIRCUIT, TIMING SIGNAL GENERATING CIRCUIT, AND CONTROL DEVICE

(75) Inventor: Fujio Kurokawa, Nagasaki (JP)

(73) Assignee: Nagasaki University, National University Corporation, Nagasaki-shi (JP)

( * ) Notice: Subject to any disclaimer, the term of this patent is extended or adjusted under 35 U.S.C. 154(b) by 0 days.

(21) Appl. No.: 12/444,126

(22) PCT Filed: Aug. 22, 2007

(86) PCT No.: PCT/JP2007/066308
§ 371 (c)(1),
(2), (4) Date: May 4, 2009

(87) PCT Pub. No.: WO2008/041428
PCT Pub. Date: Apr. 10, 2008

(65) Prior Publication Data
US 2009/0267820 A1    Oct. 29, 2009

(30) Foreign Application Priority Data

Oct. 4, 2006 (JP) ................. 2006-272375
Aug. 1, 2007 (JP) ................. 2007-200249
Aug. 1, 2007 (JP) ................. 2007-201390
Aug. 1, 2007 (JP) ................. 2007-201391

(51) Int. Cl.
*H03M 1/60* (2006.01)

(52) U.S. Cl. ...................................... 341/157; 341/156
(58) Field of Classification Search .............. 341/155, 341/122, 141, 159, 157; 375/239
See application file for complete search history.

(56) References Cited

U.S. PATENT DOCUMENTS

| 5,818,797 A * | 10/1998 | Watanabe et al. ............. 368/113 |
| 6,411,241 B1 * | 6/2002 | Taketoshi ....................... 341/155 |
| 7,755,530 B2 * | 7/2010 | Terazawa et al. ............. 341/157 |

FOREIGN PATENT DOCUMENTS

| JP | 02-141029 | 5/1990 |
| JP | 2004-357030 | 12/2004 |

* cited by examiner

*Primary Examiner* — Peguy JeanPierre
(74) *Attorney, Agent, or Firm* — Alleman Hall McCoy Russell & Tuttle LLP

(57) ABSTRACT

There are provided an analog-digital converter circuit capable of performing the same degree of operation as being performed at a high-frequency oscillation pulse using a low-frequency oscillation pulse without using the high-frequency oscillation pulse, a timing signal generating circuit generating a timing signal at the high frequency, and a control device using the circuits. In an analog-digital converter circuit, a periodic signal generating circuit allows the first to j-th pulse counting devices of the N pulse counting devices to count a count value X and allows the other pulse counting devices to count a count value X−1 in each sampling period by sequentially generating N serial periodic signals at a delay time interval of [approximate value of one period (T) of periodic signals]÷N. A digital signal generating circuit converts the analog signal to the digital signal.

13 Claims, 83 Drawing Sheets

Pj depends on voltage at the time of operating.

|     | $S_{A1}$ | $S_{A2}$ | $S_{A3}$ | $S_{A4}$ | $S_{B1}$ | $S_{B2}$ | $S_{B3}$ | $S_{B4}$ |
| --- | --- | --- | --- | --- | --- | --- | --- | --- |
| 0   | ON  | OFF | OFF | OFF | ON  | OFF | OFF | OFF |
| T   | OFF | OFF | OFF | OFF | ON  | OFF | OFF | OFF |
| 2T  | ON  | OFF | OFF | OFF | OFF | ON  | OFF | OFF |
| 3T  | OFF | OFF | OFF | OFF | OFF | ON  | OFF | OFF |
| 4T  | ON  | ON  | OFF | OFF | OFF | OFF | ON  | OFF |
| 5T  | OFF | ON  | OFF | OFF | OFF | OFF | ON  | OFF |
| 6T  | ON  | OFF | OFF | OFF | OFF | OFF | ON  | OFF |
| 7T  | OFF | OFF | OFF | OFF | OFF | OFF | ON  | OFF |
| 8T  | ON  | ON  | ON  | OFF | OFF | OFF | OFF | ON  |
| 9T  | OFF | ON  | ON  | OFF | OFF | OFF | OFF | ON  |
| 10T | OFF | OFF | ON  | OFF | ON  | OFF | OFF | ON  |
| 11T | OFF | OFF | ON  | OFF | OFF | OFF | OFF | ON  |
| 12T | ON  | ON  | OFF | OFF | OFF | OFF | OFF | ON  |
| 13T | OFF | OFF | ON  | OFF | OFF | OFF | OFF | ON  |
| 14T | OFF | ON  | OFF | OFF | OFF | OFF | OFF | ON  |
| 14T | OFF | OFF | OFF | OFF | OFF | OFF | OFF | ON  |

ANALOG-DIGITAL CONVERSION CIRCUIT, TIMING SIGNAL GENERATING CIRCUIT, AND CONTROL DEVICE

TECHNICAL FIELD

The present invention relates to an analog-digital converter circuit generating bit data in analog-digital conversion by the use of a predetermined number of periodic signal output circuits and the same number of pulse counting devices as the periodic signal generating circuits, a timing signal generating circuit generating a timing signal in digital-analog conversion by the use of a predetermined number of periodic signal output circuits and the same number of pulse counting devices as the periodic signal output circuits, and a control device converting an analog signal of a control target into a digital signal, generating a controlling digital signal on the basis of the digital signal and controlling an analog quantity of the control target on the basis of the controlling digital signal.

BACKGROUND ART

In digital control of a power converter device, an analog output voltage or the like is converted into a digital signal, the digital signal is subjected to a filtering process by a digital signal processing circuit, a timing signal is generated by a timing signal generating circuit, and switching elements such as transistors are turned on or off on the basis of the timing signal. In the digital control, by enhancing a resolution at the time of performing the analog-digital conversion, it is possible to accomplish high-quality control.

DISCLOSURE OF THE INVENTION

Problem to be Solved by the Invention

However, an oscillator device generating high-frequency oscillation pulses increases in price. For example, in an oscillator device obtaining an oscillation frequency in the GHz order by multiplying an output of an inexpensive oscillator of about 25 MHz, a circuit size is enlarged and thus the manufacturing cost thereof generally increases.

In a device operating with an oscillator such as an analog-digital converter circuit, the power consumption rapidly increases as the frequency increases. Accordingly, the economic efficiency is degraded or countermeasures for heat dissipation or the like are necessary.

An object of the invention is to provide an analog-digital converter circuit generating bit data in analog-digital conversion by the use of a predetermined number of periodic signal output circuits and the same number of pulse counting devices as the periodic signal generating circuits, a timing signal generating circuit generating a timing signal in digital-analog conversion by the use of a predetermined number of periodic signal output circuits and the same number of pulse counting devices as the periodic signal output circuits, and a control device converting an analog signal of a control target into a digital signal, generating a controlling digital signal on the basis of the digital signal and controlling an analog quantity of the control target on the basis of the controlling digital signal.

Another object of the invention is to provide an analog-digital converter circuit and a timing signal generating circuit capable of performing the same degree of operation as being performed at a high-frequency oscillation pulse using a low-frequency oscillation pulse without using the high-frequency oscillation pulse and a control device using the circuits.

Means for Solving the Problem

According to an aspect of the invention, there is provided an analog-digital converter circuit having the following configurations of [1] to [5].

[1] An analog-digital converter circuit comprising:
a periodic signal output circuit receiving a temporally-varying analog signal as an input, replacing the analog signal with N serial periodic signals of a frequency corresponding to the magnitude of the analog signal, and outputting the N serial periodic signals;
N pulse counting devices counting the number of pulses of the N serial periodic signals; and
a digital signal generating circuit receiving the N serial periodic signals as an input and generating a digital signal corresponding to the magnitude of the analog signal from the periodic signals every sampling period,
wherein the periodic signal generating circuit allows the first to j-th pulse counting devices of the N pulse counting devices to count a count value X and allows the other pulse counting devices to count a count value X−1 in each sampling period by sequentially delaying and generating the N serial periodic signals, and
wherein the digital signal generating circuit converts the analog signal to the digital signal with a resolution N times higher than that for converting the analog signal into the digital signal in the sampling period on the basis of the counting statuses of the N pulse counting devices.

[2] The analog-digital converter circuit according to [1], wherein the periodic signal output circuit sequentially generates the N serial periodic signals at a delay time interval of [approximate value of one period (T) of periodic signals]÷N.

[3] The analog-digital converter circuit according to [1] or [2], wherein the periodic signal output circuit includes N converters converting a magnitude of an electric signal into a frequency and the converters generate the N serial periodic signals.

[4] The analog-digital converter circuit according to [2] or [3], wherein the converters include an integration circuit and the periodic signals generated by the converters have a time period from the operation start of the integration circuits with an input voltage to the operation end (for example, when the integration circuit is a CR circuit, a time period from a time point of starting charging a capacitor with a reference voltage and until ending charging the capacitor and starting discharging the capacitor when the charged voltage reaches a threshold value, and returning the charged voltage to an initial voltage) as one period.

[5] The analog-digital converter circuit according to any one of [1] to [4], wherein the periodic signal output circuit includes at least one converter converting a magnitude of an electric signal into a frequency and at least one delay circuit delaying and outputting the output signal of the converter, and the at least one converter and the delay circuit generate the N serial periodic signals.

In the invention, the "pulse counting device" is typically a counter, but may be formed by a shift register or a circuit including a CPU.

In the invention, the "converter converting a magnitude of an electric signal into a frequency" is a voltage-controlled oscillator, but is not limited to the voltage-controlled oscillator as long as it can convert the amplitude of the voltage or current to be converted into a frequency (specifically, periodic pulse).

According to another aspect of the invention, there is provided a timing signal generating circuit having the following configurations [6] to [10].

[6] A timing signal generating circuit comprising:
a periodic signal output circuit outputting M serial periodic signals of a frequency;
M comparison pulse counting devices receiving the M serial periodic signals corresponding to a magnitude of a digital signal and outputting a predetermined signal when a count value reaches a predetermined value; and
a signal generating circuit receiving the predetermined M signals from the M comparison pulse counting devices and generating a timing signal at a time interval corresponding to the magnitude of the digital signal from the predetermined signals every reference period,
wherein a first count value is set in the first to k-th comparison pulse counting devices of the M comparison pulse counting devices and a second count value is set in the other comparison pulse counting devices, and
wherein the signal generating circuit generates the timing signal with a resolution N times higher than that for generating the timing signal by the use of one comparison pulse counting device on the basis of the output statuses of the M comparison pulse counting devices by receiving the M series periodic signals at a time interval sequentially delayed.

[7] The timing signal generating circuit according to [6], wherein the M serial periodic signals are sequentially input at a delay time interval of [approximate value of one period (T) of periodic signals]÷M.

[8] The timing signal generating circuit according to [6] or [7], wherein a distribution circuit setting the count value is provided to the M comparison pulse counting devices.

[9] The timing signal generating circuit according to any one of [6] to [8], wherein the periodic signal output circuit includes M converters converting a magnitude of an electric signal into a frequency and the converters generate the periodic signals.

[10] The timing signal generating circuit according to any one of [6] to [9], wherein the converters include an integration circuit and the periodic signals generated by the converters have a time period from the operation start of the integration circuits with an input voltage to the operation end (a time period from a time point of starting charging a capacitor with a reference voltage and until ending charging the capacitor and starting discharging the capacitor when the charged voltage reaches a threshold value, and returning the charged voltage to an initial voltage) as one period.

[11] A control device comprising:
the analog-digital converter circuit according to any one of [1] to [5];
the timing signal generating circuit according to any one of [6] to [10]; and
a digital signal processing circuit,
wherein the analog-digital converter circuit digitalizes an analog output of a control target,
wherein the digital signal processing circuit processes the digitalized signal and generates a digital timing value, and
wherein the timing signal generating circuit generates a controlling timing signal on the basis of the digital timing value.

[12] The control device according to [11], wherein the periodic signal output circuit used in the analog-digital converter circuit and the periodic signal output circuit used in the timing signal generating circuit are shared.

[13] The control device according to [11] or [12], wherein the digital signal processing circuit performs a digital filter operation, one operation of P control, I control, and D control, or a combination thereof.

[14] The control device according to any one of [11] to [13], wherein the control target is a power converter circuit including a switching element,
wherein the analog-digital converter circuit receives the output voltage of the power converter circuit as an input, and
wherein the timing signal generating circuit outputs an ON/OFF timing signal to the switch element of the power converter circuit.

ADVANTAGE OF THE INVENTION

According to the invention, it is possible to provide an analog-digital converter circuit generating bit data in analog-digital conversion by the use of a predetermined number of periodic signal output circuits and the same number of pulse counting devices as the periodic signal generating circuits, a timing signal generating circuit generating a timing signal in digital-analog conversion by the use of a predetermined number of periodic signal output circuits and the same number of pulse counting devices as the periodic signal output circuits, and a control device converting an analog signal of a control target into a digital signal, generating a controlling digital signal on the basis of the digital signal and controlling an analog quantity of the control target on the basis of the controlling digital signal.

According to the invention, since it is possible to perform the same degree of operation as being performed at a high-frequency oscillation pulse using a low-frequency oscillation pulse without using the high-frequency oscillation pulse, it is possible to further reduce the manufacturing cost and the power consumption, compared with the known analog-digital converter circuit, timing signal generating circuit, and control device having the same performance.

That is, the analog-digital converter circuit and the timing signal generating circuit according to the invention can perform the same degree of high-speed operation as being performed at several times to several tens times-frequency oscillation pulses using a low-frequency oscillation pulse.

According to the invention, a control device can be constructed by combining the analog-digital converter circuit and the timing signal generating circuit, thereby constructing a control system with high performance at low cost.

BRIEF DESCRIPTION OF THE DRAWINGS

FIG. 49 is a diagram illustrating a relation between a delay time of a signal output from the timing signal generating circuit and an ON/OFF state of a switch group of the phase shift circuit.

FIG. 54(A) is a diagram illustrating a part of an oscillation circuit and illustrating an example where a bipolar transistor is connected in series to a resistor and FIG. 54(B) is a diagram illustrating an example of the periodic signal generating circuit in which groups of a serial connection circuit of the transistor and the resistor disposed in a main current path of the transistor are connected in parallel.

FIG. 66 is a diagram illustrating a pulse generating circuit used in the invention, where

FIG. 78(A) shows an example where the waveform synthesizing circuit is an AND circuit and FIG. 78(B) shows an example where the waveform synthesizing circuit is an OR circuit.

FIG. 79(A) shows an example where the waveform synthesizing circuit is an AND circuit and FIG. 79(B) shows an example where the waveform synthesizing circuit is an OR circuit.

DESCRIPTION OF REFERENCE NUMERALS AND SIGNS

1: ANALOG-DIGITAL CONVERTER CIRCUIT
2: TIMING SIGNAL GENERATING CIRCUIT
3: DIGITAL SIGNAL PROCESSING CIRCUIT
4: CONTROL SYSTEM
5: CONTROL TARGET
7: TIMING SIGNAL GENERATING CIRCUIT
8: TIMING SIGNAL GENERATING CIRCUIT
9: PULSE GENERATING CIRCUIT
11: PERIODIC SIGNAL OUTPUT CIRCUIT
12: COUNTER
13: DIGITAL SIGNAL GENERATING CIRCUIT
21: PERIODIC SIGNAL OUTPUT CIRCUIT
22: COMPARISON COUNTER
23: SIGNAL GENERATING CIRCUIT
24: DISTRIBUTION CIRCUIT
51: ON/OFF SIGNAL GENERATING CIRCUIT
61: POWER SOURCE
62: LOAD
71: REPEAT SIGNAL GENERATING CIRCUIT
72, 721, 722, 51: PHASE SHIFT CIRCUIT
73, 52: PHASE SHIFT CONTROLLER
74, 741, 742, 74(1), 74(2), . . . , 74(M): COUNTER CIRCUIT
75, 751, 752: SELECTION CIRCUIT
76: SELECTION CONTROLLER
79: WAVEFORM SHAPING CIRCUIT
80: PHASE SHIFT CIRCUIT GROUP
81: PERIODIC SIGNAL GENERATING CIRCUIT
82: COUNTER CIRCUIT GROUP
83: SETTING CIRCUIT
84: SIGNAL SELECTING CIRCUIT
85: SIGNAL SELECTION CONTROLLER

86: FREQUENCY CONTROLLER
87: OSCILLATION CIRCUIT
88: SELECTION SWITCH (MULTIPLEXER)
89: MEMORY DEVICE GROUP
91: INTEGRATION CIRCUIT
92: REFERENCE SIGNAL OUTPUT CIRCUIT
93: COMPARISON CIRCUIT
94: WAVEFORM SYNTHESIZING CIRCUIT
711: OSCILLATION CIRCUIT GROUP
712: PHASE SHIFT CIRCUIT
713: SHIFT CONTROLLER
810: PHASE SHIFT CONTROLLER
811: FIRST FREQUENCY SIGNAL GENERATING CIRCUIT
812: SECOND FREQUENCY SIGNAL GENERATING CIRCUIT
813: THIRD FREQUENCY SIGNAL GENERATING CIRCUIT
814: FOURTH FREQUENCY SIGNAL GENERATING CIRCUIT
821: FIRST COUNTER CIRCUIT
822: SECOND COUNTER CIRCUIT
823: THIRD COUNTER CIRCUIT
824: FOURTH COUNTER CIRCUIT
801: FIRST PHASE SHIFT CIRCUIT
802: SECOND PHASE SHIFT CIRCUIT
803: THIRD PHASE SHIFT CIRCUIT
804: FOURTH PHASE SHIFT CIRCUIT
820: COUNTER CIRCUIT
921: D/A CONVERTER
922: LOW-PASS FILTER
$dly_k$: DELAY CIRCUIT (k=1, 2, ..., AND Q)
ES: EXTERNAL SIGNAL
$frq_1, frq_2, frq_3, frq_4$: FREQUENCY
$f_1, f_2, f_3, f_4, ..., f_M$: FREQUENCY
$FRQ_4$: FOURTH PERIODIC SIGNAL
$FRQ_3$: THIRD PERIODIC SIGNAL
$FRQ_2$: SECOND PERIODIC SIGNAL
$FRQ_1$: FIRST PERIODIC SIGNAL
$I_B$: BASE CURRENT AS CONTROL CURRENT
$N_1, N_2, N_3, N_4$: TIMING VALUE
PLS: REPEAT SIGNAL
$PLS_{PS}$
$Phase_k$: PHASE SHIFT SIGNAL (k=1, 2, ..., AND M)
$PG_k$: k-th OSCILLATION CIRCUIT (k=1, 2, ..., AND M)
$PLS_k$: k-th PULSE (k=1, 2, ..., AND M)
$q_1, q_2, ..., q_{M-1}$: NUMBER OF SIGNALS
$rg_2, rg_1, rg_3$: REGISTER
$r_{eq}$: VARIABLE RESISTOR
$R_1$: RESISTOR
$S_{Ak}$: BYPASS SWITCH GROUP (k=1, 2, ..., AND Q)
$S_{Bk}$: OUTPUT SWITCH (k=1, 2, ..., AND Q)
$S_{Ck}$: SHORT-CIRCUIT PREVENTING SWITCH (k=1, 2, ..., AND Q)
SW: SWITCH
TS, $TS_1$, $TS_2$: TIMING SIGNAL
TS: TIMING SIGNAL
Tr: BIPOLAR TRANSISTOR

BEST MODE FOR CARRYING OUT THE INVENTION

Figure 1:
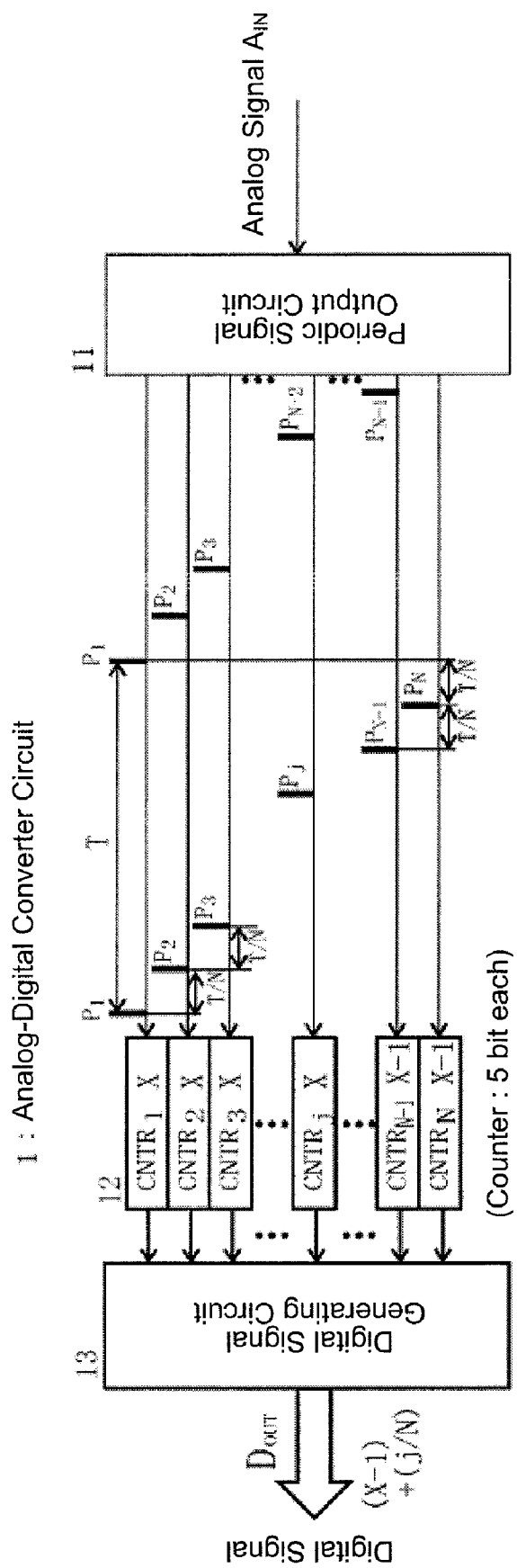
FIG. 1 is a diagram illustrating a first example of an analog-digital converter circuit according to the invention.

FIG. 1 is a diagram illustrating a first example of an analog-digital converter circuit according to the invention. In FIG. 1, an analog-digital converter circuit 1 includes a periodic signal output circuit 11, a counter 12, and a digital signal generating circuit 13.

The periodic signal output circuit 11 receives a temporally-varying analog signal $A_{IN}$, replaces the analog signal $A_{IN}$ with N serial periodic signals $P_1$ to $P_N$ of a frequency $f_s$ corresponding to the magnitude, and outputs the N serial periodic signals.

The counter 12 includes N counters $CNTR_1$ to $CNTR_N$ counting the number of pulses of the N serial periodic signals $P_1$ to $P_N$. The digital signal generating circuit 13 receives the N serial periodic signals $P_1$ to $P_N$ and generates a digital signal $D_{OUT}$ corresponding to the magnitude of the analog signal $A_{IN}$ from the periodic signals $P_1$ to $P_N$ every sampling period $T_{SMPL}$.

In the invention, the periodic signal output circuit 11 sequentially generates the N serial periodic signals $P_1$ to $P_N$ at a delay time interval of [approximate value of one period (T) of periodic signals $P_1$ to $P_N$]÷N. For example, $P_2$ is a signal delayed by (T/N) from $P_1$ and $P_3$ is a signal delayed by (T/N) from $P_2$.

Accordingly, in the sampling period $T_{SMPL}$, the first to j-th counters $CNTR_1$ to $CNTR_j$ of the N counters 12 count a count value X and the other counters count a count value (X−1). However, when j=N, "the other counters" do not exist. That is, the count values of all the counters $CNTR_1$ to $CNTR_N$ are X.

When the precision of the counters $CNTR_1$ to $CNTR_N$ is a bits, the precision (resolution) of the output signals of the periodic signal output circuit 11 is $2^a$N. That is, the digital signal generating circuit 13 converts the analog signal $A_{IN}$ into the digital signal (digital numerical value) $D_{OUT}$ with a resolution N times higher than that for converting the analog signal into the digital signal in the sampling period $T_{SMPL}$ on the basis of the counting statuses of the N counters $CNTR_1$ to $CNTR_N$.

For example, when the count value of the counters $CNTR_1$ to $CNTR_j$ is X and the count value of the counters $CNTR_{j+1}$ to $CNTR_N$ is (X−1), the final count value is (X−1)+(j/N).

Figure 2:
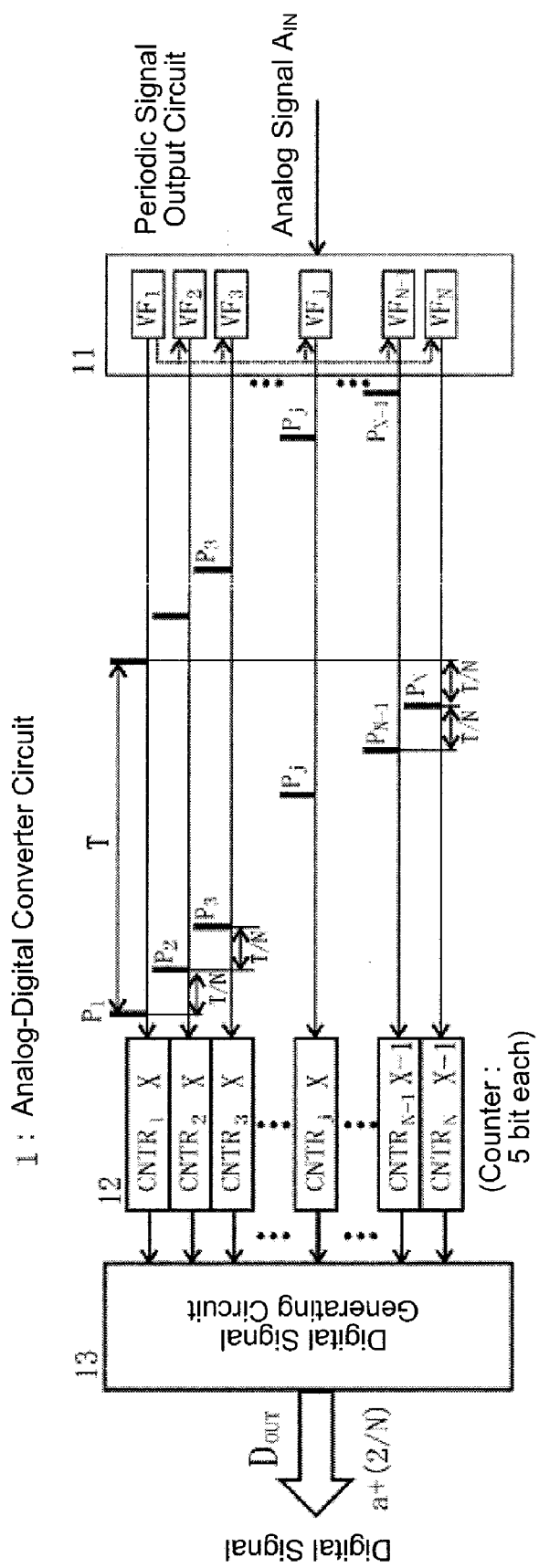
FIG. 2 is a diagram illustrating a second example of the analog-digital converter circuit according to the invention.

FIG. 2 is a diagram illustrating a second example of the analog-digital converter circuit according to the invention. In FIG. 2, the periodic signal output circuit 11 includes N voltage-frequency converter circuit $VF_1$ to $VF_N$. In FIG. 2, the voltage-frequency converter circuit $VF_1$ generates operation start timing signals of $P_1, P_2, ...,$ and, $P_N$ (see the dotted line in FIG. 2), but like a third example described later, the operation start timing signals may be generated by a controller.

Figure 3:
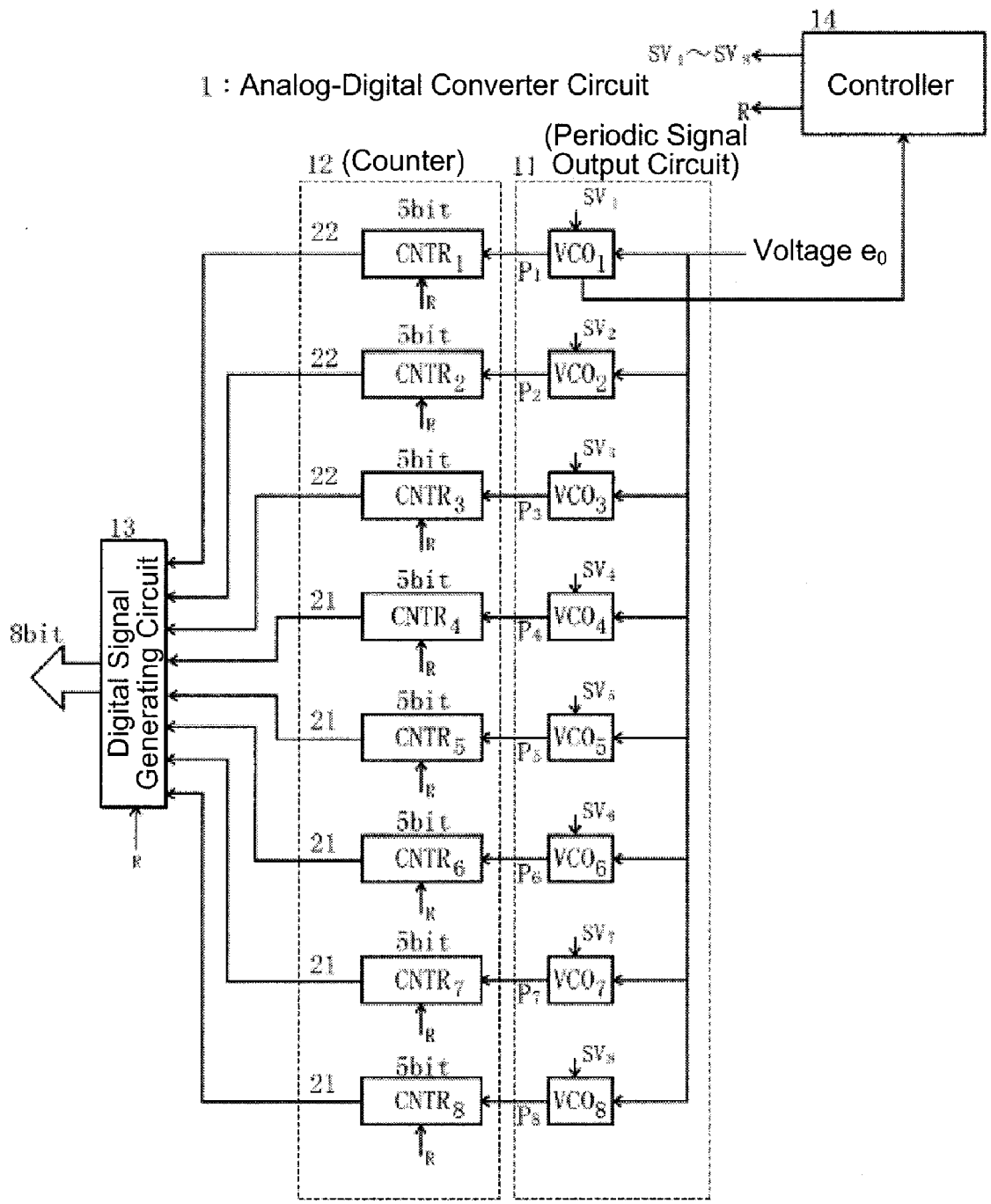
FIG. 3 is a diagram illustrating a third example of the analog-digital converter circuit according to the invention.

FIG. 3 is a diagram illustrating a third embodiment of the invention of the analog-digital converter circuit according to the invention. In FIG. 3, the analog-digital converter circuit 1 includes a periodic signal output circuit 11, a counter 12, a digital signal generating circuit 13, and a controller 14. In FIG. 3, the counter 12 includes counters $CNTR_1$ to $CNTR_N$. In this example, since the resolution of the counters $CNTR_1$ to $CNTR_N$ is 5 bits and the counter 12 includes 8 (=$2^3$) counters $CNTR_1$ to $CNTR_8$, the analog-digital converter circuit 1 has a resolution of 8 bits as a whole.

The periodic signal output circuit 11 receives a voltage $e_O$ as the temporally-varying analog signal, replaces the voltage $e_O$ with 8 serial periodic signals $P_1$ to $P_8$ of a frequency $f_s$ corresponding to the magnitude thereof, and outputs the 8 serial periodic signals. Specifically, the periodic signal output circuit 11 includes voltage-controlled oscillators $VCO_1$ to $VCO_N$. The controller 14 generates operation start timing signals $SV_1$ to $SV_8$ of the voltage-controlled oscillators $VCO_1$ to $VCO_N$ and an operation period signal R of the analog-digital converter circuit 1.

Figure 4:
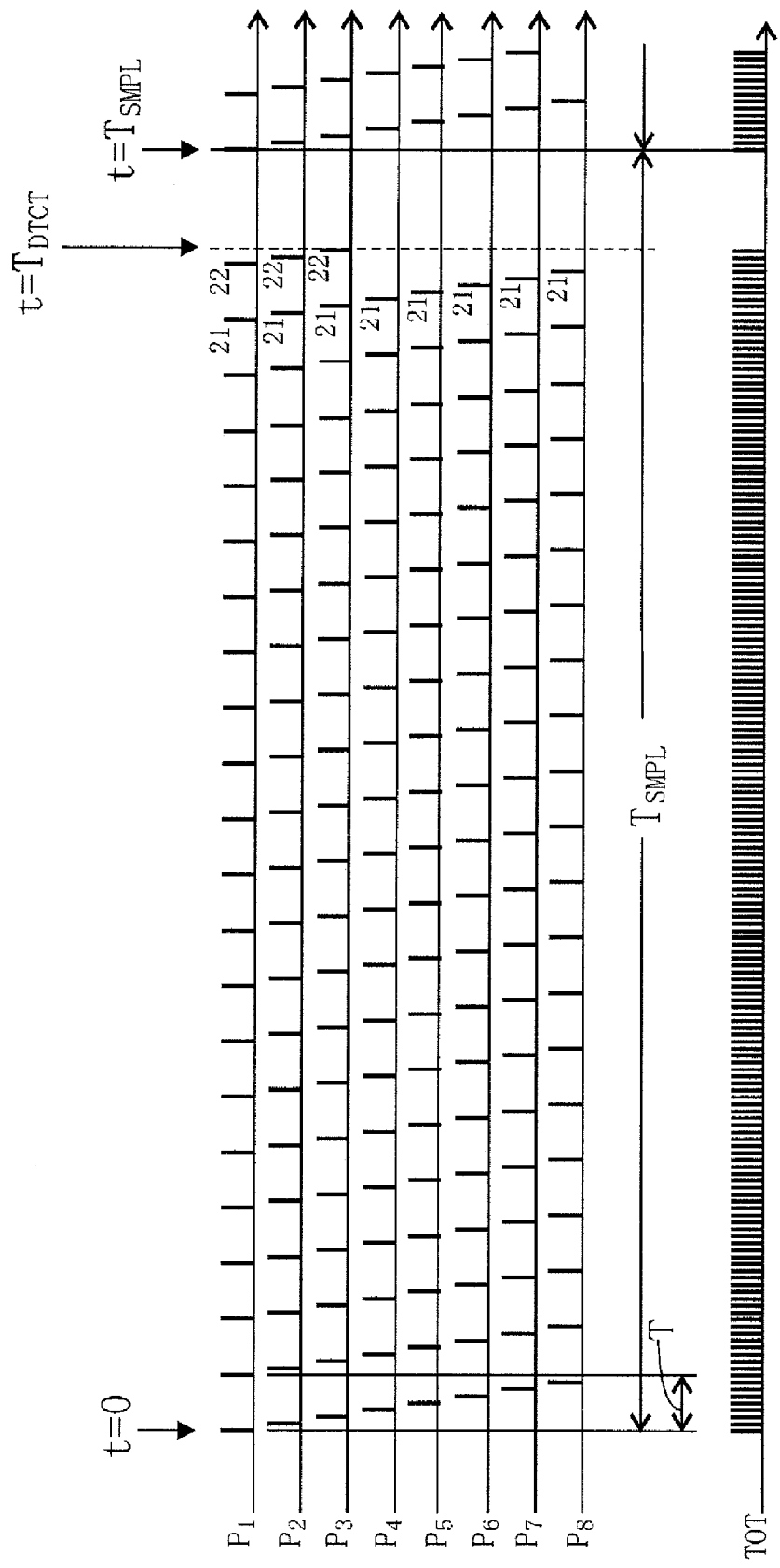
FIG. 4 is a timing diagram illustrating a signal generated by a periodic signal output circuit shown in FIG. 3.

As shown in FIG. 4, the periodic signal output circuit 11 sequentially generates 8 serial periodic signals $P_1$ to $P_8$ at a delay time interval of [approximate value of one period (T) of periodic signals $P_1$ to $P_8$]÷8. In this example, the resolution equivalent to the resolution of the pulse series indicated by TOT in FIG. 4 can be obtained.

The counters $CNTR_1$ to $CNTR_8$ receive and count the periodic signals $P_1$ to $P_8$ every sampling period $T_{SMPL}$. When the sampling period $T_{SMPL}$ expires, the count value of the counters $CNTR_1$ to $CNTR_3$ of the counters $CNTR_1$ to $CNTR_8$ is 22 and the count value of the other counters $CNTR_4$ to $CNTR_8$ is 21.

The digital signal generating circuit 13 can convert the voltage $e_O$ into a digital signal $D_{OUT}$ with a resolution 8 times higher than the resolution for converting an analog signal into a digital signal in the sampling period $T_{SMPL}$ on the basis of the counting statuses of the counters $CNTR_1$ to $CNTR_N$ when the sampling period $T_{SMPL}$ expires. The digital signal generating circuit 13 can sum the values of the counters $CNTR_1$ to $CNTR_8$ and output a digital numerical value. In the above-mentioned example, since the count value of the counters $CNTR_1$ to $CNTR_3$ is 22 and the count value of the other counters $CNTR_4$ to $CNTR_8$ is 21, the output numerical value is 22·3+21·5=171. The full count value is 256 from 8 bits in total.

Figure 5:
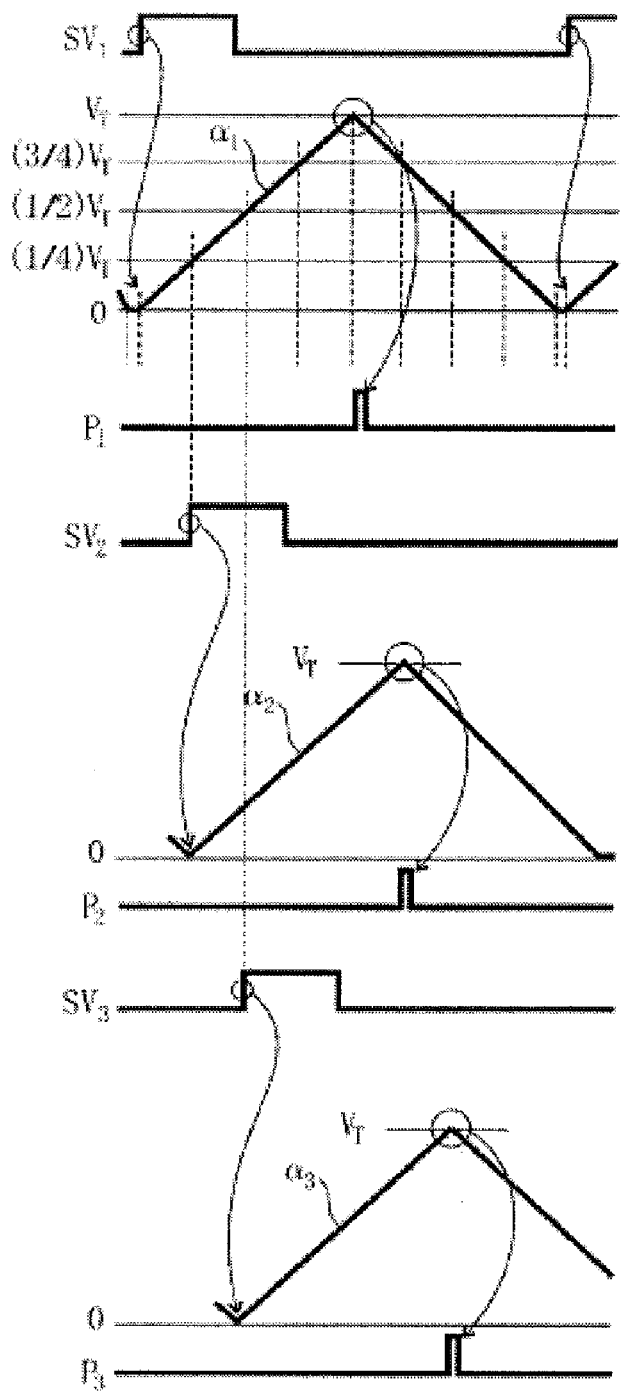
FIG. 5 is a diagram illustrating an operation of a power-controlled oscillator shown in FIG. 3.

In this example, the voltage-controlled oscillators $VCO_1$ to $VCO_8$ include a CR circuit and the periodic signals $P_1$ to $P_8$ generated from the voltage-controlled oscillators $VCO_1$ to $VCO_8$ have as one period a time period from a time point of starting charging a capacitor C with an input voltage and until ending charging the capacitor C and starting discharging the capacitor when the charged voltage reaches a threshold value, and returning the charged voltage to an initial voltage, as shown in FIG. 5.

Operations of the voltage-controlled oscillators $VCO_1$ to $VCO_8$ shown in FIG. 3 will be described now with reference to FIG. 5. The voltage-controlled oscillator $VCO_1$ starts its operation in response to the operation start timing signal $SV_1$ generated by the controller 14 and the voltage-controlled oscillator $VCO_1$ generates the periodic signal $P_1$ when the input voltage reaches a threshold value $V_T$.

On the other hand, the controller 14 detects the timings of charging voltages $V_T/4$, $2V_T/4$, $3V_T/4$, and $V_T$ when the capacitor C of the CR circuit of the voltage-controlled oscillator $VCO_1$ increases in voltage and charging voltages $3V_T/4$, $2V_T/4$, and $V_T/4$ when the capacitor decreases in voltage. The controller 14 generates the operation start timing signals $SV_2$, $SV_3$, $SV_4$, $SV_5$, $SV_6$, $SV_7$, and $SV_8$ (only $SV_2$ and $SV_3$ are shown in FIG. 5) when the charged voltage reaches $V_T/4$, $2V_T/4$, $3V_T/4$, $V_T$, $3V_T/4$, $2V_T/4$, and $V_T/4$. The voltage-controlled oscillators $VCO_2$ to $VCO_8$ are driven with the operation start timing signals and generate the periodic signals $P_2$ to $P_8$ (only $P_2$ and $P_3$ are shown in FIG. 5) when the input voltage reaches the threshold value $V_T$. The increase in voltage of the voltage-controlled oscillators $VCO_2$ to $VCO_8$ depends on the values of the input voltages at the time of operating. In FIG. 5, the slopes of the increase in voltage of the voltage-controlled oscillators $VCO_2$ to $VCO_3$ are represented by $\alpha_1$ to $\alpha_3$.

Figure 6:
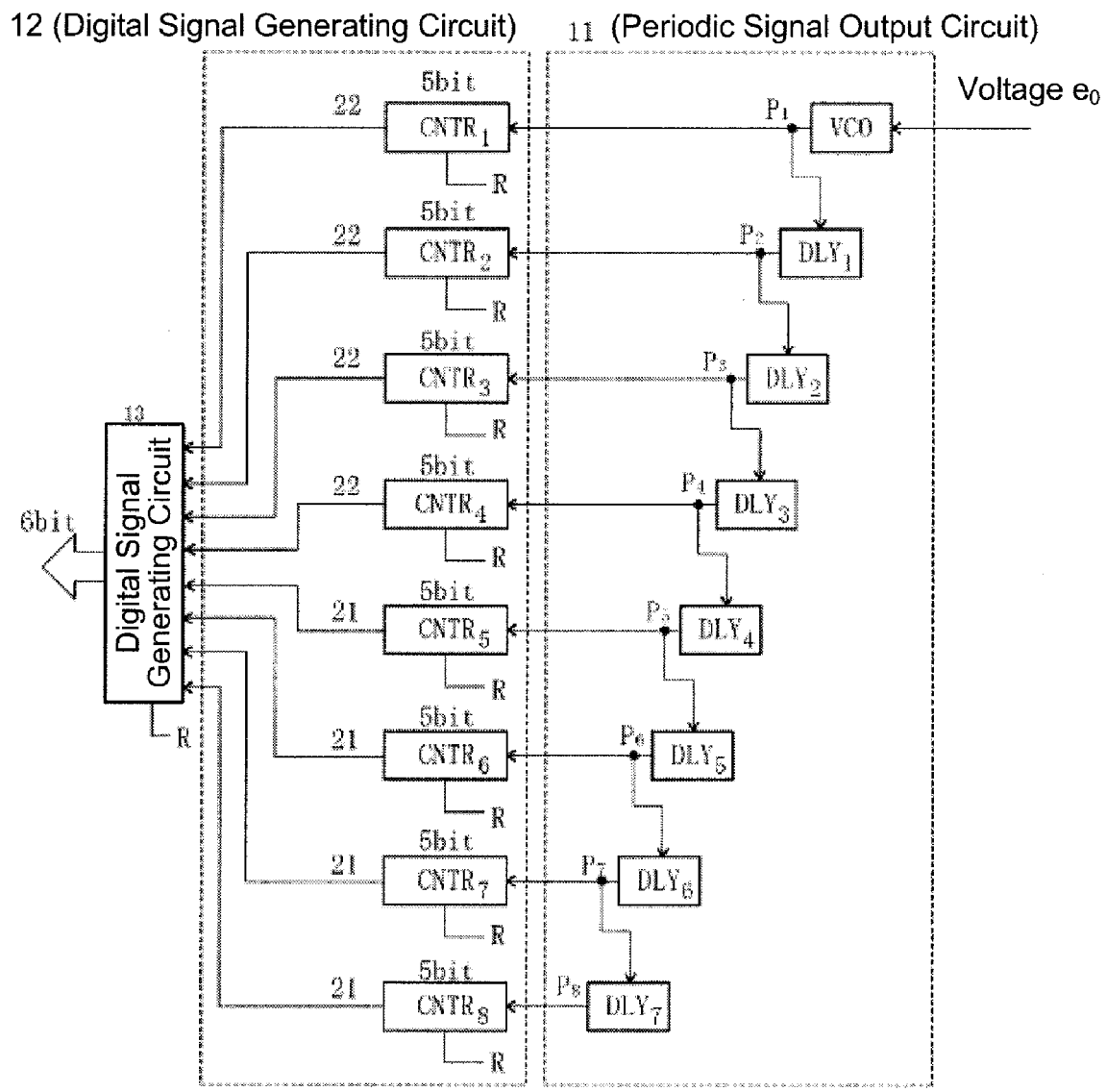
FIG. 6 is a diagram illustrating a fourth example of the analog-digital converter circuit according to the invention.

FIG. 6 is a diagram illustrating a fourth example of the analog-digital converter circuit according to the invention. The periodic signal output circuit 11 shown in FIG. 6 includes one voltage-controlled oscillator VCO and plural delay circuits $DLY_1$ to $DLY_7$. The output of the voltage-controlled oscillator VCO is input as $P_1$ to the counter $CNTR_1$ and is also input to the delay circuit $DLY_1$. The delay circuit $DLY_1$ outputs a signal $P_2$ delayed by T/N from the output $P_1$ of the VCO. The delay circuit $DLY_2$ outputs the signal $P_3$ delayed by T/N from the output $P_2$ of the delay circuit $DLY_1$. Similarly, the delay circuits $DLY_k$ (where k=3, 4, ..., and 7) output the signals $P_{k+1}$ delayed by T/N from the outputs $P_k$ of the delay circuits $DLY_{k-1}$, respectively.

Figure 7:
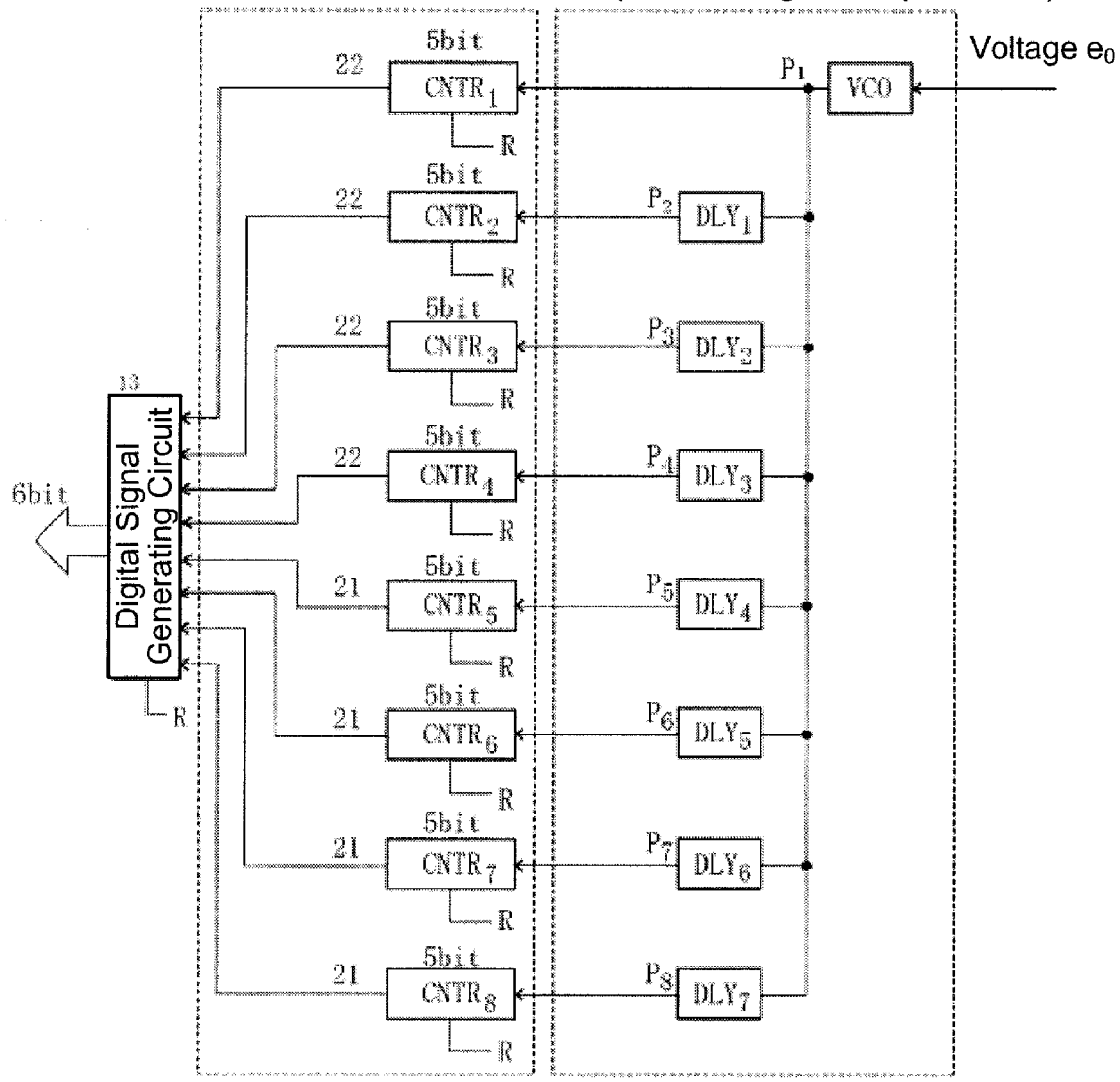
FIG. 7 is a diagram illustrating a fifth example of the analog-digital converter circuit according to the invention.
Figure 8:
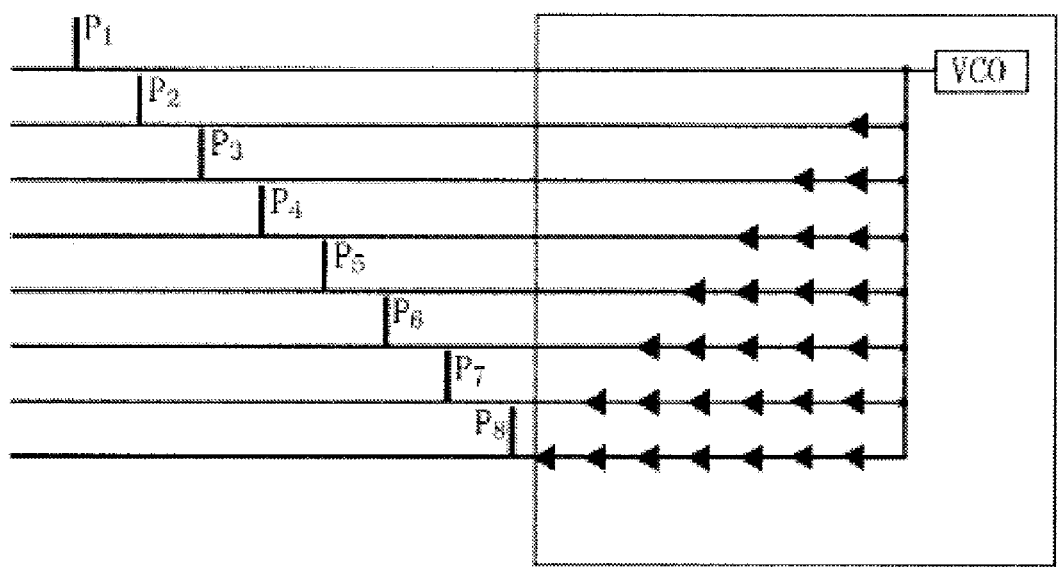
FIG. 8 is a diagram illustrating a periodic signal output circuit in which a delay circuit is constructed by a delay element with a delay time of T/N.

FIG. 7 is a diagram illustrating a fifth example of the analog-digital converter circuit according to the invention. The periodic signal output circuit 11 shown in FIG. 7 includes a voltage-controlled oscillator VCO and plural delay circuits $DLY_1$ to $DLY_7$. The output of the voltage-controlled oscillator VCO is $P_1$ and is input to the counter $CNTR_1$ and the delay circuits $DLY_1$ to $DLY_7$. The delay circuit $DLY_1$ outputs the signal $P_2$ delayed by T/N from the input signal (the output of the voltage-controlled oscillator VCO) and the delay circuit $DLY_2$ outputs the signal $P_3$ delayed by 2T/N from the input signal (the output of the voltage-controlled oscillator VCO). Similarly, the delay circuit $DLY_k$ (where k=3, 4, ..., and 7) outputs the signal $P_{k+1}$ delayed by kT/N from the input signal (the output of the voltage-controlled oscillator VCO). FIG. 8 is a diagram illustrating the periodic signal output circuit 11 in which the delay circuits $DLY_1$ to $DLY_7$ include a delay element of a delay time T/N. As shown in FIG. 8, the delay circuit $DLY_1$ includes a delay element and generates the signal $P_1$ delayed by T/N. The delay circuit $DLY_2$ includes two delay elements and generates the signal $P_2$ delayed by 2T/N. The delay circuit $DLY_k$ includes two delay elements and generates the signal $P_k$ delayed by kT/N.

Figure 9:
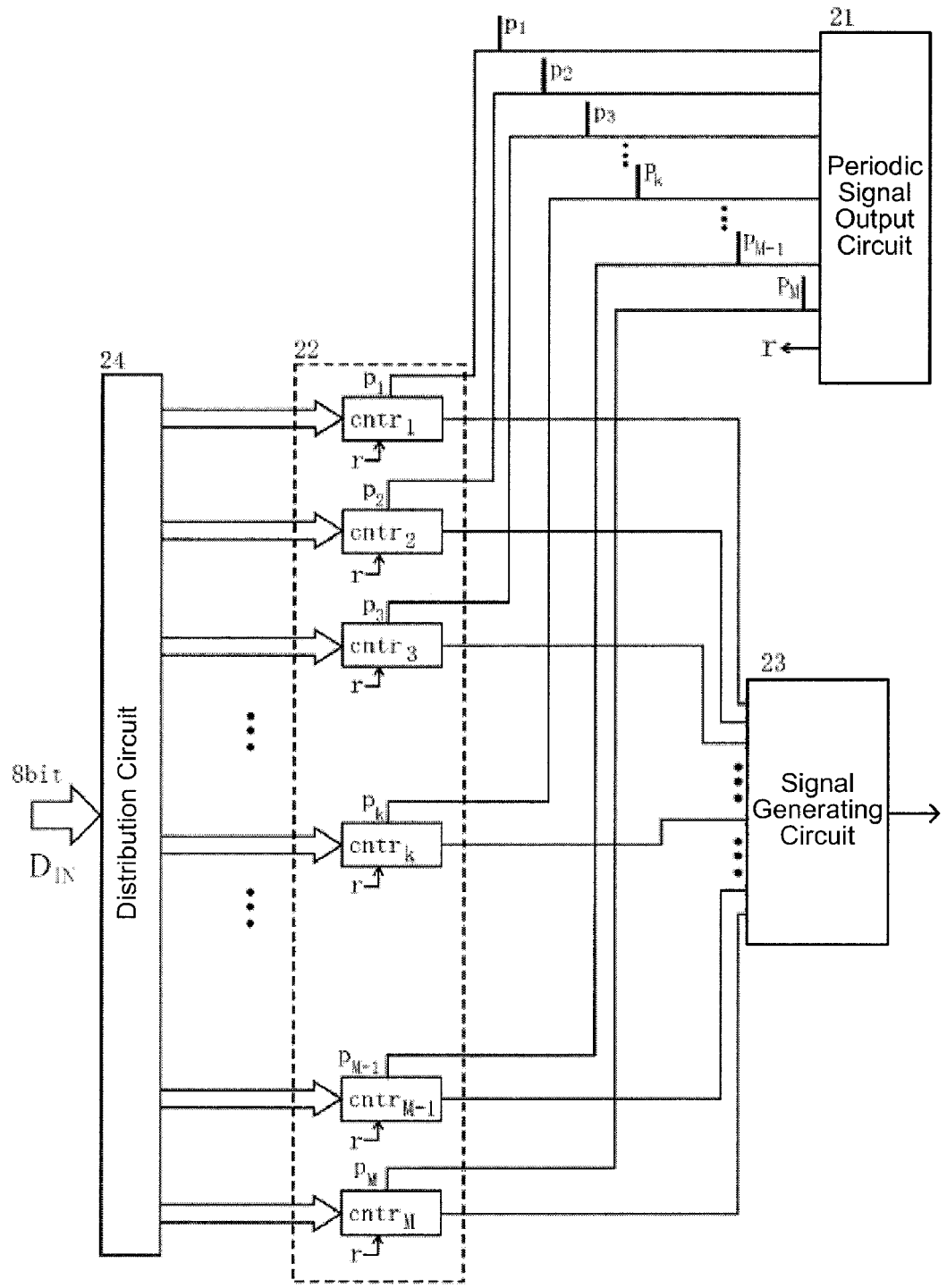
FIG. 9 is a diagram illustrating a first example of a timing signal generating circuit according to the invention.

FIG. 9 is a diagram illustrating a first example of the timing signal generating circuit according to the invention. In FIG. 9, the timing signal generating circuit 2 includes a periodic signal output circuit 21, a comparison counter 22, a signal generating circuit 23, and a distribution circuit 24.

The capital reference sign "P" is used to represent the periodic signals in the analog-digital converter circuit, but a lowercase reference sign "p" is used to represent the periodic signals in the timing signal generating circuit. In the analog-digital converter circuit, the capital reference sign "CNTR" is used to represent the counter, the capital reference sign "VF" is used to represent the voltage-frequency converter circuit, and the capital reference sign "VCO" is used to represent the voltage-controlled oscillator. However, in the timing signal generating circuit, a lowercase reference sign "cntr" is used to represent the counter, a lowercase reference sign "vf" is used to represent the voltage-frequency converter circuit, and a lowercase reference sign "vco" is used to represent the voltage-controlled oscillator.

The periodic signal output circuit 21 outputs M serial periodic signals $p_1$ to $p_M$ of a frequency $f_S$ and the operation periodic signal r of the comparison counter 22 of the timing signal generating circuit 2.

The comparison counter 22 includes M counters $cntr_1$ to $cntr_M$ and the counters $cntr_1$ to $cntr_M$ receive the M serial periodic signals $p_1$ to $p_M$ and outputs a full count signal when the count value reaches a set value.

The signal generating circuit 23 receives count signals $fc_1$ to $fc_M$ from the M counters $cntr_1$ to $cntr_M$ and generates a timing signal $T_{OUT}$ at a time interval corresponding to the magnitude of a digital signal $D_{IN}$ from the full count signals $fc_1$ to $fc_M$ every reference period $T_{REF}$.

Figure 10:
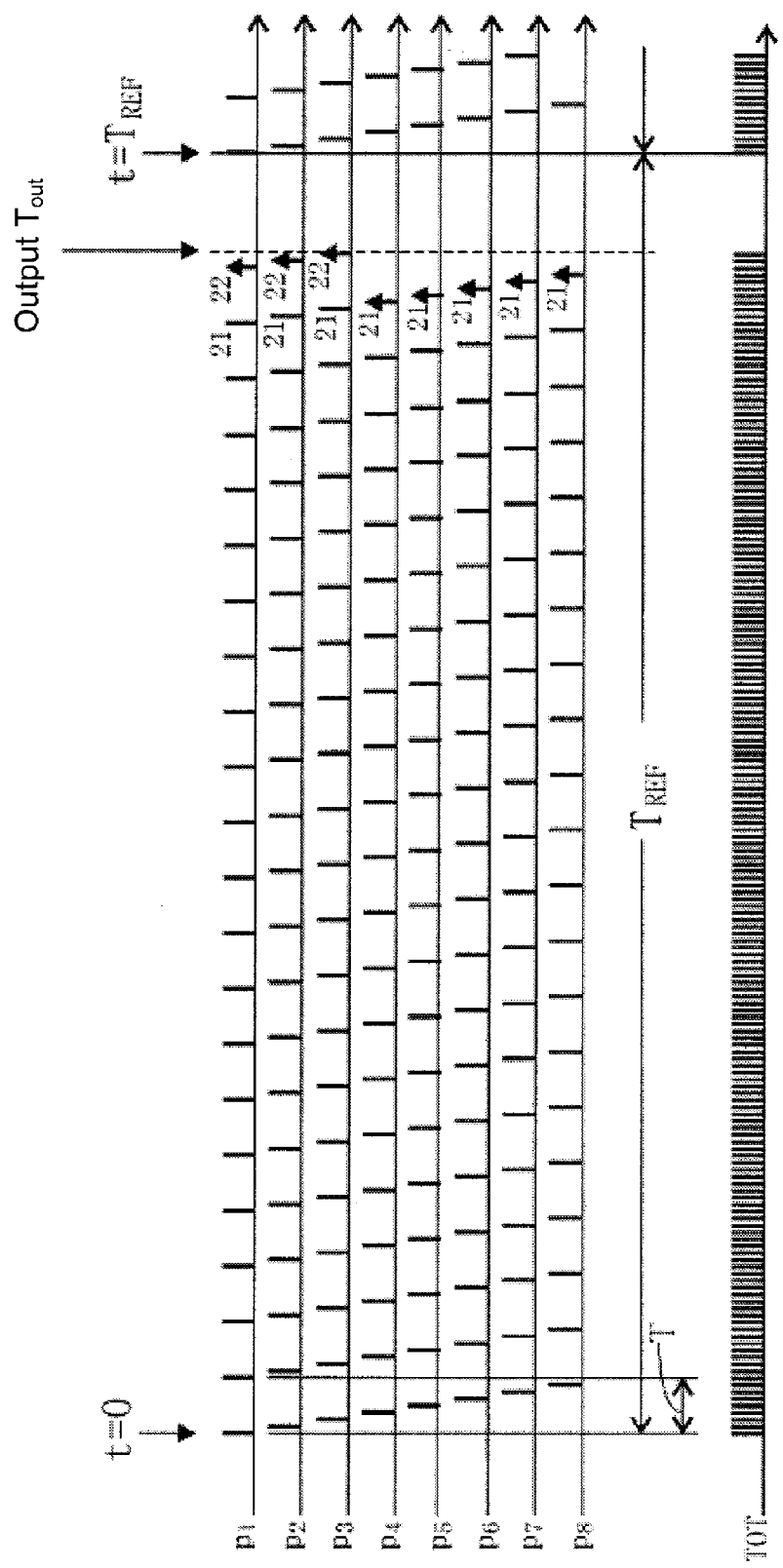
FIG. 10 is a waveform diagram illustrating an operation of the timing signal generating circuit according to the invention.

The distribution circuit 24 can set count values Y and Y−1 in the M counters. It is assumed that the distribution circuit 24 sets the count value Y in the first to k-th counters $cntr_1$ to $cntr_k$ of the M comparison counters 22 and sets the count value Y−1 in the other counters. As shown in FIG. 10, the M series periodic signals $p_1$ to $p_M$ are sequentially input at a delay time interval of [approximate value of one period T of periodic signals $p_1$ to $p_M$]÷M. The signal generating circuit 23 generates the timing signal $T_{OUT}$ from the M counters 22 (counters $cntr_1$ to $cntr_M$) with a resolution N times higher than that for generating by the use of one counter. That is, the signal generating circuit 23 generates the timing signal $T_{OUT}$ when the full count signals (indicated by the upward arrow in FIG. 10) from all the M counters $cntr_1$ to $cntr_M$ but the resolution equal to the resolution of the pulse trains with the resolution of N times T, as indicated by TOT in FIG. 10.

Figure 11:
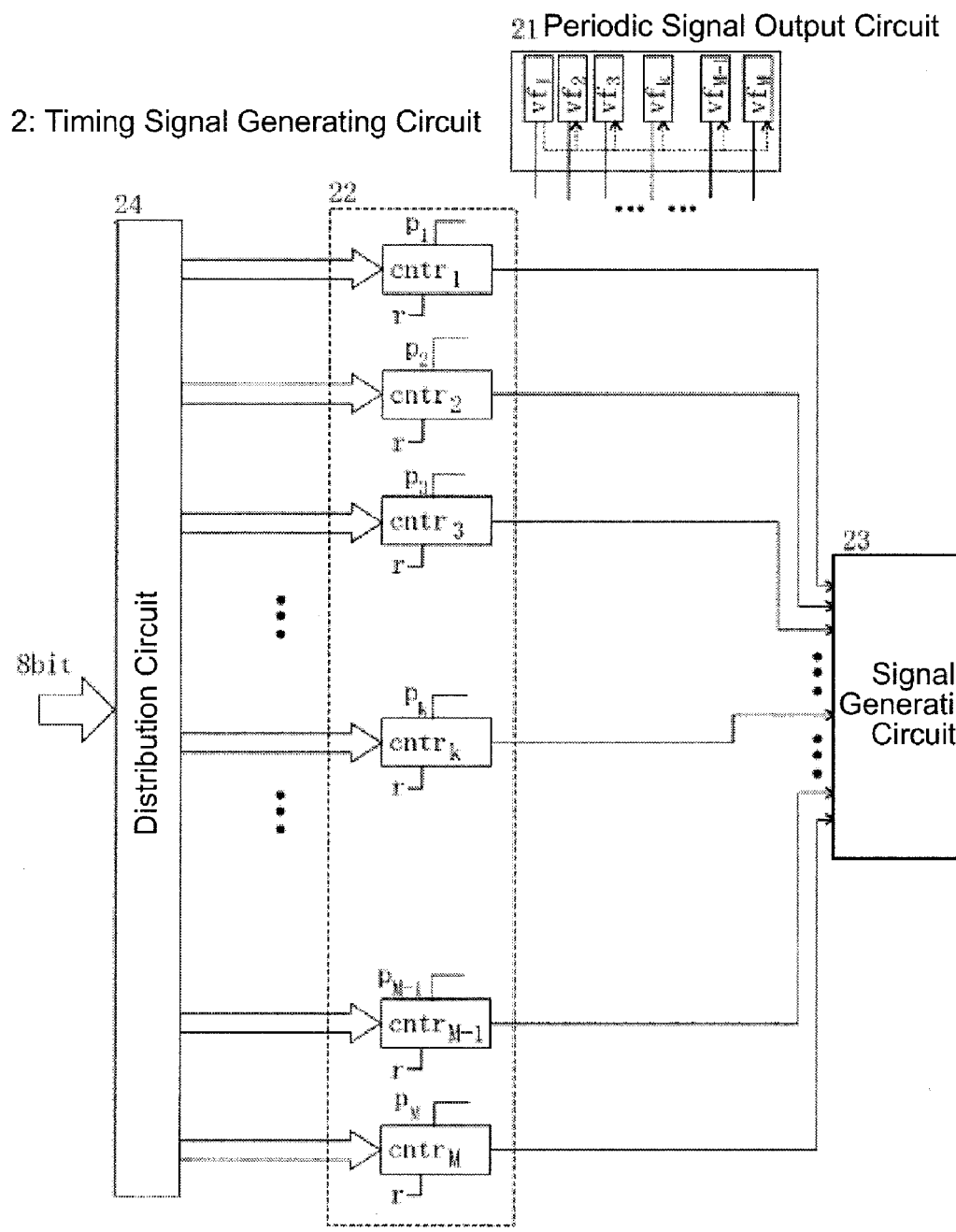
FIG. 11 is a diagram illustrating a second example of the timing signal generating circuit according to the invention.

Like the second example of the timing signal generating circuit shown in FIG. 11, the periodic signal generating circuit 21 includes N voltage-frequency converter circuits $vf_1$ to $vf_N$. In FIG. 11, the voltage-frequency converter $vf_1$ generates the operation start timing signal of $p_1, p_2, \ldots$, and $p_N$ (see the dotted line in FIG. 11), but the operation start timing signal may be generated by the controller, like a third example to be described later.

Figure 12:
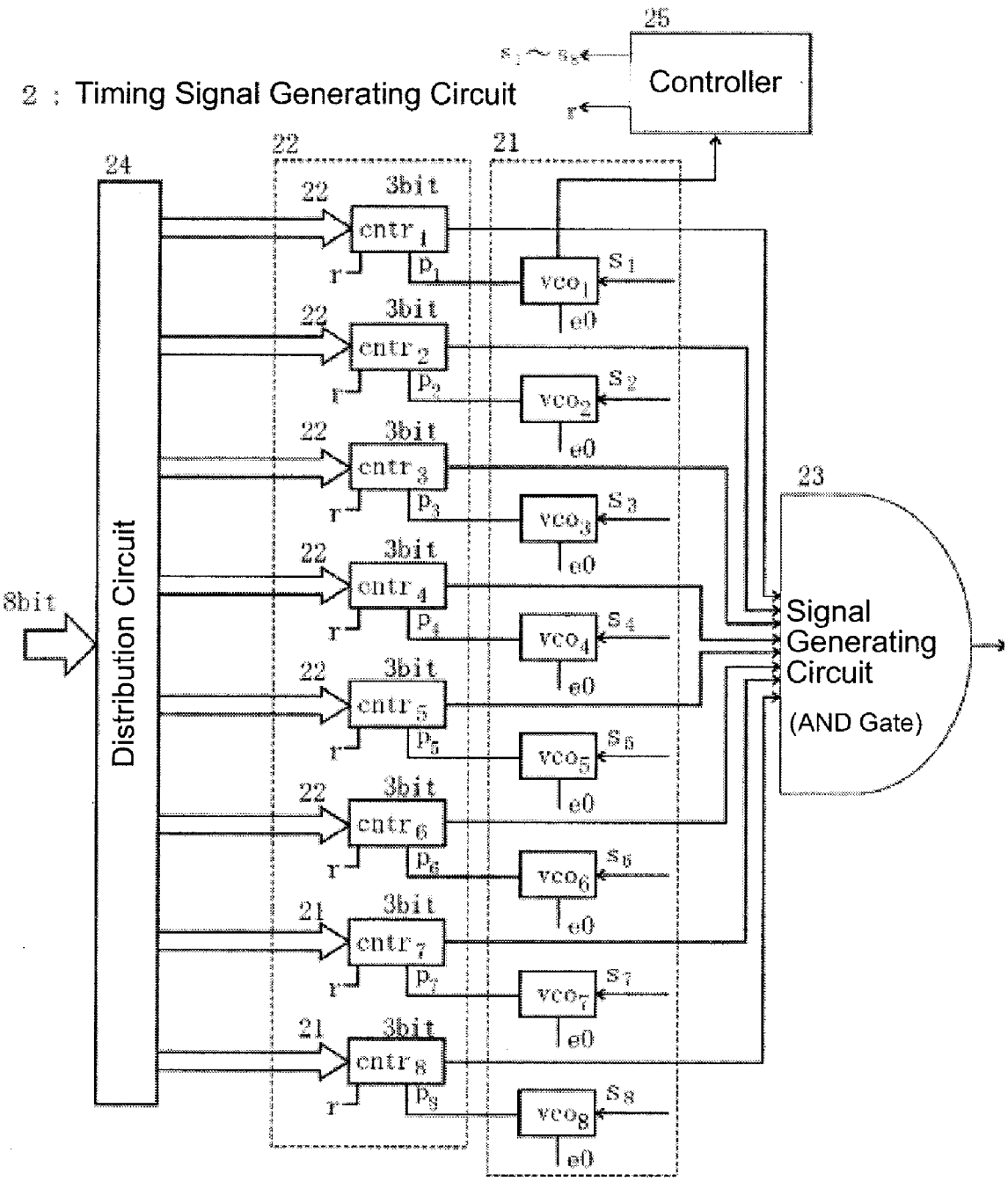
FIG. 12 is a diagram illustrating a third example of the timing signal generating circuit according to the invention.

FIG. 12 is a diagram illustrating a third example of the timing signal generating circuit according to the invention. In FIG. 12, the timing signal generating circuit 2 includes a periodic signal output circuit 21, a comparison counter 22, a signal generating circuit 23, a distribution circuit 24, and a controller 25.

In FIG. 12, the counter 22 includes counters $cntr_1$ to $cntr_8$. In this example, since the resolution of the counters $cntr_1$ to $cntr_8$ is 5 bits and the counter 22 includes 8 ($=2^3$) counters $cntr_1$ to $cntr_8$, the analog-digital converter circuit 1 has a resolution of 8 bits as a whole.

The periodic signal output circuit 21 receives a reference voltage $e_{ref}$ as the temporally-varying analog signal, replaces the voltage $e_{ref}$ with 8 series periodic signals $p_1$ to $p_8$ of a frequency $f_s$ corresponding to the magnitude of the voltage, and outputs the periodic signals. Specifically, the periodic signal output circuit 21 includes voltage-controlled oscillators $vco_1$ to $vco_8$. The controller 25 generates the operation start timing signals $s_1$ to $s_8$ of the voltage-controlled oscillators $vco_1$ to $vco_8$ and the operation period signal r of the timing signal generating circuit 2.

Figure 13:
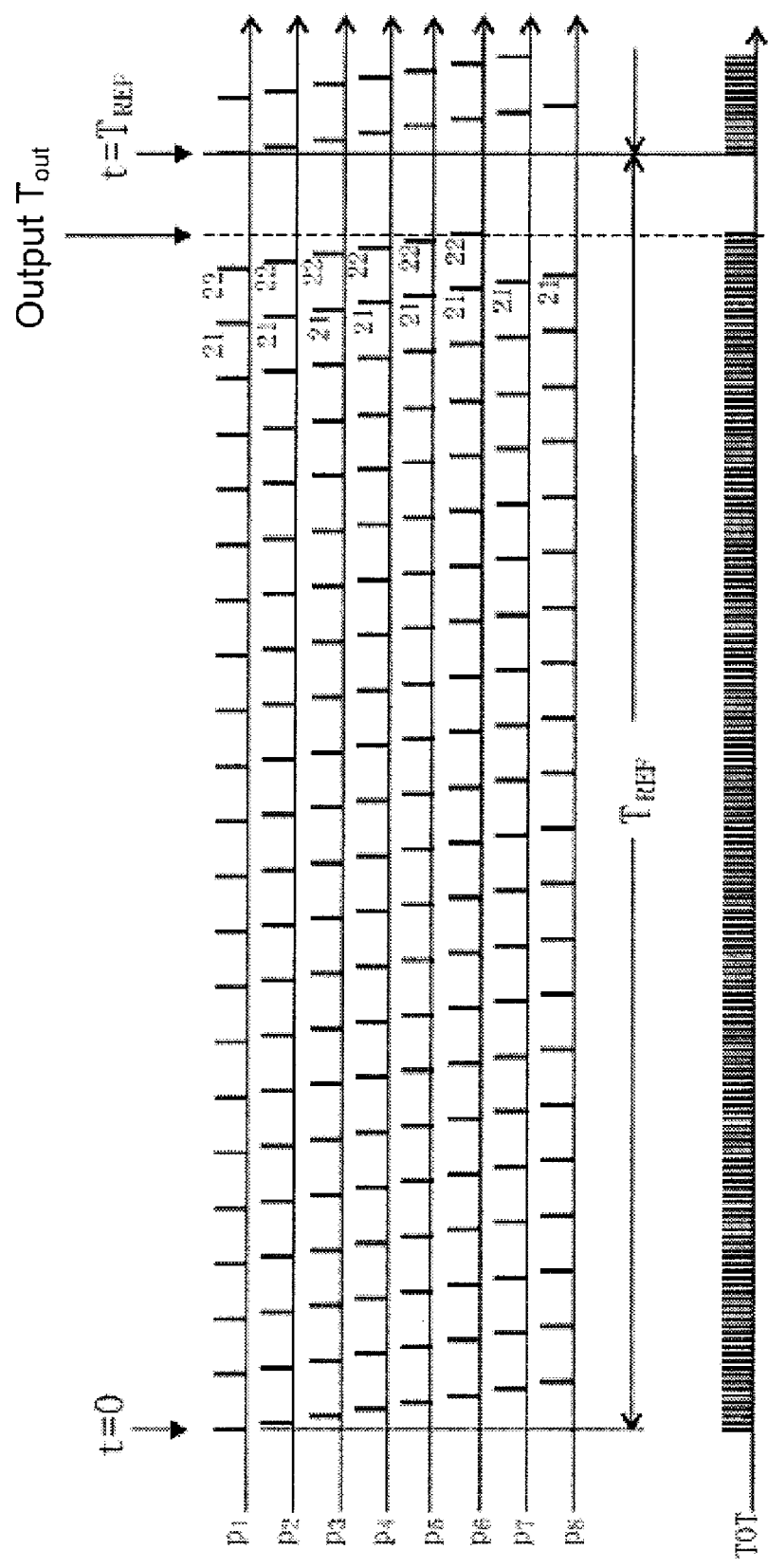
FIG. 13 is a timing diagram illustrating output signals of a periodic signal output circuit shown in FIG. 12.

As shown in FIG. 13, the periodic signal output circuit 21 sequentially generates the 8 series periodic signals $p_1$ to $p_8$ at a delay time interval of [approximate value of one period T of periodic signals $p_1$ to $p_8$]÷8.

The 8 counters 22 (counters $cntr_1$ to $cntr_8$) receive and count the periodic signals $p_1$ to $p_8$ every reference period $T_{REF}$. In the counters $cntr_1$ to $cntr_8$, when the reference period $T_{REF}$ expires, the count value of the counters $cntr_1$ to $cntr_6$ is 22 and the count value of the other counters $cntr_7$ and $cntr_8$ is 21.

When the count value reaches a set value, the counters $cntr_1$ to $cntr_8$ output full count signals. The signal generating circuit 23 outputs a timing signal when receiving the full count signals from all the counters $cntr_1$ to $cntr_8$. In the above-mentioned example, since the set value in the counters $cntr_1$ to $cntr_6$ is 22 and the set value in the other counters $cntr_7$ and $cntr_8$ is 21, the signal generating circuit 23 can output a timing signal (for example, duty) corresponding to the numerical value of 22·6+21·2=174.

Figure 14:
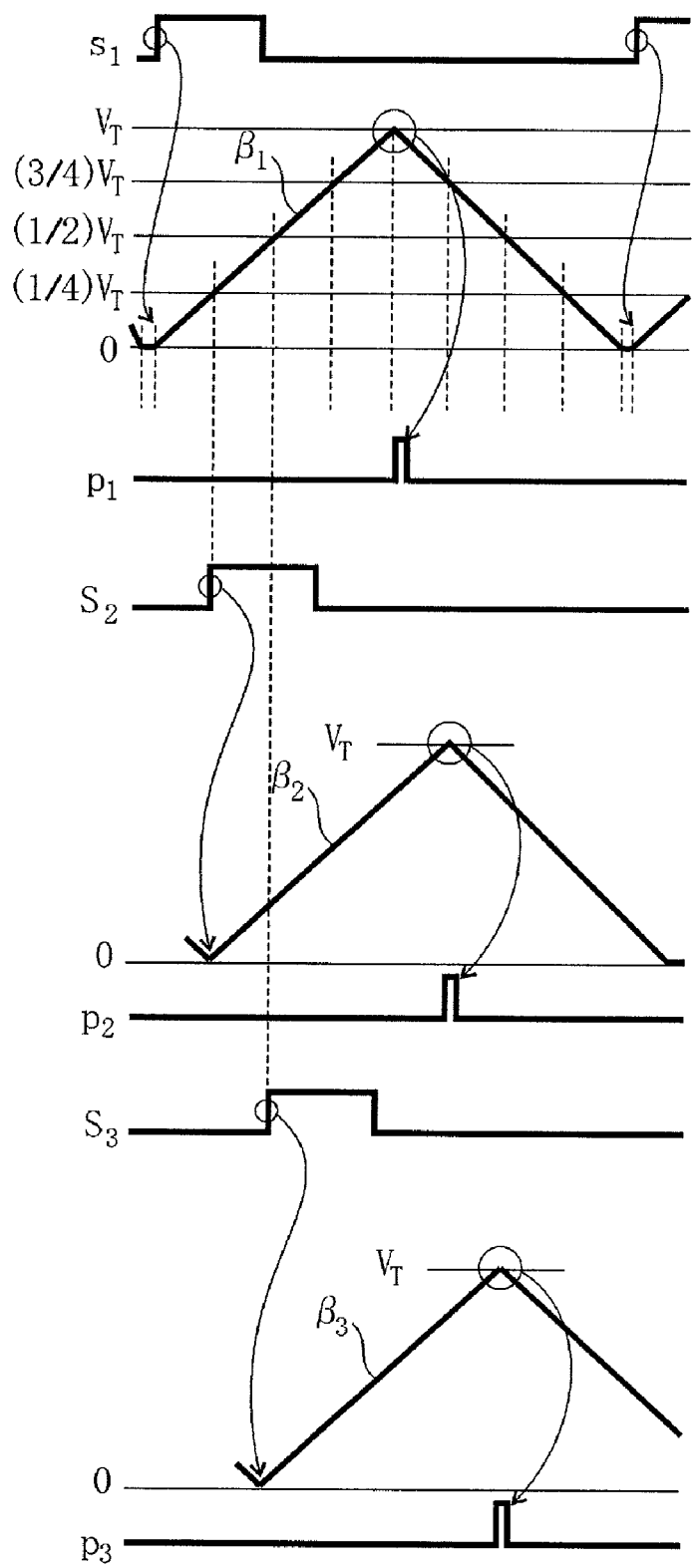
FIG. 14 is a diagram illustrating an operation of a voltage-controlled oscillator shown in FIG. 12.

In this example, the voltage-controlled oscillators $vco_1$ to $vco_8$ include a CR circuit and the periodic signals $p_1$ to $p_8$ generated from the voltage-controlled oscillators $vco_1$ to $vco_8$ have as one period a time period from a time point of starting charging a capacitor C with an input voltage until ending charging the capacitor C and starting discharging the capacitor when the charged voltage reaches a threshold value, and returning the charged voltage to an initial voltage, as shown in FIG. 14.

Operations of the voltage-controlled oscillators $vco_1$ to $vco_8$ shown in FIG. 12 will be described with reference to FIG. 14. The voltage-controlled oscillator $vco_1$ starts its operation in response to the operation start timing signal $s_1$ and the voltage-controlled oscillator $vco_1$ generates the periodic signal $p_1$ when the input voltage reaches a threshold voltage $V_T$.

On the other hand, the controller 25 detects the timings of charging voltages $V_T/4$, $2V_T/4$, $3V_T/4$, and $V_T$ when the capacitor C of the CR circuit of the voltage-controlled oscillator $vco_1$ increases in voltage and charging voltages $3V_T/4$, $2V_T/4$, and $V_T/4$ when the capacitor decreases in voltage. The controller 25 generates the operation start timing signals $s_2$, $s_3$, $s_4$, $s_5$, $s_6$, $s_7$, and $s_8$ (only $s_2$ and $s_3$ are shown in FIG. 14) when the charged voltage reaches $V_T/4$, $2V_T/4$, $3V_T/4$, $V_T$, $3V_T/4$, $2V_T/4$, and $V_T/4$. The voltage-controlled oscillators $vco_2$ to $vco_8$ are driven with the operation start timing signals and generate the periodic signals $p_2$ to $p_8$ (only $p_2$ and $p_3$ are shown in FIG. 14) when the input voltage reaches the threshold value $V_T$. The increase in voltage of the voltage-controlled oscillators $vco_2$ to $vco_8$ depends on the values of the input voltages at the time of operating. In FIG. 14, the slopes of the increase in voltage of the voltage-controlled oscillators $vco_2$ to $vco_3$ are represented by $\beta_1$ to $\beta_3$.

Figure 15:
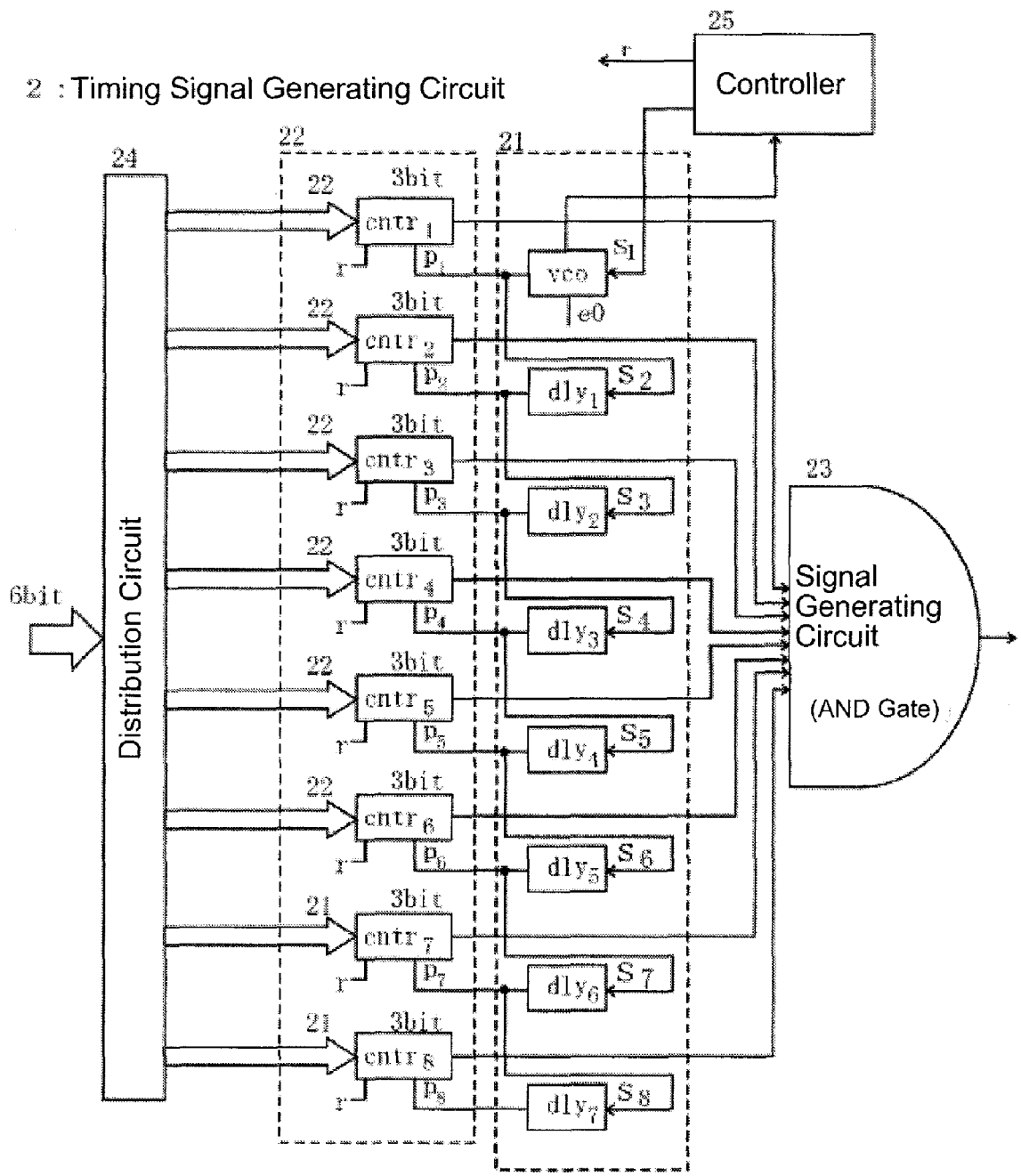
FIG. 15 is a diagram illustrating a fourth example of the timing signal generating circuit according to the invention.

FIG. 15 is a diagram illustrating a fourth example of the timing signal generating circuit 21 according to the invention. The periodic signal output circuit 21 shown in FIG. 15 includes a voltage-controlled oscillator vco and plural delay circuits $dly_1$ to $dly_7$. The output of the voltage-controlled oscillator VCO is sequentially delayed by the delay circuits $dly_1$ to $dly_7$ to generate the periodic signals $p_2$ to $p_8$.

Figure 16:
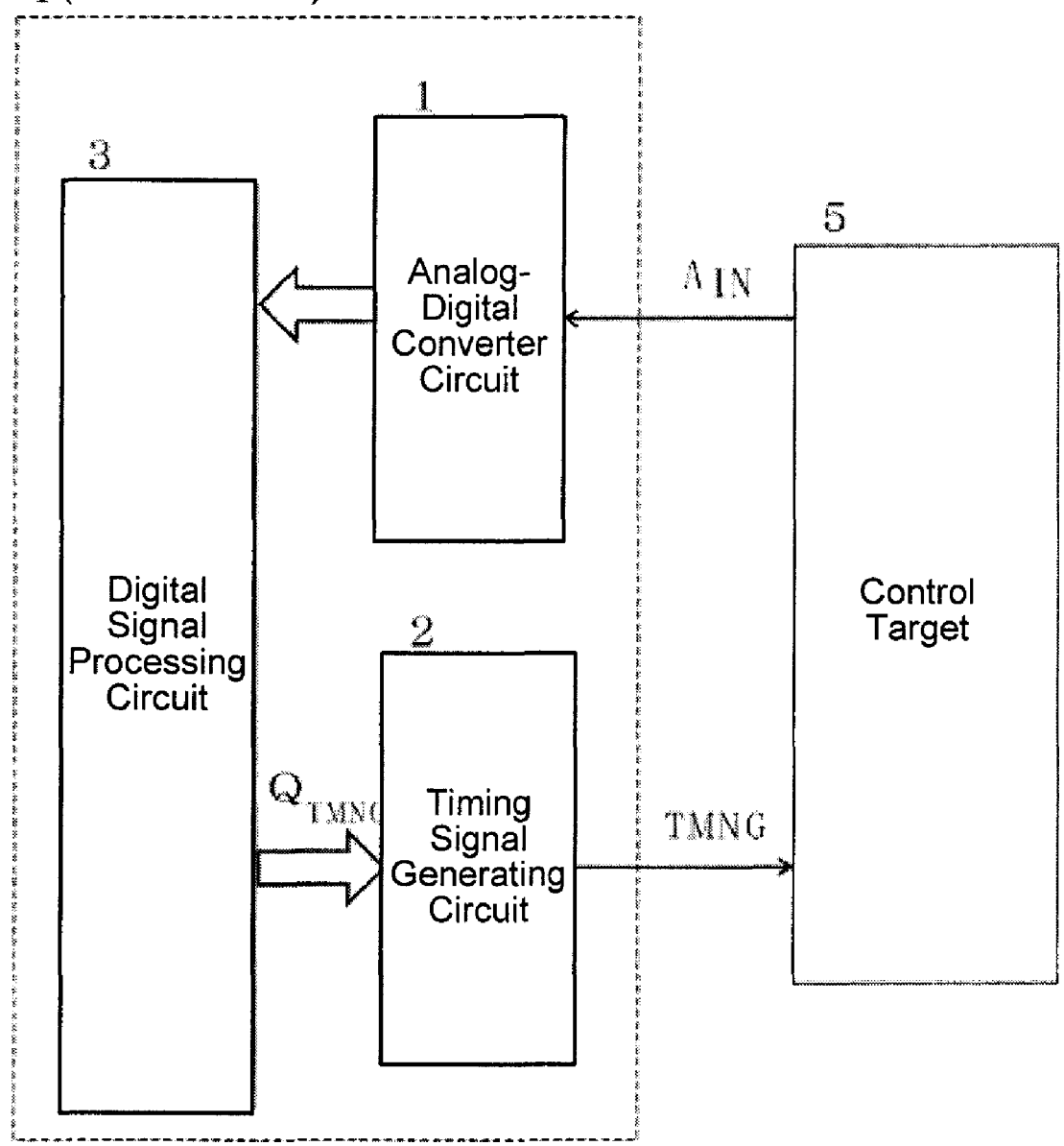
FIG. 16 is a diagram illustrating a first example of a control device according to the invention.

FIG. 16 is a diagram illustrating a first example of the control device according to the invention. In FIG. 16, the control device 4 includes the above-mentioned analog-digital converter circuit 1, the above-mentioned timing signal generating circuit 2, and a digital signal processing circuit 3.

The analog-digital converter circuit 1 receives the analog signal $A_{IN}$ from a control target 5 and digitalizes the received analog signal. The digital signal processing circuit 3 performs a digital filter operation, one operation of P control, I control, and D control, or a combination thereof on the digitalized signal to generate a digital timing value $Q_{TMNG}$.

The timing signal generating circuit 2 generates a controlling timing signal TMNG on the basis of the digital timing value $Q_{TMNG}$.

Figure 17:
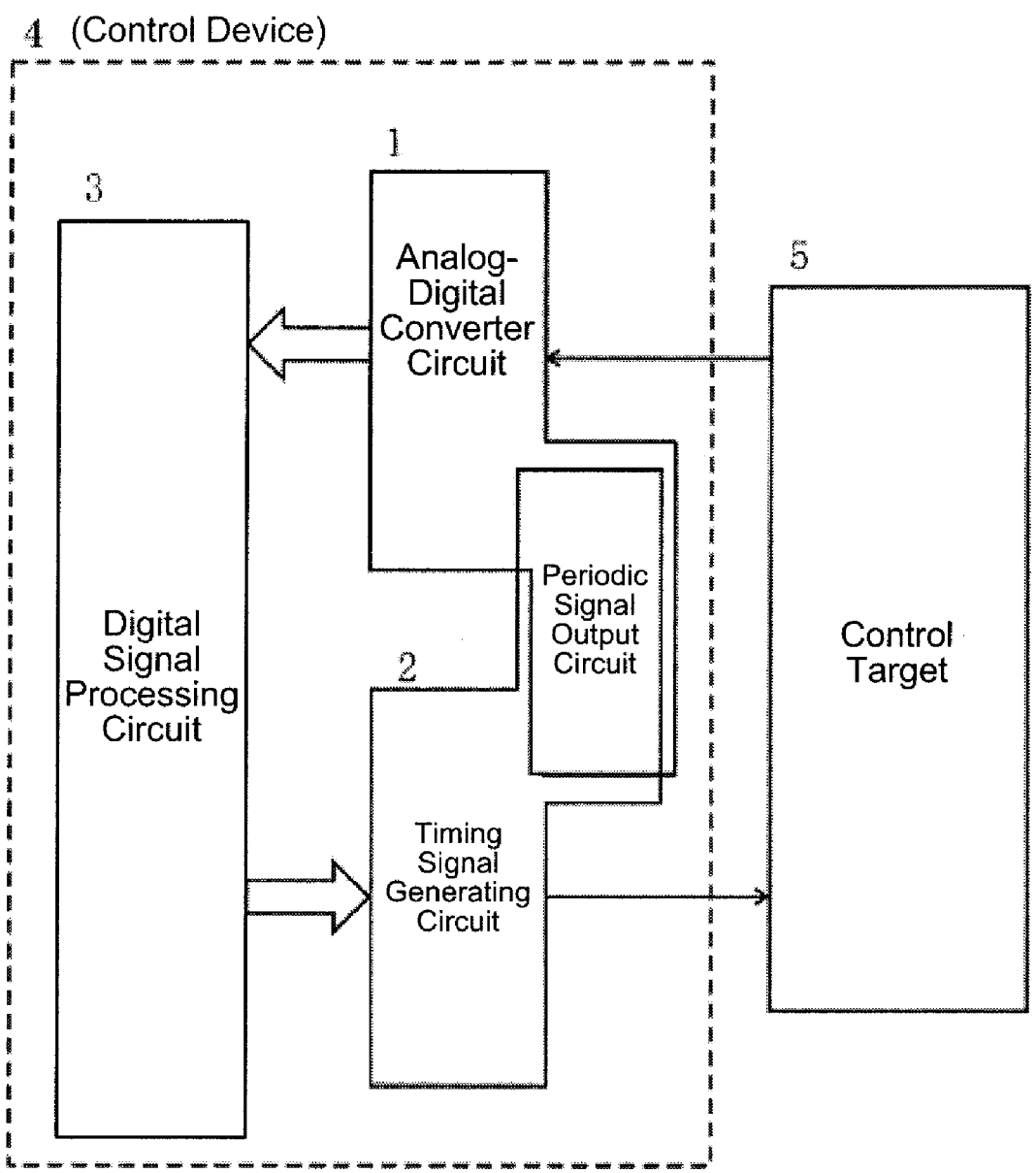
FIG. 17 is a diagram illustrating a second example of the control device according to the invention.

FIG. 17 is a diagram illustrating a second example of the control device according to the invention. In FIG. 17, the periodic signal output circuit 11 of the analog-digital converter circuit 1 and the periodic signal output circuit 21 of the timing signal generating circuit 2 are used in common.

Figure 18:
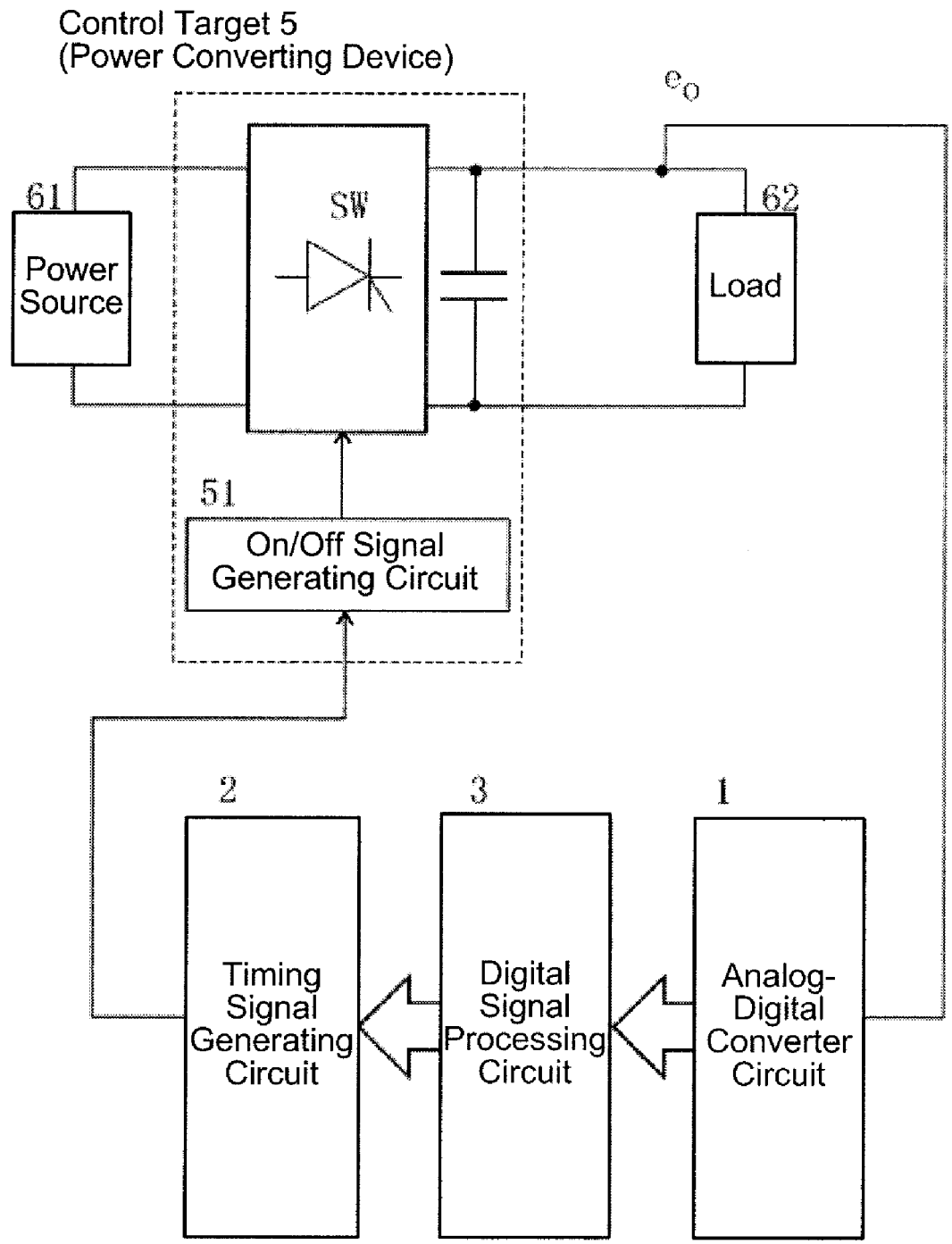
FIG. 18 is a diagram illustrating a third example of the control device according to the invention.

FIG. 18 is a diagram illustrating a third example of the control device according to the invention. In FIG. 18, the control target 5 is a power converter circuit including a switching element SW, the input side thereof is connected to a power source 61, and the output side thereof is connected to a load 62. The analog-digital converter circuit 1 includes an ON/OFF signal generating circuit 51 and receives the output voltage of the power converter circuit as an input. The timing signal generating circuit 2 can output an ON/OFF timing signal TMNG to the switching element SW of the power converter circuit 5.

The timing signal generating circuit according to the invention may be replaced with the following configurations (1) to (12).

(1) A timing signal generating circuit generating a predetermined timing of a processing signal, comprising a phase shift circuit, a phase shift controller, and a counter circuit, wherein (A) the phase shift circuit receiving a repeat signal outputs a signal of which a phase is shifted by a predetermined quantity (including a zero shift quantity) on the basis of the repeat signal, (B) the phase shift controller controls what phase of signal the phase shift circuit output (where the first signal has a zero shift quantity and the M-th signal has the maximum shift quantity) among first to M-th signals, and (C) the counter circuit counts the number of output signals of the phase shift circuit and generates a count end signal when the count value reaches a set value, whereby the counter circuit outputs a synthesized timing signal of the timing of the repeat signal and the timing shifted by the phase shift circuit.

(2) A timing signal generating circuit generating a predetermined timing of a processing signal, comprising a counter circuit, a phase shift circuit, and a phase shift controller, wherein (A) the counter circuit receiving a repeat signal counts the number of repeat signals and generates a count end signal when the count value reaches a set value, (B) the phase shift circuit outputs a signal of which a phase is shifted by a predetermined quantity (including a zero shift quantity) from the output signal of the counter circuit, and (C) the phase shift controller controls what phase of signal (where the first signal has a zero shift quantity and the M-th signal has the maximum shift quantity) the phase shift circuit should output among first to M-th signals, whereby the phase shift circuit outputs a synthesized timing signal of the timing of the repeat signal and the timing shifted by the phase shift circuit.

(3) A timing signal generating circuit generating a predetermined timing of a processing signal, comprising a repeat signal generating circuit, a phase shift circuit generating plural signals of which a phase is shifted by a predetermined quantity (including a zero shift quantity), a selection circuit selecting one of plural signals from the phase shift circuits to correspond to a low cipher of a timing value, and a counter circuit having a set value corresponding to a high cipher of the timing value, wherein (A) the phase shift circuit receives the output signal of the repeat signal generating circuit and outputs plural signals of which a phase is shifted by a predetermined quantity on the basis of the received signal, and (B) the selection circuit selects and outputs one of plural signals from the phase shift circuit to correspond to a low-cipher value of the timing value and the counter circuit outputs a count end signal as a timing signal corresponding to a value obtained by combining the low-cipher value and the high-cipher value when the count value reaches a set value.

(4) A timing signal generating circuit generating a predetermined timing of a processing signal, comprising a repeat signal generating circuit, a phase shift circuit generating plural signals of which a phase is shifted by a predetermined quantity (including a zero shift quantity), a counter circuit including plural counter circuit elements having a set value corresponding to a high cipher of the timing value, and a selection circuit selecting one of the signals from the plural counter circuit elements of the counter circuit to correspond to a low cipher of the timing value, wherein (A) the phase shift circuit receives the output signal of the repeat signal generating circuit and outputs plural signals of which a phase is shifted by a predetermined quantity on the basis of the received signal, and (B) the respective counter circuit elements of the counter circuit receive and count the plural output signals of the phase shift circuit and outputs count end signals when the count value reaches the set value, and the selection circuit selects one of the output signals of the plural counter circuit elements of the counter circuit on the basis of the low-cipher value and outputs the selected signal as a timing signal corresponding to a value obtained by combining the low-cipher value and the high-cipher value.

(5) A timing signal generating circuit generating a predetermined timing of a processing signal, comprising a repeat signal generating circuit, a counter circuit having a set value corresponding to a high cipher of a timing value, a phase shift circuit generating plural signals of which a phase is shifted by a predetermined quantity (including a zero shift quantity), a selection circuit selecting one of the plural signals from the phase shift circuit to correspond to a low-cipher value of the timing value, and a selection circuit controller, wherein (A) the counter circuit receives and counts the output signal of the repeat signal generating circuit and outputs a count end signal when the count value reaches the set value, and (B) the phase shift circuit receives the count end signal of the counter circuit and outputs plural signals of which the phases are shifted by a predetermined quantity (including a zero shift quantity) on the basis of the received signal, and the selection circuit selects one of the plural output signals of the phase shift circuit to correspond to a low-cipher value and outputs the selected signal as a timing signal corresponding to a value obtained by combining the low-cipher value and the high-cipher value.

(6) The timing signal generating circuit according to any one of (1) to (5), wherein the phase shift circuit includes a serial connection or a parallel connection of delay elements or delay circuits or a serial-parallel connection as a combination thereof.

(7) The timing signal generating circuit according to any one of (3) to (5), wherein signals of which phases are sequentially shifted are output from terminals of the delay elements or the delay circuits.

(8) The timing signal generating circuit according to any one of (3) to (5), further comprising a phase shift controller stopping the delay elements or the delay circuits not used among the operations of the delay elements or the delay circuits of the phase shift circuit.

(9) A timing signal generating circuit generating a predetermined timing of a processing signal, comprising a repeat signal generating circuit outputting plural signals of which phases are shifted by a predetermined quantity (including a zero shift quantity), a counter circuit including plural counter circuit elements having a set value corresponding to a high cipher of a timing value, and a selection circuit selecting one of the plural signals from the counter circuit to correspond to a low cipher of the timing value, wherein (A) the plural counter circuit elements of the counter circuit receive and count the plural output signals of the repeat signal generating circuit and outputs a count end signal when the count value reaches the set value, and (B) the selection circuit selects one of the output signals of the plural counter circuit elements on the basis of the low-cipher value and outputs the selected signal as a timing signal corresponding to a value obtained by combining the low-cipher value and the high-cipher value.

(10) A timing signal generating circuit generating a predetermined timing of a processing signal, comprising a repeat signal generating circuit outputting plural signals of which phases are shifted by a predetermined quantity (including a zero shift quantity), a selection circuit selecting one of the plural signals from the repeat signal generating circuit to correspond to a low-cipher value of a timing value, a counter circuit including plural counter circuit elements having a set value corresponding to a high cipher of the timing value, wherein (A) the selection circuit selects and outputs one of the plural output signals of the repeat signal generating circuit on the basis of the value corresponding to the low cipher, and (B) the counter circuit receives and counts the output signal of the selection circuit and outputs a count end signal as a timing signal corresponding to a value obtained by combining the low-cipher value and the high-cipher value when the count value reaches the set value.

(11) The timing signal generating circuit according to (9) or (10), wherein the repeat signal generating circuit includes a repeat signal generating source and a phase shift circuit, and wherein the phase shift circuit receives the output of the repeat signal generating source and outputs plural signals of which phases are shifted by a predetermined quantity (including a zero shift quantity) on the basis of the repeat signal.

(12) The timing signal generating circuit according to (11), wherein the phase shift circuit includes a serial connection or a parallel connection of delay elements or delay circuits or a serial-parallel connection as a combination thereof and signals of which phases are sequentially shifted are output from terminals of the delay elements or the delay circuits.

The timing signal generating circuit may employ delays circuits according to (13) to (17).

(13) A delay circuit used in the phase shift circuit of (1) to (12), comprising (a) a serial-connection delay circuit group including Q delay circuits having at least two different delay times, (b) a bypass switch group including Q bypass switches connected between both terminals of the respective delay circuits, and (c) an output switch group including Q switches connected between a terminal apart from a signal input side of the respective delay circuits and an output terminal.

(14) A delay circuit used in the phase shift circuit of (1) to (12), comprising (a) a serial-connection delay circuit group including Y−1 first delay circuits with a delay time of $T \cdot Y^0$, Y−1 second delay circuits with a delay time of $T \cdot Y^1$, ..., and Y−1 P-th delay circuits with a delay time of $T \cdot Y^{P-1}$, (b) a bypass switch group including Y−1 first bypass switches connected between both terminals of the first delay circuits, Y−1 second bypass switches connected between both terminals of the second delay circuits, ..., and Y−1 P-th bypass switches connected between both terminals of the P-th delay circuits, and (c) an output switch group including Y−1 first output switches connected between a terminal apart from a signal input side of the first delay circuits and a signal output terminal, Y−1 second output switches connected between a terminal apart from a signal input side of the second delay circuits and a signal output terminal, ..., and Y−1 P-th output switches connected between a terminal apart from a signal input side of the P-th delay circuits and a signal output terminal.

(15) The delay circuit according to (14), wherein Y=2.

(16) The delay circuit according to any one of (13) to (15), wherein a short-circuit preventing switch being turned on or off in synchronization with the bypass switches of the delay circuits are connected in series to the delay circuits.

(17) The delay circuit according to any one of (13) to (16), wherein the delay circuits include an integration circuit manufactured on a semiconductor integrated circuit.

The delay circuits according to (13) to (17) can be used in the phase shift circuit. In this case, the periodic signal output circuit is connected to a signal input terminal. One period of the periodic signal output circuit is equal to the maximum delay time caused by the serial-connection delay circuit group and is greater than the above-mentioned delay time.

Here, the "predetermined timing of a processing signal" is typically a "level-transition timing value of the processing signal." The phase shift circuit includes a serial connection or a parallel connection of delay elements or delay circuits or a serial-parallel connection as a combination thereof.

The phase shift circuit can output a single signal. In this case, the phase shift controller can control the phase shift circuit to output a signal with a predetermined phase. Any one of the second to M-th pulses can be output from the terminals of the delay elements or the delay circuit. The phase shift circuit can include a line of switches passing an input signal and the phase shift controller can control the ON and OFF of the switches. The phase shift circuit may output plural signals of which phases are shifted. In this case, any one of the second to M-th pulses can be output from the terminals of the delay elements or the delay circuits. The phase shift circuit can include a line of switches passing an input signal. In this case, the phase shift controller can deactivate the delay elements or the delay circuits not used.

The counter circuit may perform one operation of converting a serial input into a parallel output and converting a parallel input into a serial output. Specifically, the counter circuit may be a normal counter outputting a count value in parallel bits, a counter outputting a carrier signal or a borrow signal at the time of counting up or down, or a shift register. A tri-state buffer may be used as the delay element and an integration circuit may be used as the delay circuit. An element or circuit capable of converting a voltage into a time may be used as the delay element or the delay circuit.

A predetermined timing (such as period, ON time, OFF time, duty ratio, dead time, and ratio of dead time to period) of a processing signal can be adjusted more finely than that of the frequency of the repeat signal generating circuit. That is, even when an oscillator with a pulse of several tens MHz, it is possible to generate a level-transition timing signal of the processing signal with a frequency of several GHz and thus to provide a PWM control device and a VCO control device with an inexpensive control device. Since the phase shift controller stopping the operation of the pulse generating circuit not performing a counting operation can be provided, it is possible to further reduce the power consumption. Since the phase shift circuit can include a serial connection or a parallel connection of delay elements or delay circuits or a serial-parallel connection as a combination thereof, it is possible to suppress the manufacturing cost.

Figure 19:
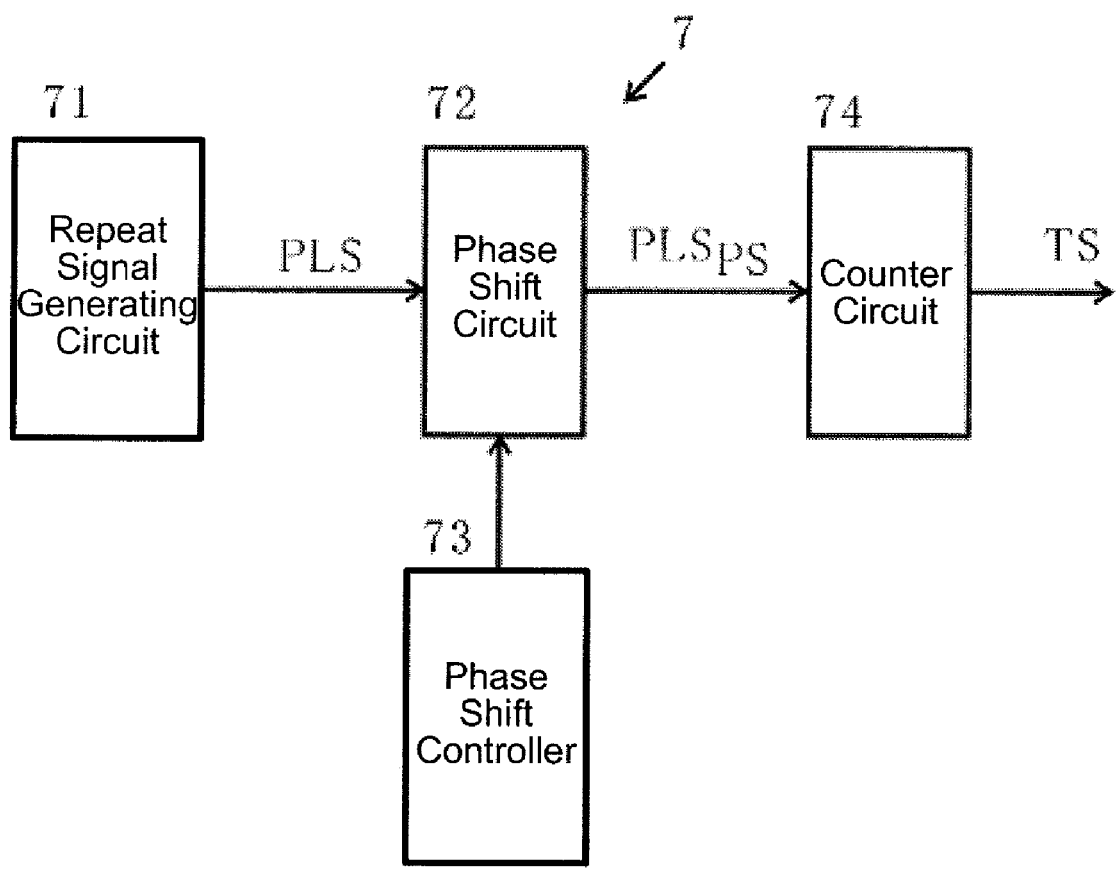
FIG. 19 is a diagram illustrating a timing signal generating circuit in which a repeat signal generating circuit generates signals with plural phases.
Figure 20:
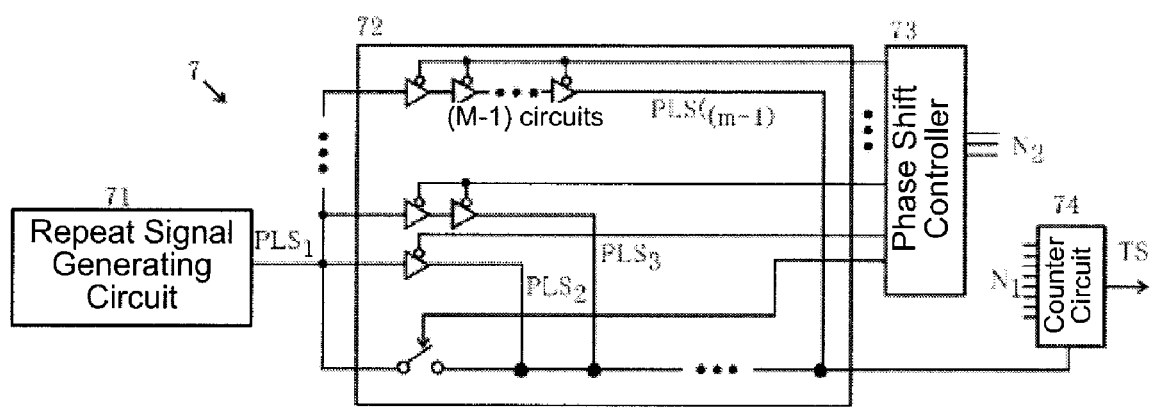
FIG. 20 is a circuit diagram specifically illustrating the timing signal generating circuit shown in FIG. 19.

FIGS. 19 and 20 are diagrams illustrating the timing signal generating circuit in which the repeat signal generating circuit generates signals with plural phases.

In FIG. 19, the timing signal generating circuit 7 generates a predetermined timing (such as period, ON time, OFF time, duty ratio, dead time, and ratio of dead time to period) of a processing signal and includes a repeat signal generating circuit 71, a phase shift circuit 72, a phase shift controller 73, and a counter circuit 74.

The phase shift circuit 72 receives a repeat signal PLS from the repeat signal generating circuit 71 and outputs a pulse of which a phase is shifted by a predetermined quantity. The phase shift controller 73 controls what phase of pulse the phase shift circuit 72 should output.

The counter circuit 74 counts the output of the phase shift circuit 72 up to a predetermined value (the number corresponding to the value of the upper cipher $N_1$) and outputs a count end signal (signal output after the counting up or down is ended). This signal is a synthesized timing signal of the timing (timing corresponding to the value of the upper cipher $N_1$) and the timing (timing corresponding to the value of the lower cipher $N_2$ and being selected by the phase shift controller 73) shifted by the phase shift circuit 72.

FIG. 20 is a circuit diagram specifically illustrating the timing signal generating circuit 7 shown in FIG. 19. The phase shift circuit 72 includes a parallel connection of a switch SW, a first delay circuit generating a delay time T, a second delay circuit generating a delay time 2T, . . . , and a (M−1)-th delay circuit generating a delay time (M−1)T.

As shown in FIG. 20, the phase shift circuit 72 uses the pulse PLS output from the repeat signal generating circuit 71 as a first pulse $PLS_1$ to output the first pulse $PLS_1$ or one of a second pulse $PLS_2$, a third pulse $PLS_3$, . . . , and an M-th pulse $PLS_M$ of which the phases are sequentially shifted from the first pulse $PLS_1$ as $PLS_{PS}$. Here, the phase shift controller 73 controls the phase shift circuit 72 to output only one pulse of the first to M-th pulses $PLS_1$ to $PLS_M$.

The switch SW selects the signal from the repeat signal generating circuit 71 as $PLS_1$, the first delay circuit generates $PLS_2$ obtained by delaying $PLS_1$ by T, and the second delay circuit generates $PLS_3$ obtained by delaying $PLS_1$ by 2T. The (M−1)-th delay circuit generates $PLS_M$ obtained by delaying $PLS_1$ by (M−1)T. The phase shift controller 73 has a lower cipher of the timing value set therein, activates the switch SW and one of the first to (M−1)-th delay circuits, and deactivates the other delay circuits. The counter circuit 74 has an upper cipher $N_1$ and the counter circuit 74 can output a timing signal TS corresponding to the timing value $N_1N_2$.

Figure 21:
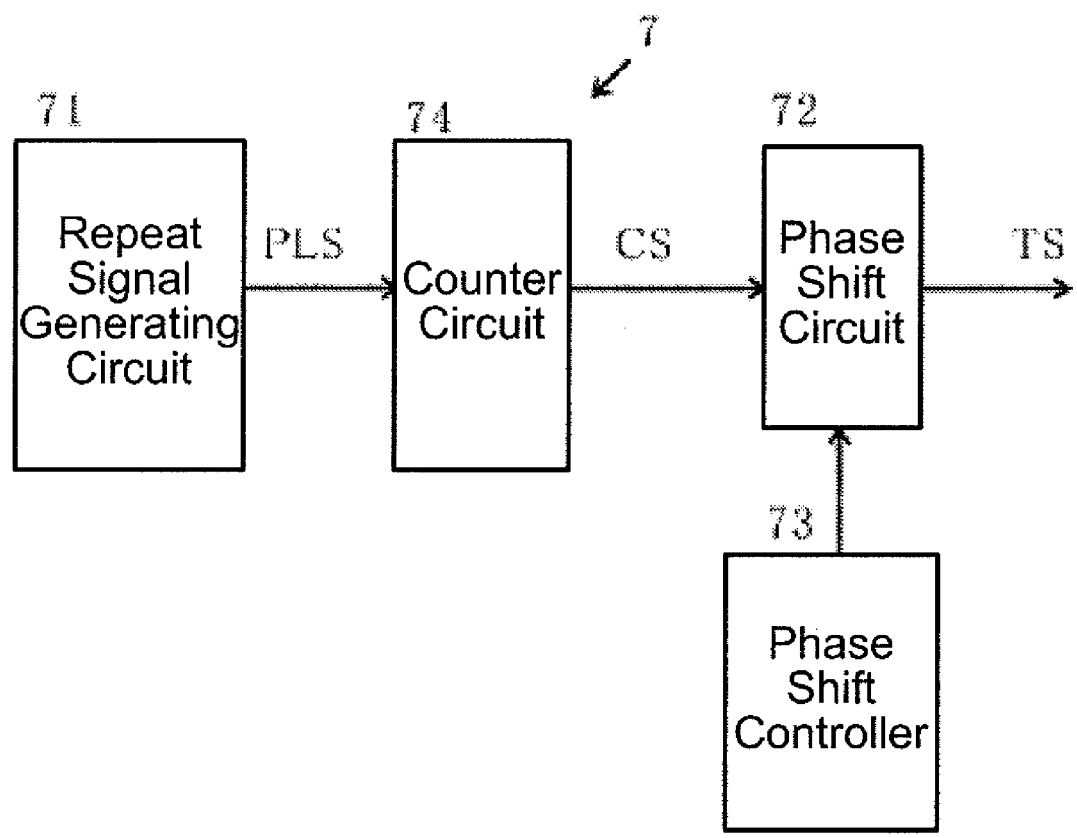
FIG. 21 is a diagram illustrating another example of the timing signal generating circuit.

FIG. 21 is a diagram illustrating another configuration of the timing signal generating circuit. In FIG. 21, the timing signal generating circuit 7 generates a predetermined timing (such as period, ON time, OFF time, duty ratio, dead time, and ratio of dead time to period) of a processing signal, similarly to the timing signal generating circuit shown in FIG. 19 and includes a repeat signal generating circuit 71, a counter circuit 74, a phase shift circuit 72, and a phase shift controller 73.

In FIG. 21, the counter circuit 74 counts the pulses PLS from the repeat signal generating circuit 71 up to a predetermined number (value of the upper cipher $N_1$) and then outputs a count end signal. The phase shift circuit 72 outputs one of pulses PLS of which phases are shifted by a predetermined quantity, when receiving the output pulse (counting end pulse) CS of the counter circuit 74.

The phase shift controller 73 controls what phase of pulse the phase shift circuit 72 should output. Accordingly, the phase shift circuit 72 can output a synthesized timing pulse of the timing (timing corresponding to the value of the upper cipher $N_1$) of the repeat signal and the timing (timing corresponding to the value of the lower cipher $N_2$ and being selected by the phase shift controller 73) shifted by a predetermined quantity by the phase shift circuit 72.

Figure 22:
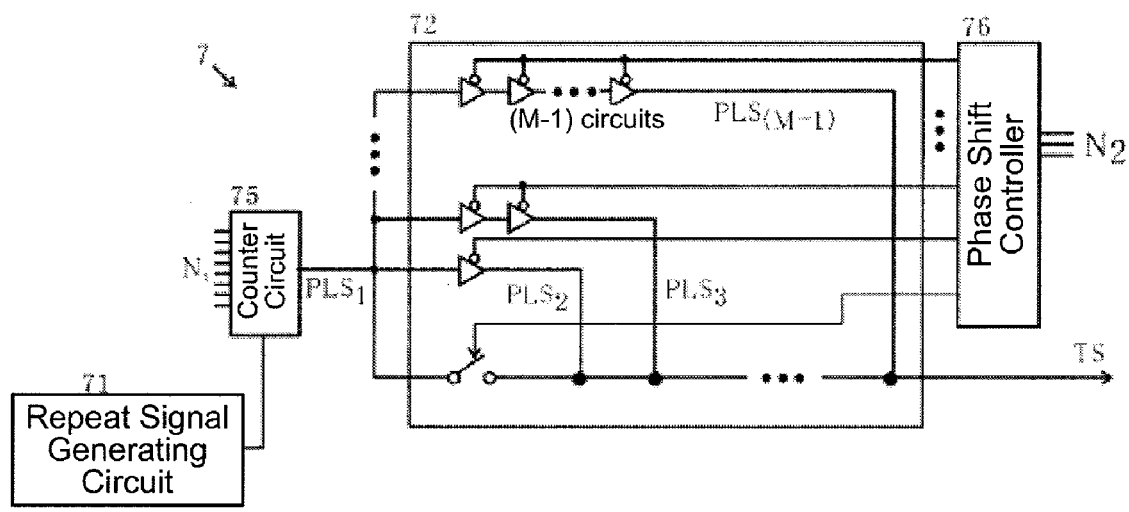
FIG. 22 is a circuit diagram illustrating a specific example of the timing signal generating circuit shown in FIG. 21.

As shown in FIG. 22, the phase shift circuit 72 uses the count end signal output from the counter circuit 74 as a first pulse $PLS_1$ to output the first pulse $PLS_1$ or one of a second pulse $PLS_2$, a third pulse $PLS_3$, . . . , and an M-th pulse $PLS_M$ of which the phases are sequentially shifted from the first pulse $PLS_1$. The phase shift controller 73 controls the phase shift circuit 72 to output one of the first to M-th pulses $PLS_1$ to $PLS_M$.

In the timing signal generating circuit 1 shown in FIG. 20, the counter circuit 74 is disposed at a back stage of the phase shift circuit 72, but the counter circuit 74 is disposed at a back stage of the phase shift circuit 72 in FIG. 22. Similarly to FIG. 20, in FIG. 22, the lower cipher $N_2$ of the timing signal is set in the phase shift controller 73, the upper cipher $N_1$ is set in the counter circuit 74, and the phase shift circuit 72 can output a timing signal TS corresponding to the timing value $N_1N_2$.

In the timing signal generating circuits shown in FIGS. 19 and 21, the constituent elements may be properly shared or the timing signal generating circuits may be combined. Examples thereof are shown in FIGS. 23 to 26.

Figure 23:
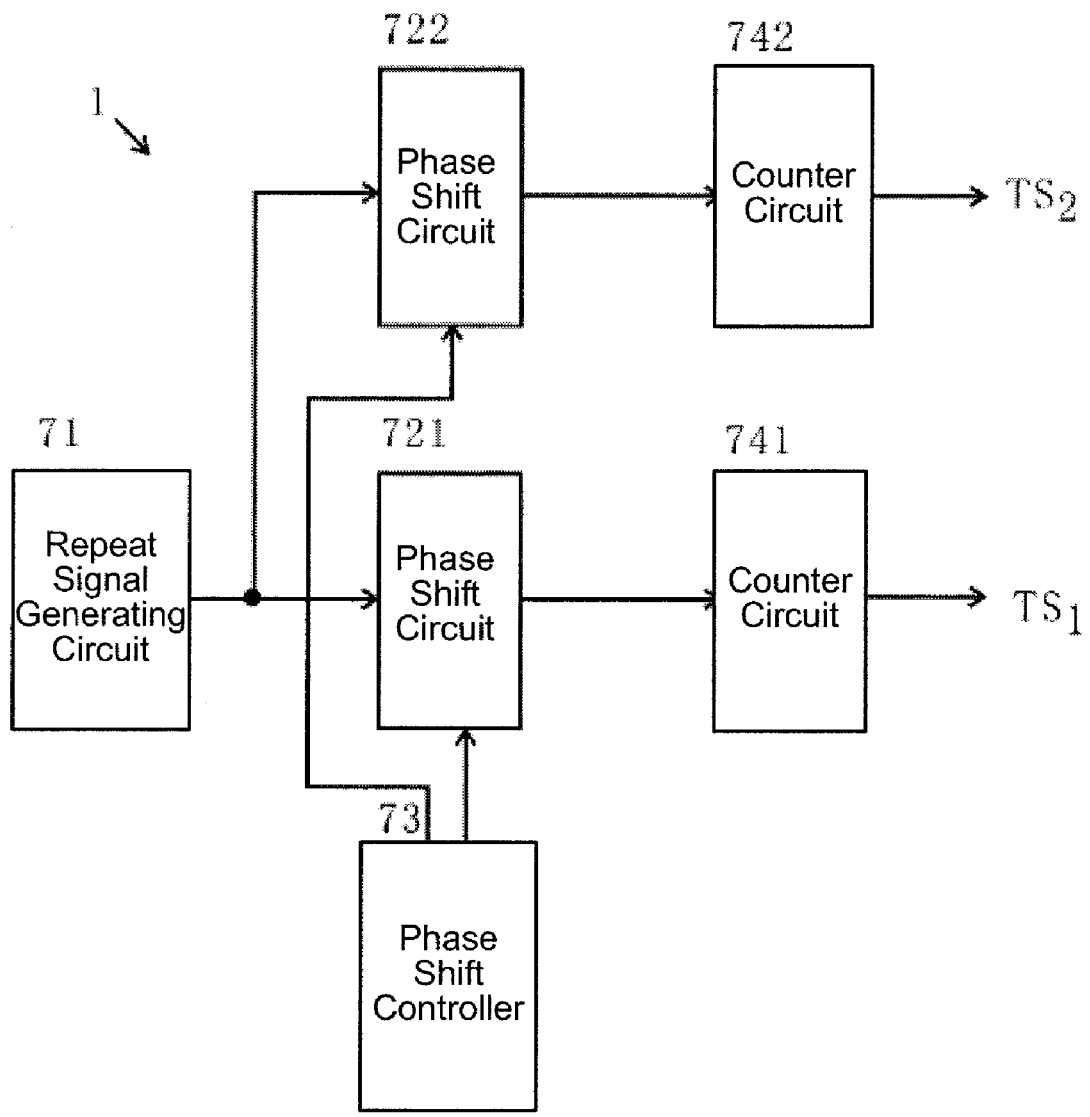
FIG. 23 is a diagram illustrating a modified example of the circuit shown in FIG. 19.

FIG. 23 is a diagram illustrating a modified example of the circuit shown in FIG. 19. In the timing signal generating circuit 7 shown in FIG. 23, a phase shift circuit 721 in a group of the phase shift circuit 721 and the counter circuit 741 and a phase shift circuit 722 in a group of the phase shift circuit 722 and the counter circuit 742 are controlled by a single phase shift controller 73. In FIG. 23, the repeat signal generating circuit 71 is also shared by two groups, a timing signal $TS_1$ is output from the counter circuit 741, and a timing signal $TS_2$ is output from the phase shift circuit 722.

Figure 24:
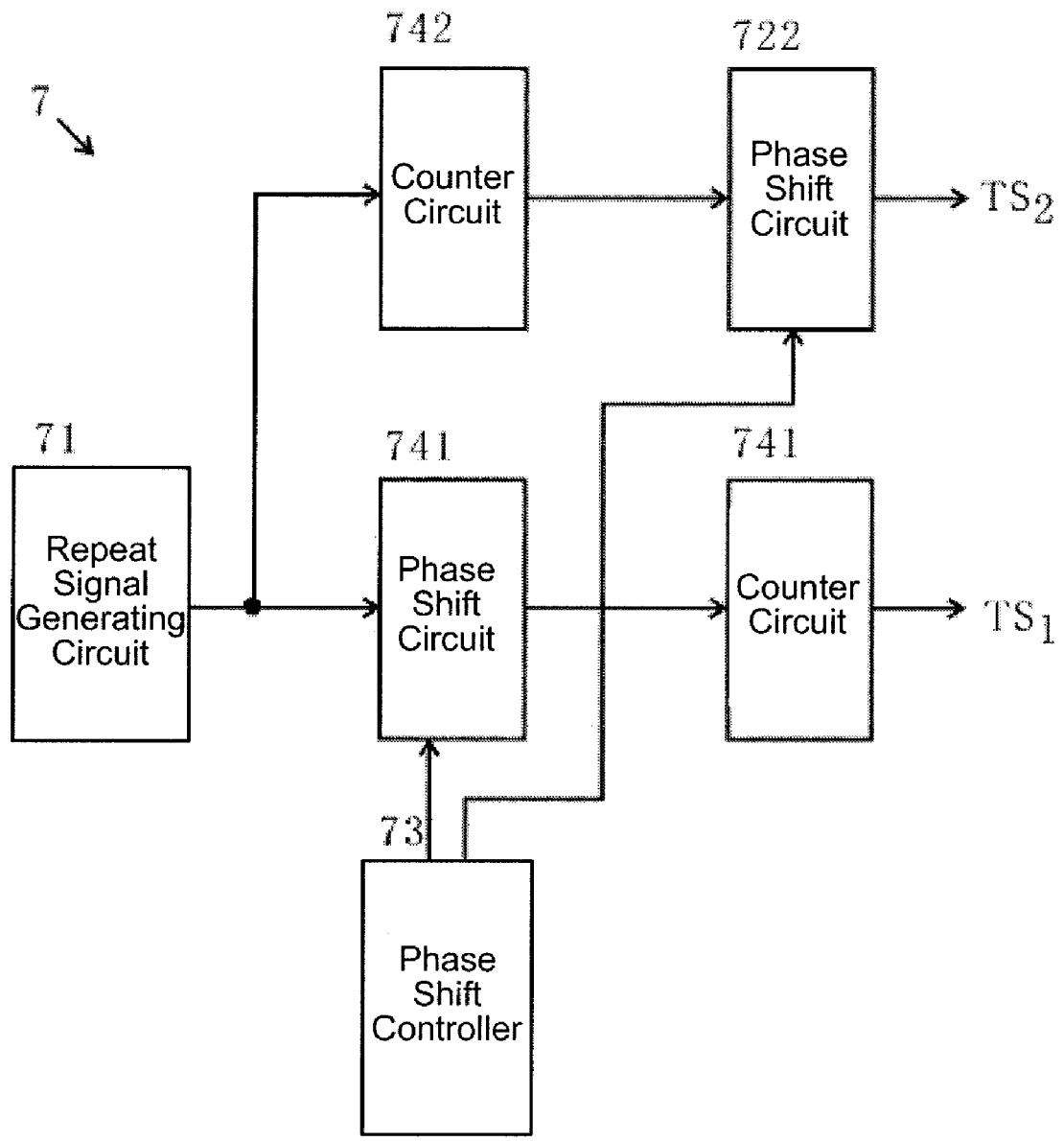
FIG. 24 is a diagram illustrating a combined circuit of the circuit shown in FIG. 19 and the circuit shown in FIG. 21.

FIG. 24 is a diagram illustrating a synthesized circuit of the circuit shown in FIG. 19 and the circuit shown in FIG. 21. In the timing signal generating circuit 7 shown in FIG. 24, a phase shift circuit 721 in a group of the phase shift circuit 721 and the counter circuit 741 and a phase shift circuit 722 in a group of the phase shift circuit 722 and the counter circuit 742 are controlled by a single phase shift controller 73. In FIG. 24, the repeat signal generating circuit 71 is also shared by two groups, a timing signal $TS_1$ is output from the counter circuit 741, and a timing signal $TS_2$ is output from the phase shift circuit 722.

Figure 25:
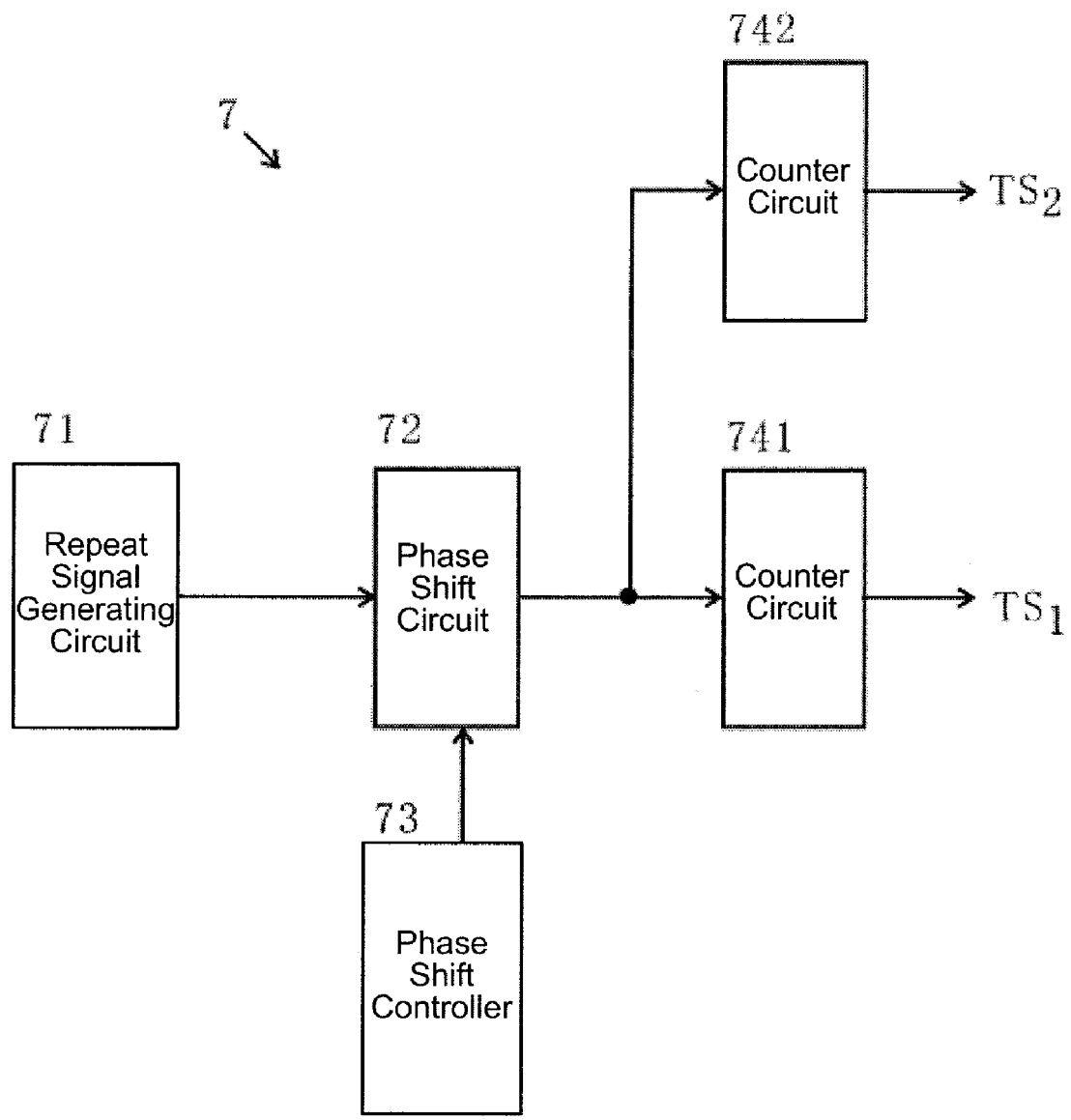
FIG. 25 is a diagram illustrating another modified example of the circuit shown in FIGS. 19 and 20.

FIG. 25 is a diagram illustrating another modified example of the circuits shown in FIGS. 19 and 20. In the timing signal generating circuit 7 shown in FIG. 25, the counter circuits 741 and 742 are disposed at a back stage of the phase shift circuit 72, a timing signal $TS_1$ is output from the counter circuit 741, and a timing signal $TS_2$ is output from the counter circuit 742.

Figure 26:
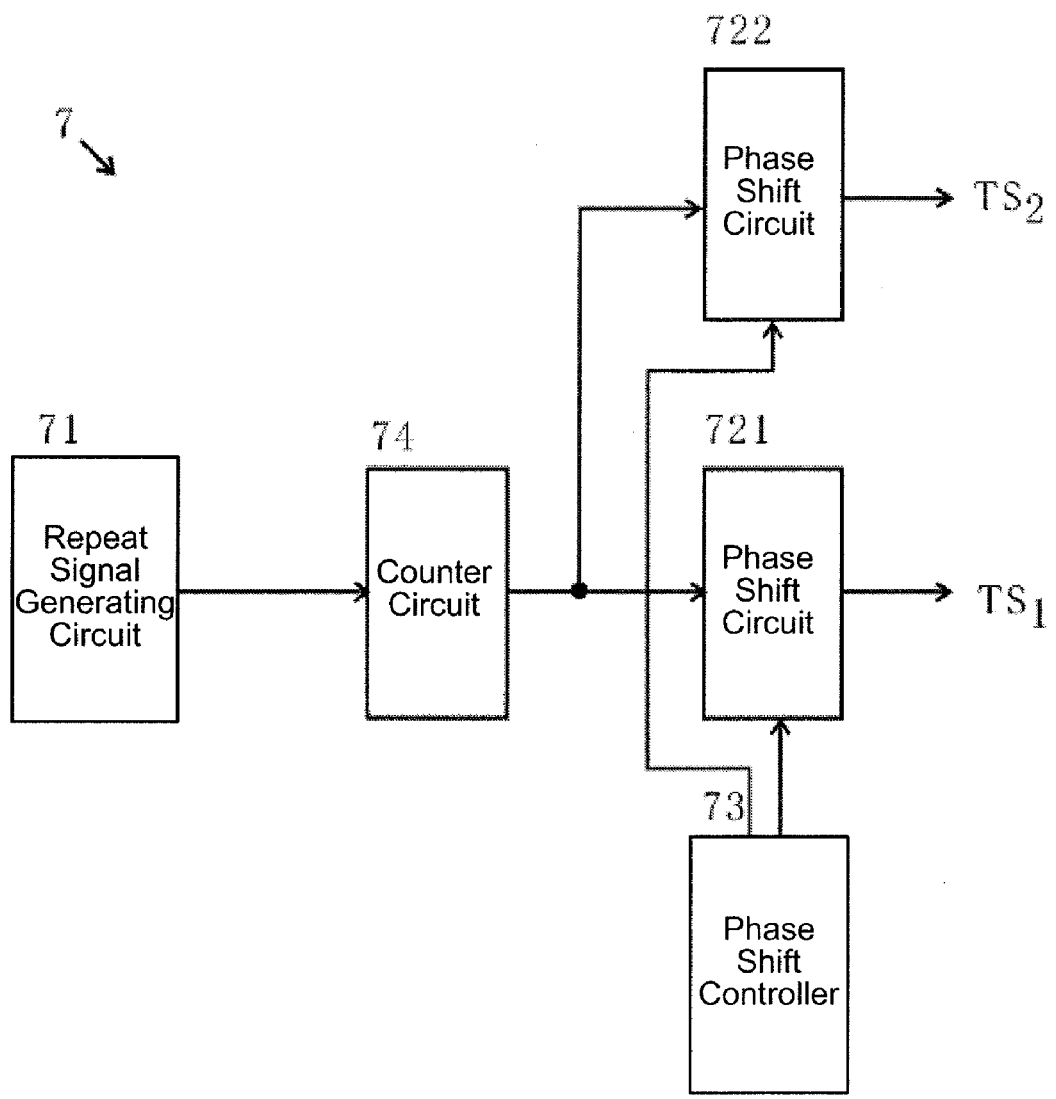
FIG. 26 is a diagram illustrating a modified example of the circuit shown in FIG. 21.

FIG. 26 is a diagram illustrating a modified example of the circuit shown in FIG. 21. In the timing signal generating circuit 7 shown in FIG. 26, the phase shift circuits 721 and 722 are disposed at a back stage of the counter circuit 74, the phase shift controller 73 is shared by the phase shift circuits 721 and 722, a timing signal $TS_1$ is output from the phase shift circuit 721, and a timing signal $TS_2$ is output from the phase shift circuit 722.

FIGS. 27 to 32 are diagrams illustrating the timing signal generating circuit in which the repeat signal generating circuit generates plural phases of signals.

Figure 27:
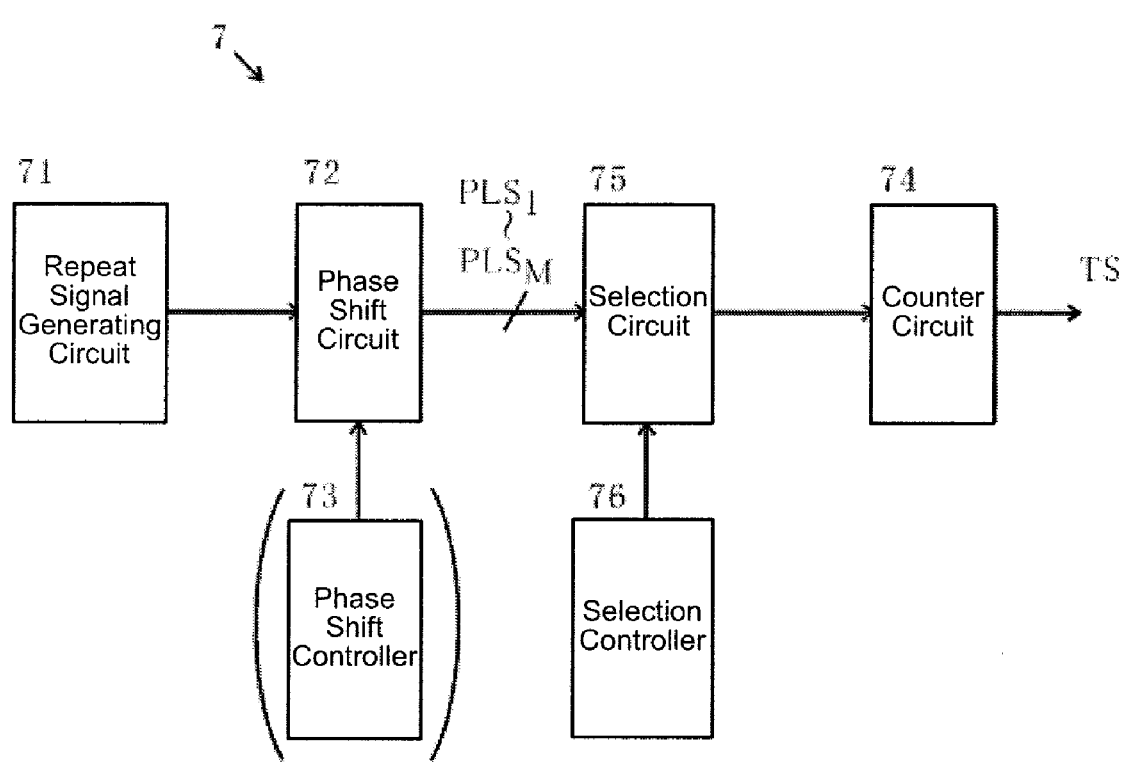
FIG. 27 is a diagram illustrating an example of a timing signal generating circuit in which a repeat signal generating circuit generates signals with plural different phases.

The timing signal generating circuit shown in FIG. 27 includes a repeat signal generating circuit 71, a phase shift circuit 72, a phase shift controller 73, a selection circuit 75, a selection controller 76, and a counter circuit 74.

The phase shift circuit 72 uses the pulse output from the repeat signal generating circuit 71 as a first pulse $PLS_1$ to output the first pulse $PLS_1$ or one of a second pulse $PLS_2$, a third pulse $PLS_3$, . . . , and an M-th pulse $PLS_M$ of which the phases are sequentially shifted from the first pulse $PLS_1$. In FIG. 27, the phase shift controller 73 is used to deactivate the elements or circuits not used among the delay elements or the delay circuits of the phase shift circuit 72 and can be omitted.

The selection circuit 75 selects and outputs one of the output signals (the first pulse $PLS_1$ to the M-th pulse $PLS_M$) from the phase shift circuit 72 to correspond to the value of the lower cipher $N_2$ of the timing value.

Figure 28:
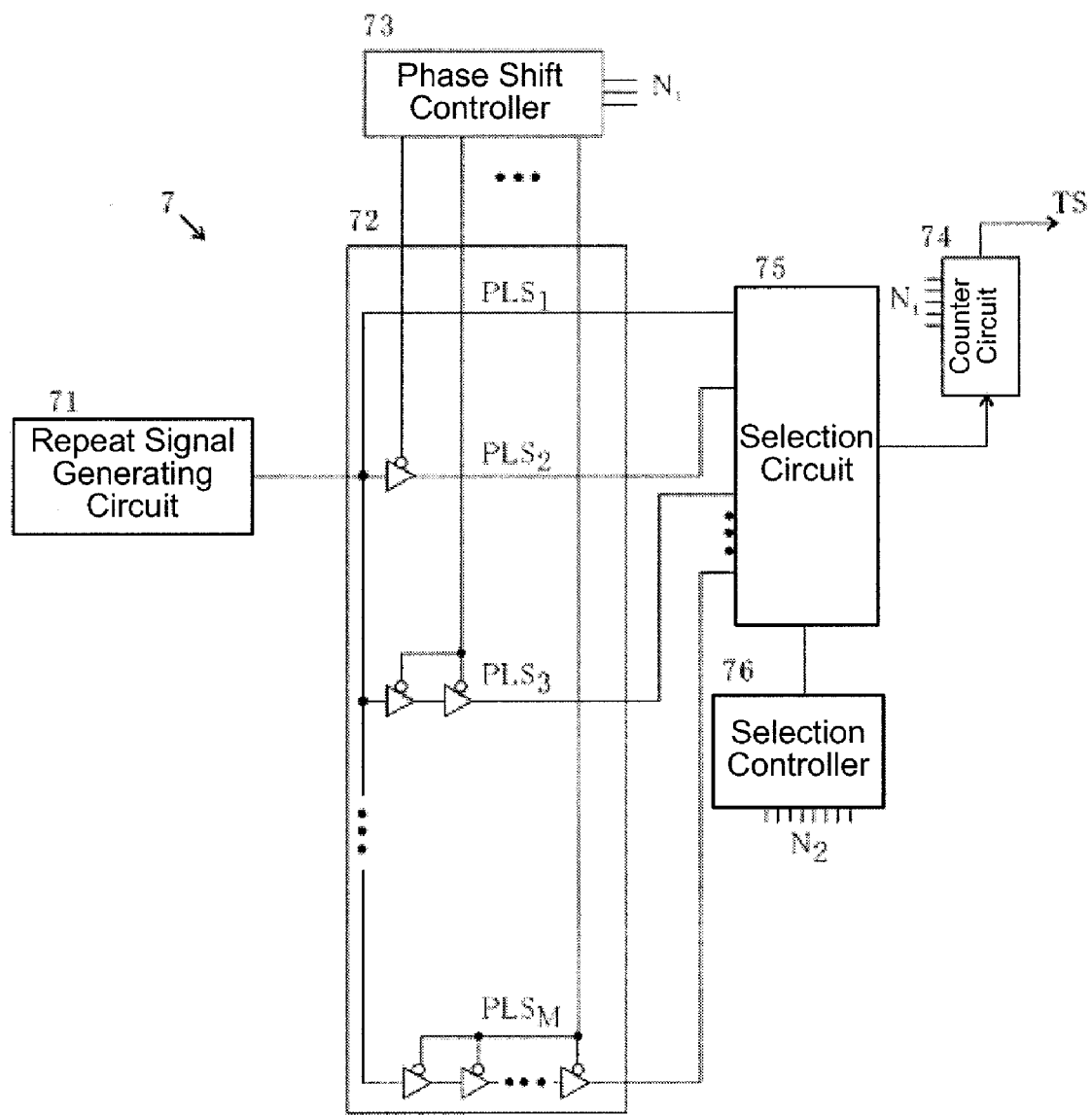
FIG. 28 is a circuit diagram specifically illustrating the timing signal generating circuit shown in FIG. 27.

That is, as shown in FIG. 28, the selection controller 76 outputs a selection instructing signal to the selection circuit 75 and the selection circuit 75 uses the selection instructing signal as a first pulse $PLS_1$ to output the first pulse $PLS_1$ or one (pulse corresponding to the value of a lower cipher $N_2$ of the timing value) of a second pulse $PLS_2$, a third pulse $PLS_3$, . . .

, and an M-th pulse $PLS_M$ of which the phases are sequentially shifted from the first pulse $PLS_1$. Since the value corresponding to the upper cipher $N_1$ of the timing value is set in the counter circuit 74, the counter circuit 74 outputs the count end signal as a timing signal corresponding to a value $N_1N_2$ obtained by combining the value of the lower cipher $N_2$ and the value of the upper cipher $N_1$ when the count value reaches the set value.

In FIG. 28, the phase shift circuit 72 includes a parallel connection of a path passing the signal from the repeat signal generating circuit 71, a first delay circuit generating a delay time T, a second delay circuit generating a delay time 2T, . . . , and a (M−1)-th delay circuit generating a delay time (M−1)T.

The selection circuit 75 receives $PLS_1$, $PLS_2$, $PLS_3$, . . . , and $PLS_M$ and selects one on the basis of the value of the lower cipher $N_2$. The selection circuit 75 makes a selection in accordance with an instruction from the selection controller 76. Since the upper cipher $N_1$ is set in the counter circuit 74, the counter circuit 74 can output a timing signal TS corresponding to the timing value $N_1N_2$.

Figure 29:
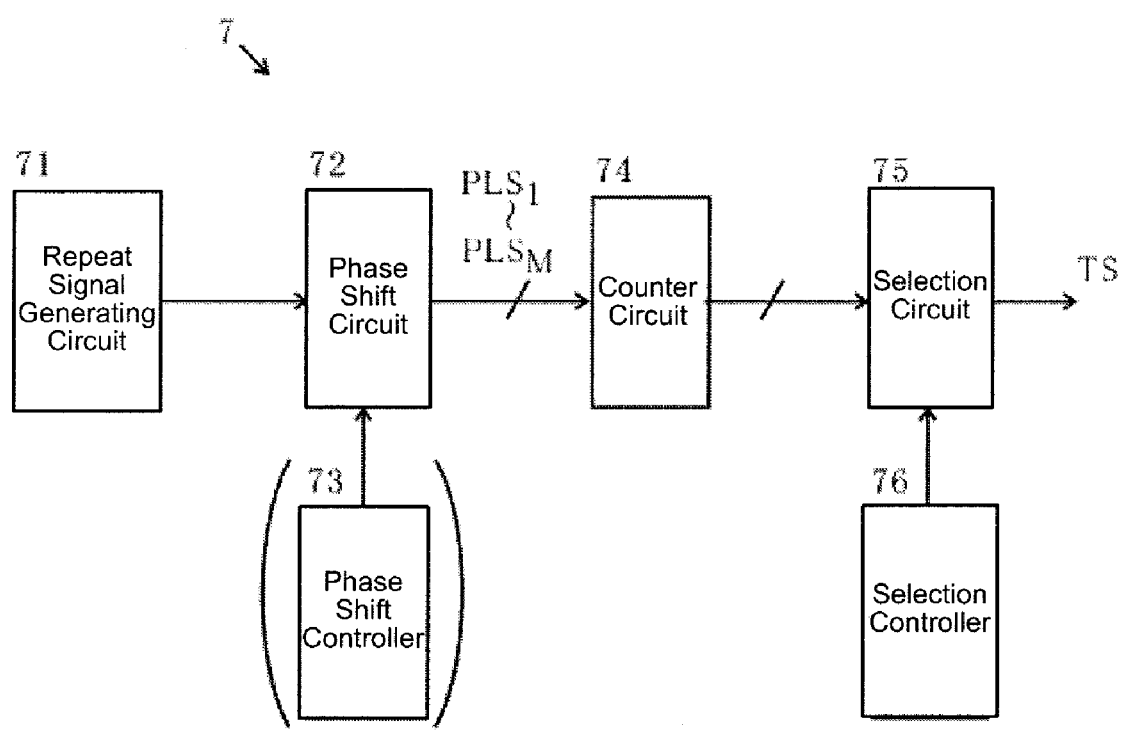
FIG. 29 is a diagram illustrating another example of the timing signal generating circuit in which the repeat signal generating circuit generates signals with plural different phases.

The timing signal generating circuit 7 shown in FIG. 29 includes a repeat signal generating circuit 71, a phase shift circuit 72 generating plural signals of which the phases are shifted by a predetermined quantity, a phase shift controller 73, a counter circuit 74 including plural counter circuit elements in which a value $N_1$ corresponding to the upper cipher of the timing signal, a selection circuit 75 selecting the output signals from the plural counter circuit elements on the basis of the value $N_2$ corresponding to the lower cipher of the timing value.

In FIG. 29, the phase shift circuit 72 and the phase shift controller 73 operate similarly to the phase shift circuit 72 and the phase shift controller 73 shown in FIG. 28. That is, the phase shift circuit 72 uses the pulse output from the repeat signal generating circuit 71 as a first pulse $PLS_1$ to output the first pulse $PLS_1$ or one of a second pulse $PLS_2$, a third pulse $PLS_3$, . . . , and an M-th pulse $PLS_M$ of which the phases are sequentially shifted from the first pulse $PLS_1$. In FIG. 29, similarly to FIG. 27, the phase shift controller 73 is used to deactivate the elements or circuits not used among the delay elements or the delay circuits of the phase shift circuit 72 and can be omitted.

The counter circuit elements constituting the counter circuit 74 but not shown receive and count the first pulse $PLS_1$ to the M-th pulse $PLS_M$ which are the output signals of the phase shift circuit 72, and outputs the count end signal when the count value reaches the set value (the value $N_1$ corresponding to the upper cipher of the timing value). The selection circuit 75 selects one of the output signals of the counter circuit elements of the counter circuit 74 on the basis of the value $N_2$ of the lower cipher of the timing value and outputs the selected signal as a timing signal corresponding to the value $N_1N_2$ obtained by combining the value $N_1$ of the upper cipher and the value of the lower cipher $N_2$.

Figure 30:
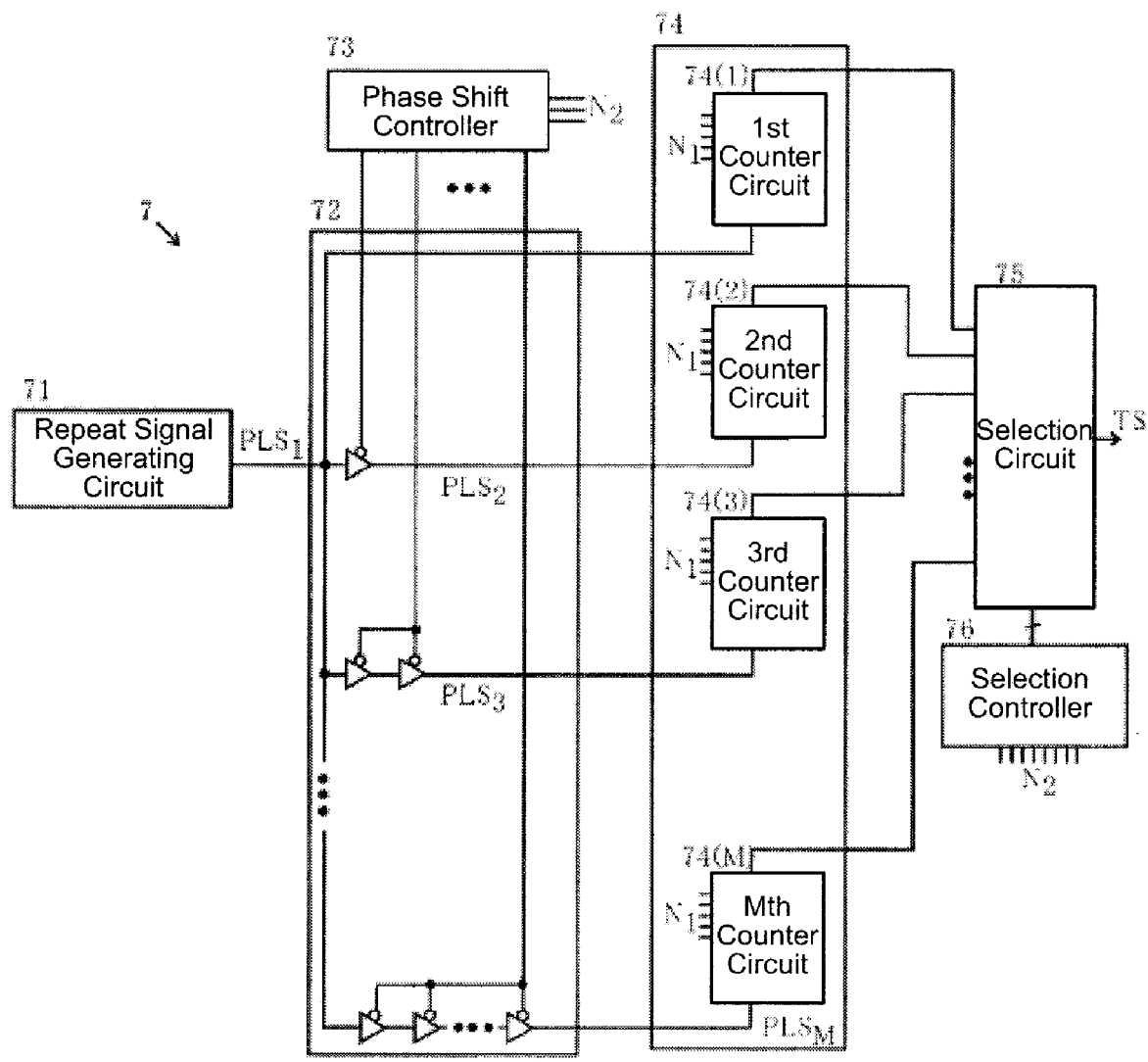
FIG. 30 is a circuit diagram specifically illustrating the timing signal generating circuit 7 shown in FIG. 29.

FIG. 30 is a circuit diagram specifically illustrating the timing signal generating circuit 7 shown in FIG. 29. The phase shift circuit 72 includes a parallel connection of a circuit passing the signal from the repeat signal generating circuit 71, a first delay circuit generating a delay time T, a second delay circuit generating a delay time 2T, . . . , and a (M−1)-th delay circuit generating a delay time (M−1)T.

The counter circuit 74 includes counter circuit elements 14(1), 14(2), . . . , and 14(M), which have the value of the upper cipher $N_1$, and outputs the count end signal to the selection circuit 75. The selection circuit 75 receives $PLS_1$, $PLS_2$, $PLS_3$, . . . , and $PLS_M$ and selects $PLS_1$, $PLS_2$, $PLS_3$, . . . , and $PLS_M$ on the basis of the value of the lower cipher $N_2$. The selection circuit 75 can output the timing signal TS corresponding to the timing value $N_1N_2$.

Figure 31:
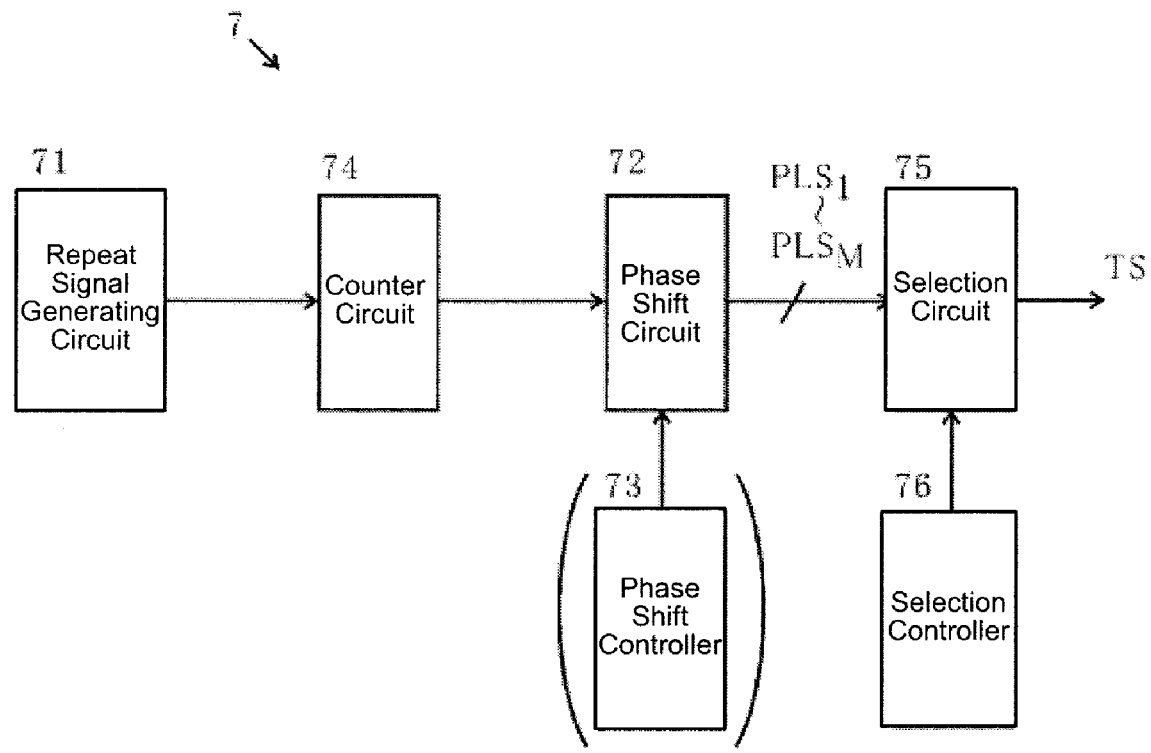
FIG. 31 is a diagram illustrating another example of the timing signal generating circuit in which the repeat signal generating circuit generates signals with plural different phases.

The timing signal generating circuit 7 shown in FIG. 31 includes a repeat signal generating circuit 71, a counter circuit 74, a phase shift circuit 72, a phase shift controller 73, a selection circuit 75, and a selection controller 76.

The value of the upper cipher $N_1$ of a predetermined timing value is set in the counter circuit 74 by a control device not shown. The counter circuit 74 counts the output pulses of the repeat signal generating circuit 71 until the count value reaches the set value, and outputs the count end signal when the count value reaches the set value (the value $N_1$ corresponding to the upper cipher of the timing value).

The phase shift circuit 72 uses the pulse output from the counter circuit 74 as a first pulse $PLS_1$ to output the first pulse $PLS_1$ or one of a second pulse $PLS_2$, a third pulse $PLS_3$, . . . , and an M-th pulse $PLS_M$ of which the phases are sequentially shifted from the first pulse $PLS_1$. In FIG. 31, similarly to FIGS. 27 and 29, the phase shift controller 73 is used to deactivate the elements or circuits not used among the delay elements or the delay circuits of the phase shift circuit 72 and can be omitted.

The selection circuit 75 selects one of the plural output signals (the first pulse $PLS_1$, the second pulse $PLS_2$, . . . , and the M-th pulse $PLS_M$) of the phase shift circuit on the basis of the value $N_2$ corresponding to the lower cipher and outputs the selected signal as a timing signal corresponding to the value $N_1N_2$ obtained by combining the value $N_1$ of the upper cipher and the value $N_2$ of the lower cipher.

Figure 32:
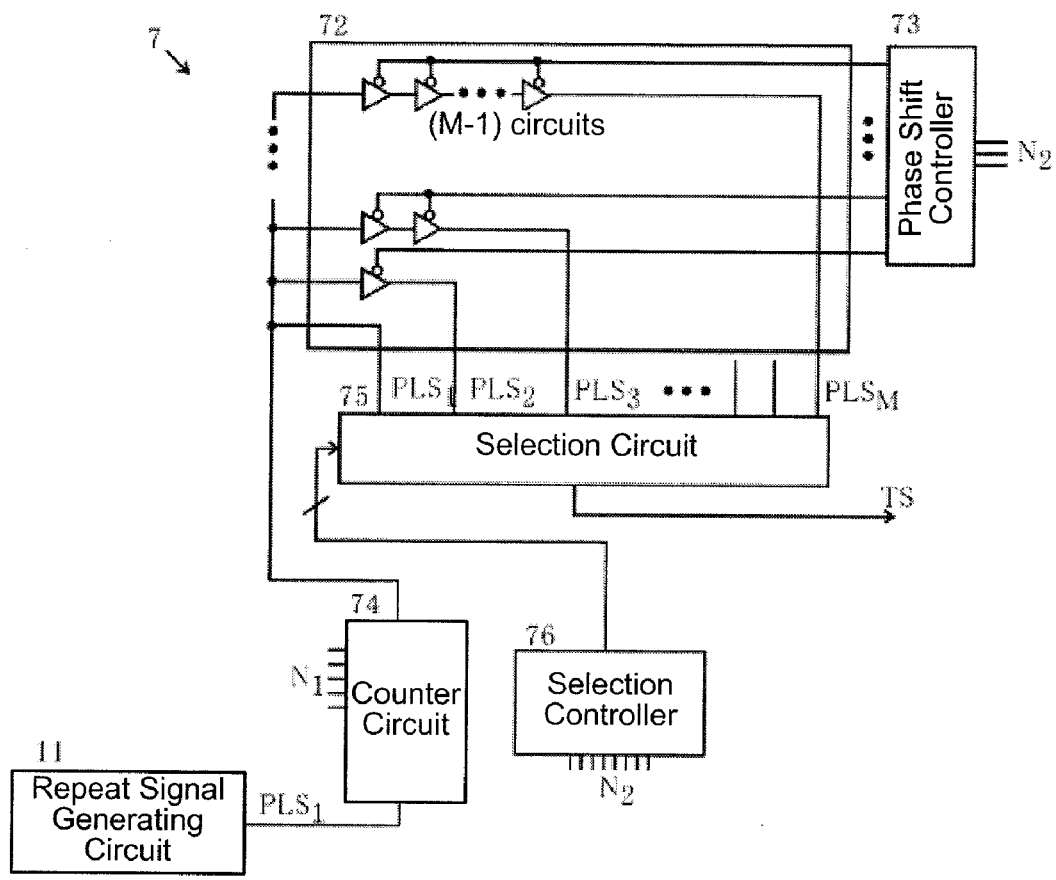
FIG. 32 is a circuit diagram specifically illustrating the timing signal generating circuit 7 shown in FIG. 31.

FIG. 32 is a circuit diagram specifically illustrating the timing signal generating circuit 7 shown in FIG. 31.

A value of the upper cipher $N_1$ is set in the counter circuit 74 and the count end signal of the counting circuit 74 is output to the phase shift circuit 72. The phase shift circuit 72 includes a parallel connection of a circuit passing the signal from the repeat signal generating circuit 71, a first delay circuit generating a delay time T, a second delay circuit generating a delay time 2T, . . . , and a (M−1)-th delay circuit generating a delay time (M−1)T and delays the count end signal from the counter circuit 74.

The selection circuit 75 selects one of $PLS_1$, $PLS_2$, $PLS_3$, . . . , and $PLS_M$ on the basis of the value of the lower cipher $N_2$ and outputs the timing signal TS corresponding to the timing value $N_1N_2$.

Figure 33:
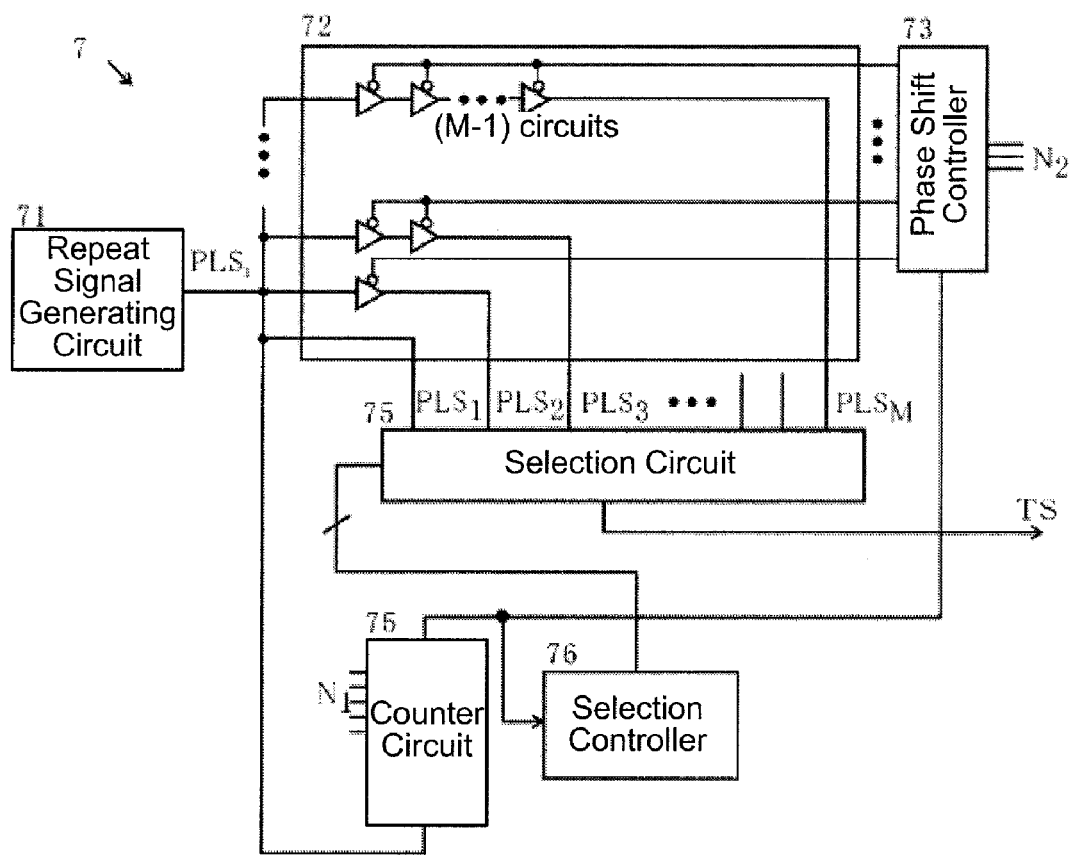
FIG. 33 is a circuit diagram specifically illustrating another example of the timing signal generating circuit 7 shown in FIG. 31.

FIG. 33 is a diagram illustrating another example of the timing signal generating circuit 7 specifically illustrated in FIG. 31. In FIG. 33, when the counter circuit 74 outputs the count end signal, the selection controller 76 gives a selection instruction to the selection circuit 75 on the basis of the count end signal. The phase shift controller 73 deactivates the delay circuits not used on the basis of count end signal from the counter circuit 74.

Figure 34:
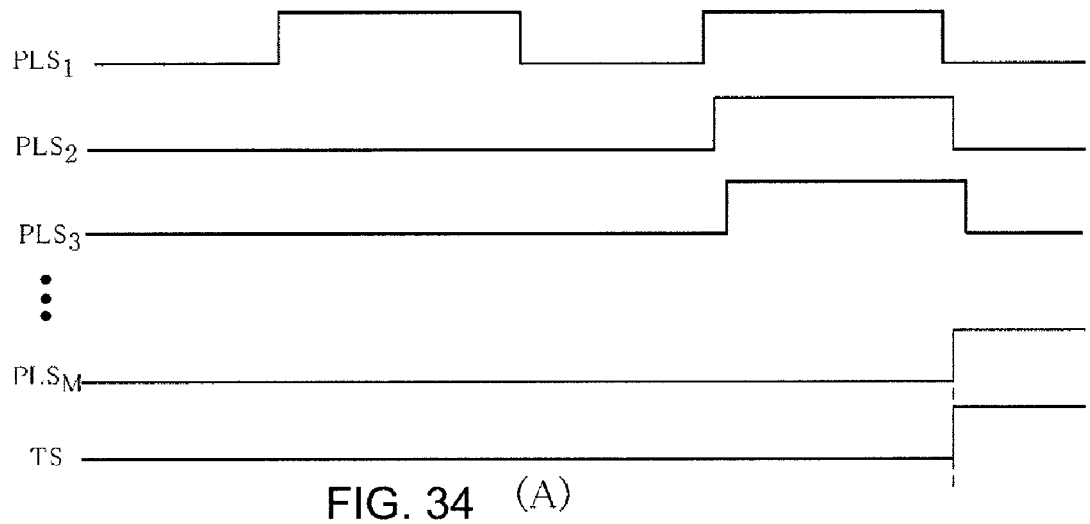
FIGS. 34(A) and 34(B) are diagrams illustrating examples of operating waveforms of the timing signal generating circuit.
Figure 34:
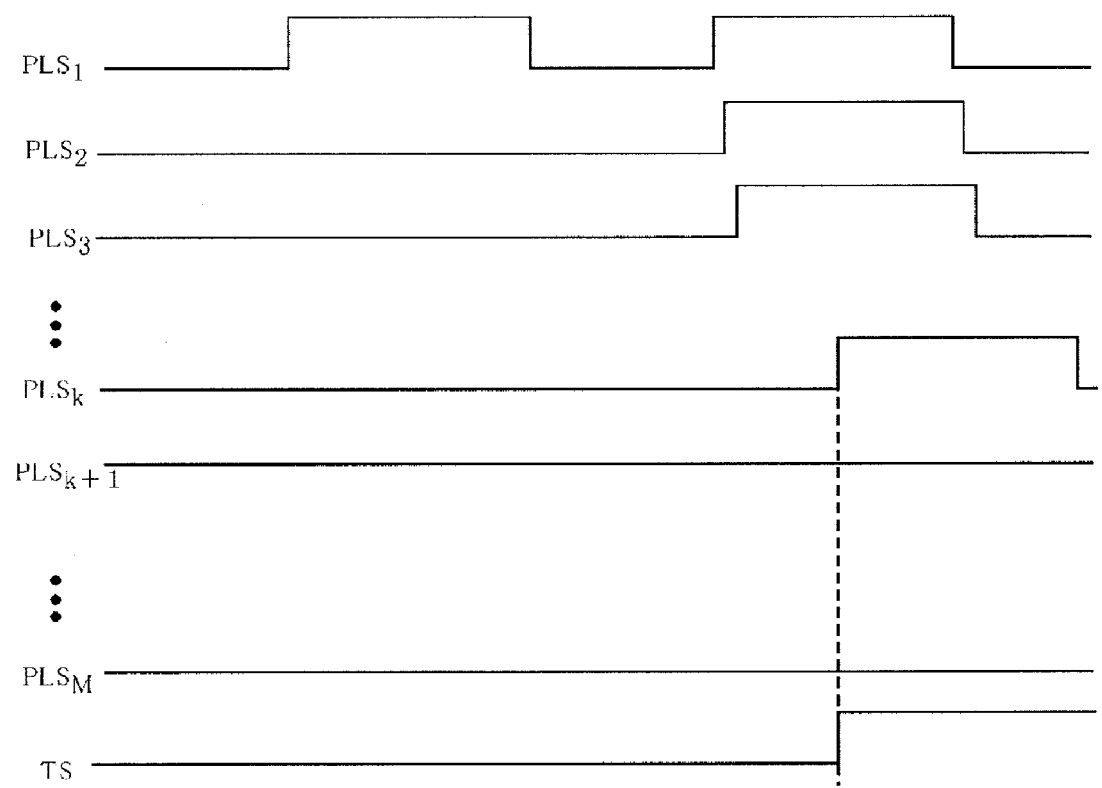

The first pulse $PLS_1$, the second pulse $PLS_2$, the third pulse $PLS_3$, . . . , and the M-th pulse $PLS_M$, and the timing signal TS are shown in FIGS. 34(A) and 34(B). $N_2$ is the maximum $N_{2MAX}$ in FIG. 34(A) and $0<N_2<N_{2MAX}$ is satisfied in FIG. 34(B).

Figure 35:
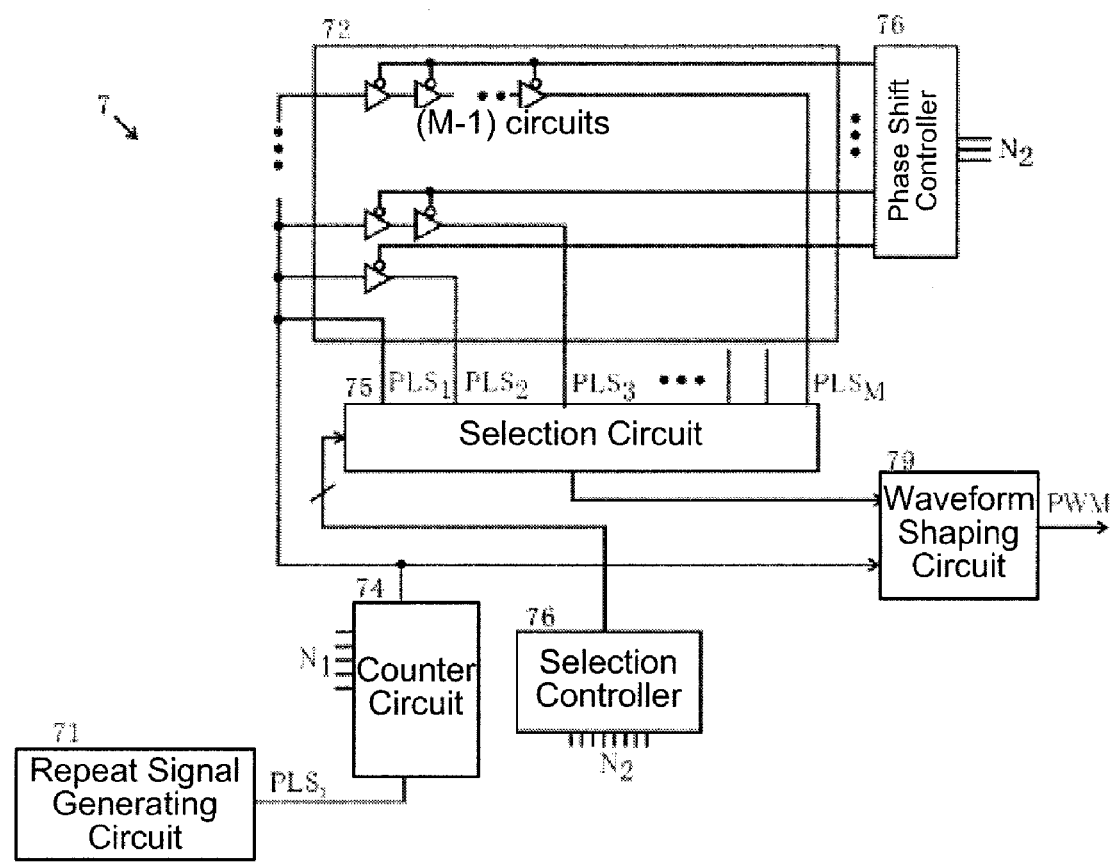
FIG. 35 is a circuit diagram illustrating an example where the timing signal generating circuit is applied to a pulse generating circuit.

FIG. 35 is a circuit diagram illustrating an example where the timing signal generating circuit is applied to a pulse generating circuit.

In FIG. 35, the pulse generating circuit generates a level-transition timing signal of a processing signal which is unchanged or changed in period and which is transited to plural levels in one period. The processing signal may be a pulse signal of which the pulse width is modulated or an output pulse signal of a voltage-controlled oscillator.

The repeat signal generating circuit 71 may employ an oscillation circuit of, for example, 25 to 100 MHz. The counter circuit 74 receives a pulse from the repeat signal generating circuit 71, has set a value corresponding to the upper cipher $N_1$ of the timing value ($N_1N_2$ in this example), and outputs a pulse as a first signal when the count value reaches the value $N_1$.

The phase shift circuit 72 outputs a second pulse $PLS_2$ of which the phase is shifted by the delay time T from the output pulse of the counter circuit 74, a third pulse $PLS_3$ of which the phase is shifted by the delay time 2T from the second pulse, . . . , and an M-th pulse $PLS_M$ of which the phase is shifted by the delay time (M−1)T from the (M−1)-th pulse $PLS_{M-1}$ (where (M−1)T<pulse period $T_P$).

The selection circuit 75 receives the first to M-th pulses of the output of the phase shift circuit 72. The value of the lower cipher $N_2$ of the timing value at which the processing signal is transited in level is set in the selection controller 76. The selection controller 76 outputs the selection instructing signal for selecting one of the first to M-th pulses to the selection circuit 75 on the basis of the set value.

The waveform shaping circuit 79 receives the first pulse $PLS_1$ output from the counter circuit 74 and one of the second to M-th pulses output from the selection circuit 75 and outputs a shaped waveform (synthesized waveform) on the basis of the waveforms of the received pulses. The waveform shaping circuit 79 can process the input pulses, typically includes an AND circuit or an OR circuit, and can adjust the rising or falling timing of the first pulse with the precision integer times as fine as T.

Figure 36:
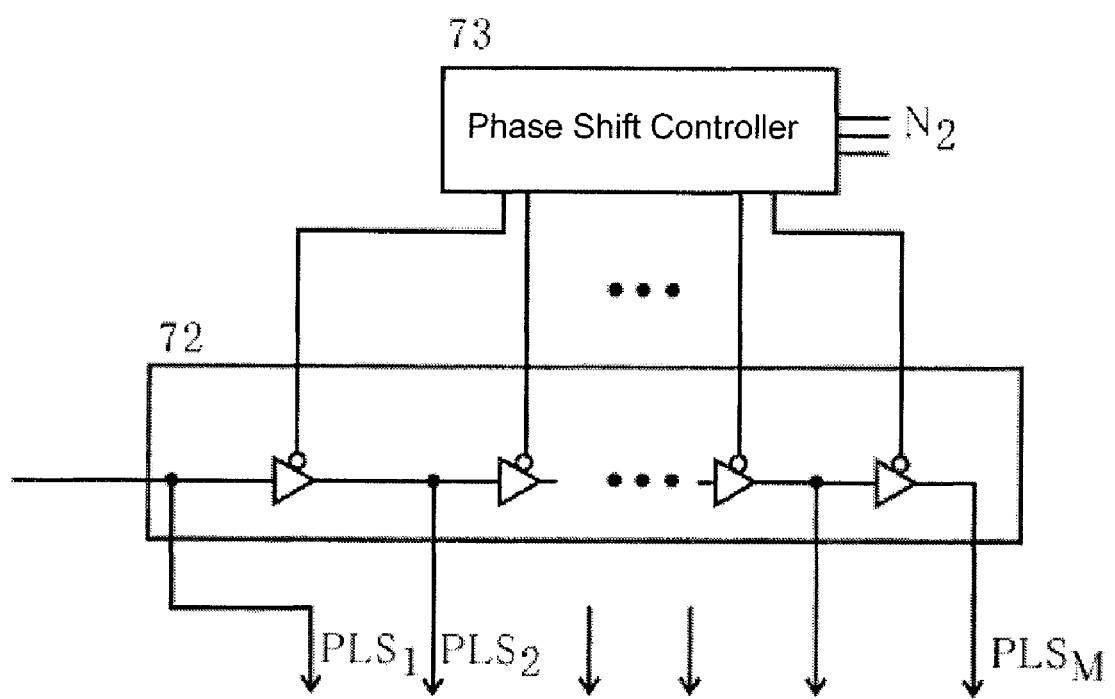
FIG. 36 is a diagram illustrating an example of a phase shift circuit in which delay elements or delay circuits are directly connected.

In the timing signal generating circuits shown in FIGS. 30, 32, and 33, the delay elements or the delay circuits having different delay times are connected in parallel as the phase shift circuit. However, as shown in FIG. 36, the delay elements or the delay circuits having the same delay time T may be connected in series and the delay signals of the delay times T, 2T, . . . , and (M−1)T may be acquired from the connection terminals.

In the timing signal generating circuits shown in FIGS. 27 to 33, the constituent elements can be properly used in common or the timing signal generating circuits can be combined. An example thereof is shown in FIGS. 37 and 38.

Figure 37:
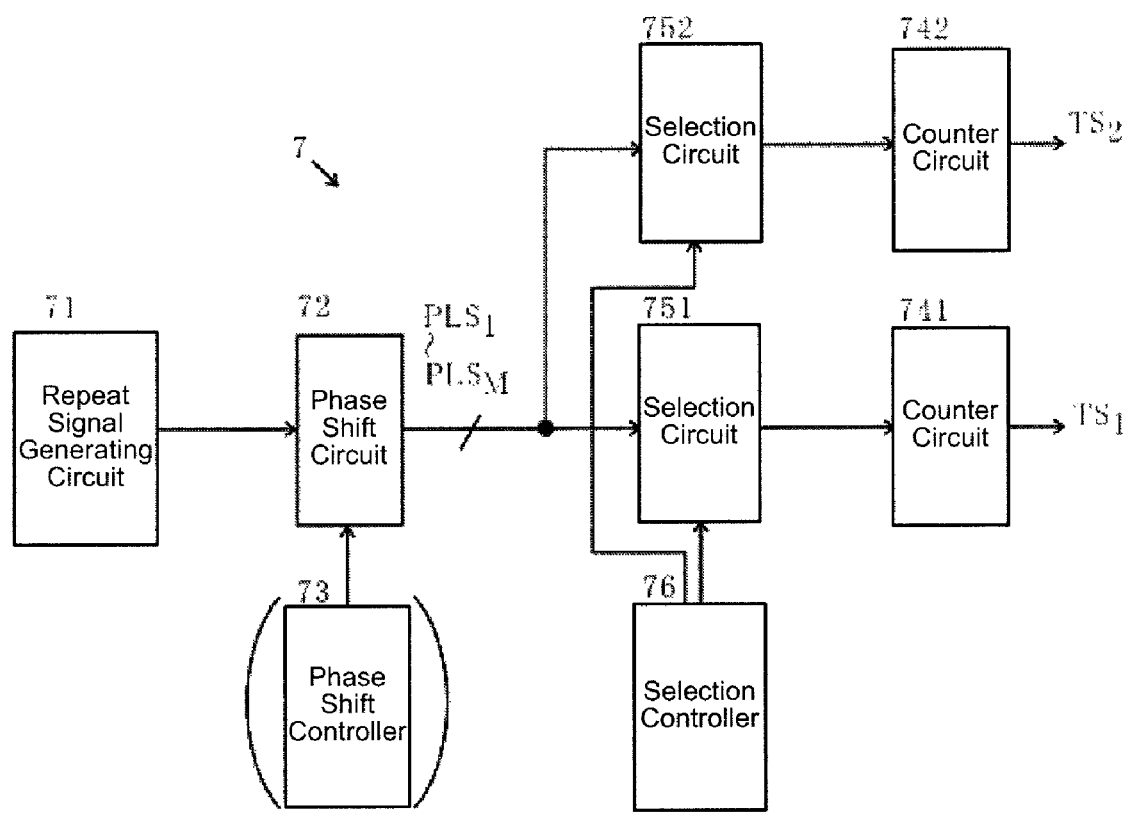
FIG. 37 is a diagram illustrating a modified example of the circuit shown in FIG. 27.

FIG. 37 is a diagram illustrating a modified example of the circuit shown in FIG. 27. In the timing signal generating circuit 7 shown in FIG. 37, a group of a selection circuit 751 and a counter circuit 741 and a group of a selection circuit 752 and a counter circuit 742 are connected to the back stage of the phase shift circuit 72 (including the phase shift controller 73), and the selection circuit 751 and the selection circuit 752 are controlled by a single selection controller 76. In FIG. 37, the repeat signal generating circuit 71 is shared by two groups, a timing signal $TS_1$ is output from the counter circuit 741, and a timing signal $TS_2$ is output from the counter circuit 742.

Figure 38:
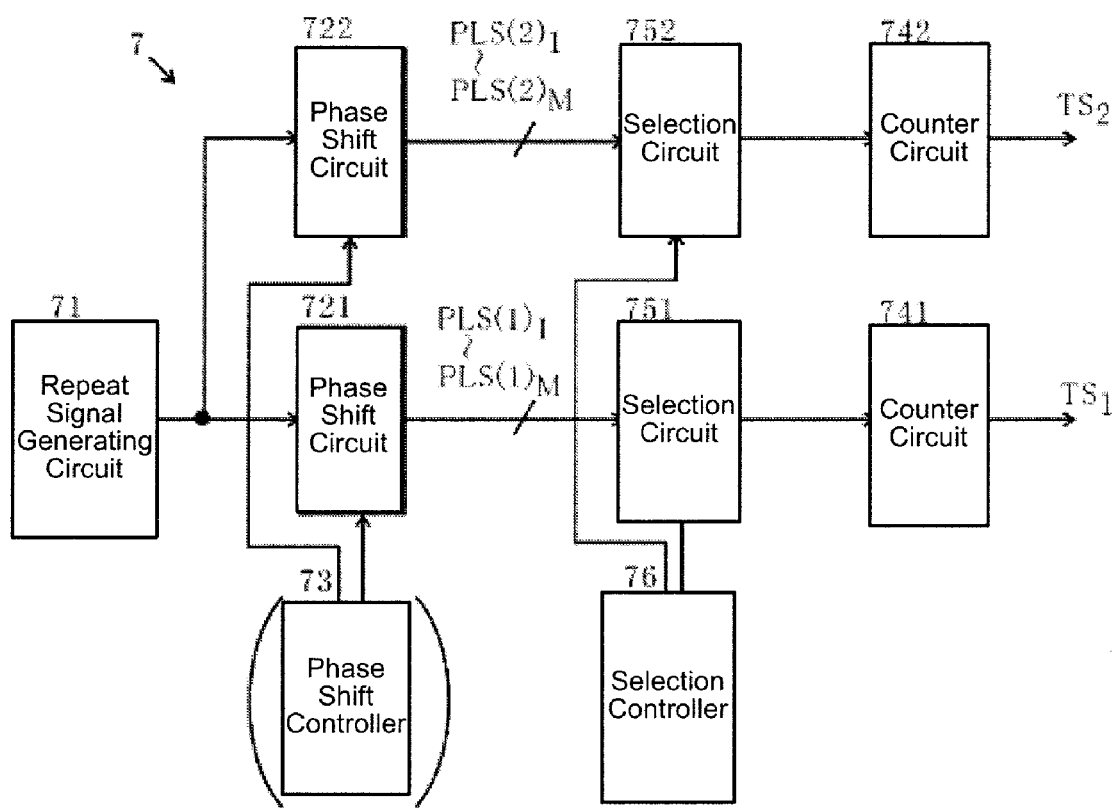
FIG. 38 is a diagram illustrating another modified example of the circuit shown in FIG. 27.

FIG. 38 is a diagram illustrating another modified example of the circuit shown in FIG. 27. In the timing signal generating circuit 7 shown in FIG. 38, a group of a phase shift circuit 721, a selection circuit 751, and a counter circuit 741 and a group of a phase shift circuit 722, a selection circuit 752, and a counter circuit 742 are connected to the back stage of the repeat signal generating circuit 71, the selection circuit 751 and the selection circuit 752 are controlled by a single selection controller 76, the phase shift circuit 721 and the phase shift circuit 722 are controlled by a single phase shift controller 73.

In FIG. 38, the repeat signal generating circuit 71 is shared by two groups, a timing signal $TS_1$ is output from the counter circuit 741, and a timing signal $TS_2$ is output from the counter circuit 742. In FIG. 38, the outputs of the phase shift circuit 721 are represented by $PLS(1)_1$, $PLS(1)_2$, . . . , and $PLS(1)_M$ and the outputs of the phase shift circuit 722 are presented by $PLS(2)_1$, $PLS(2)_2$, . . . , and $PLS(2)_M$.

Figure 39:
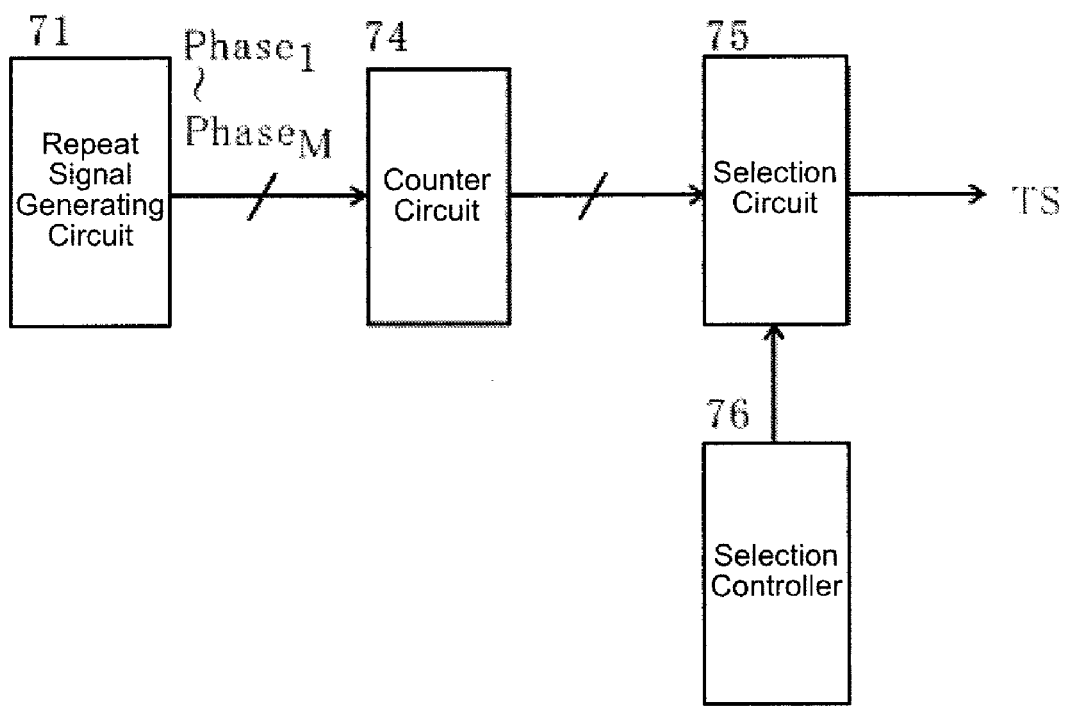
FIG. 39 is a diagram illustrating an example of the timing signal generating circuit in which the repeat signal generating circuit generates signals with plural phases.
Figure 40:
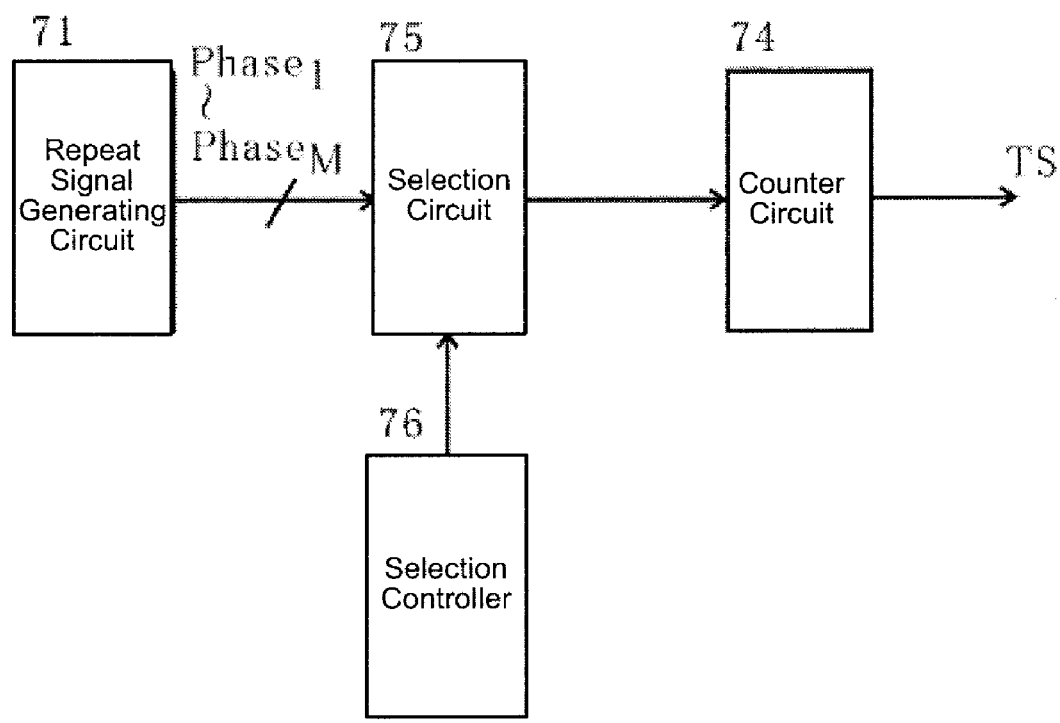
FIG. 40 is a diagram illustrating another example of the timing signal generating circuit in which the repeat signal generating circuit generates signals with plural phases.

FIGS. 39 and 40 are diagrams illustrating a configuration of the timing signal generating circuit in which the repeat signal generating circuit generates plural phases of signals.

The timing signal generating circuit shown in FIG. 39 includes a repeat signal generating circuit 71, a counter circuit 74, a selection circuit 75, and a selection controller 76. The repeat signal generating circuit 71 outputs plural signals $Phase_1$, $Phase_2$, . . . , and $Phase_M$ of which the phases are shifted by a predetermined quantity (including a zero shift quantity). The counter circuit 74 includes plural counter circuit elements set to a value corresponding to the upper cipher $N_1$ of the timing value but not shown. The plural counter circuit elements perform a counting operation until the count value reaches the set value and output the count end signal. The selection circuit 75 selects the count end signals from the plural counter circuit elements on the basis of the value corresponding to the lower cipher $N_2$ and outputs the selected signal as a timing signal TS corresponding to the value $N_1N_2$ obtained by combining the value $N_1$ corresponding to the upper cipher and the value $N_2$ corresponding to the lower cipher. The selection controller 76 outputs a selection instructing signal to the selection circuit 75 to make such a selection.

The timing signal generating circuit shown in FIG. 40 includes a repeat signal generating circuit 71, a selection circuit 75, a selection controller 76, and a counter circuit 74. The repeat signal generating circuit 71 outputs plural signals of which the phases are shifted by a predetermined quantity (including a zero shift quantity). The selection circuit 75 selects a signal being shifted in phase and being output from the repeat signal generating circuit 71 on the basis of the value of the lower cipher $N_2$ of the timing value.

The counter circuit 74 counts the outputs of the selection circuit 75 and outputs the count end signal as a timing signal TS corresponding to the value $N_1N_2$ obtained by combining the value $N_1$ corresponding to the upper cipher and the value $N_2$ corresponding to the lower cipher when the count value reaches the set value. The selection controller 76 outputs a selection instructing signal to the selection circuit 75 to make such a selection.

Figure 41:
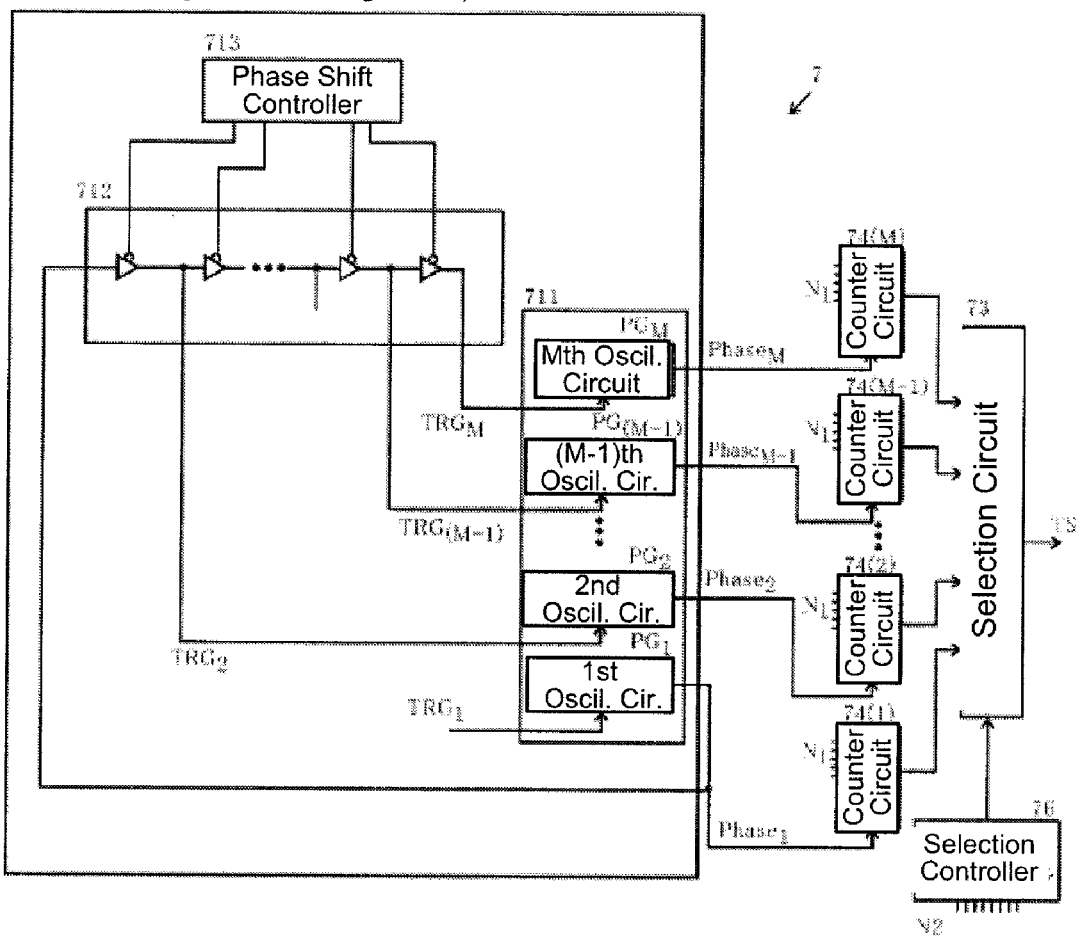
FIG. 41 is a circuit diagram illustrating a specific example of the timing signal generating circuit shown in FIG. 39.

FIG. 41 is a circuit diagram illustrating a specific example of the timing signal generating circuit shown in FIG. 39. In FIG. 41, the repeat signal generating circuit 71 includes an oscillation circuit group 711 including a first oscillation circuit $PG_1$ to an M-th oscillation circuit $PG_M$ outputting plural signals $Phase_1$, $Phase_2$, . . . , and $Phase_M$, a phase shift circuit 712, and a shift controller 713. In the repeat signal generating circuit 71, when a driving signal $TRG_1$ is input to the first oscillation circuit $PG_1$ and the first oscillation circuit $PG_1$ outputs $Phase_1$, the phase shift circuit 712 outputs the driving signals $TRG_2$, $TRG_3$, . . . , and $TRG_M$ to the second oscillation circuit $PG_2$, the third oscillation circuit $PG_3$, . . . , and the M-th oscillation circuit $PG_M$, and the second oscillation circuit $PG_2$, the third oscillation circuit $PG_3$, . . . , and the M-th oscillation circuit $PG_M$ sequentially output $Phase_2$, $Phase_3$, . . . , and $Phase_M$. The counter circuits 74(1), 74(2), . . . , and 74(M) count $Phase_1$, $Phase_2$, . . . , and $Phase_M$ until the count value reaches the upper cipher $N_2$ and output the count end signals.

Figure 42:
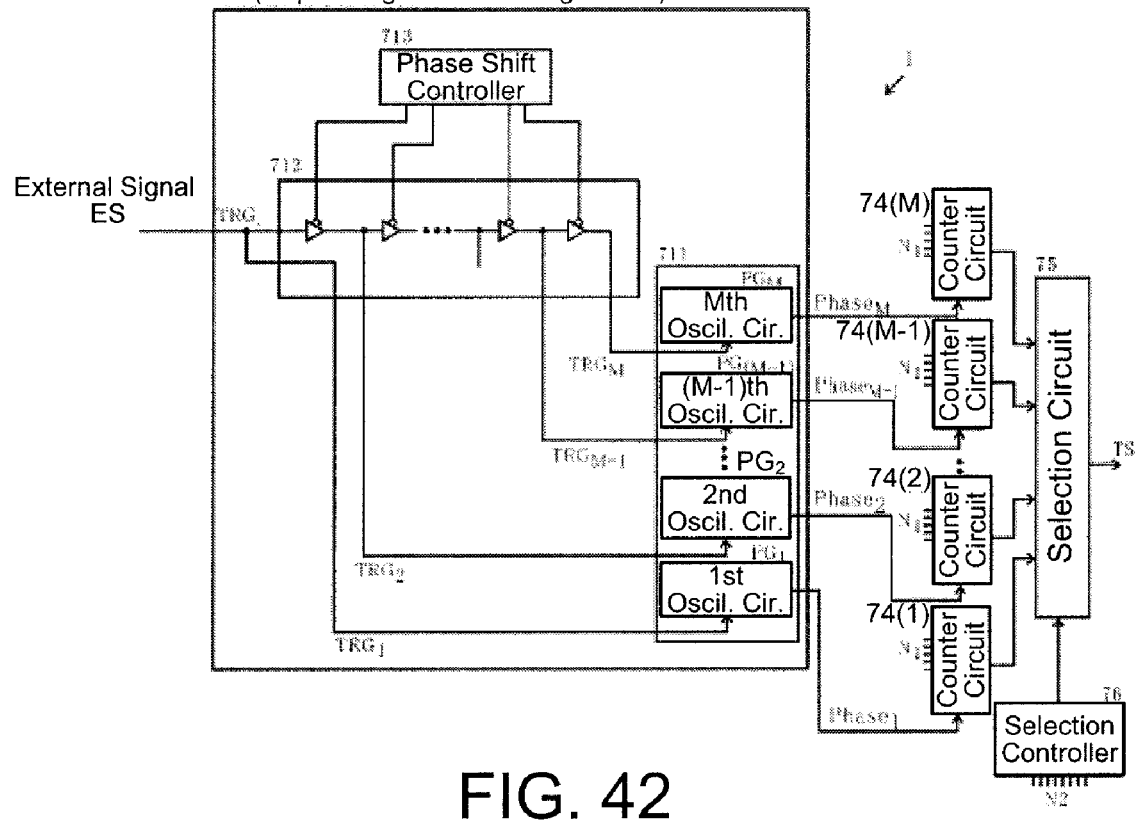
FIG. 42 is a circuit diagram illustrating another specific example of the timing signal generating circuit shown in FIG. 39.

FIG. 42 is a circuit diagram illustrating another specific example of the timing signal generating circuit shown in FIG. 39. In FIG. 42, an external signal ES is used as the driving signal $TRG_1$ of the first oscillation circuit $PG_1$ and inputs the external signal ES to the phase shift circuit 712 to generate the driving signals $TRG_2, TRG_3, \ldots,$ and $TRG_M$.

Figure 43:
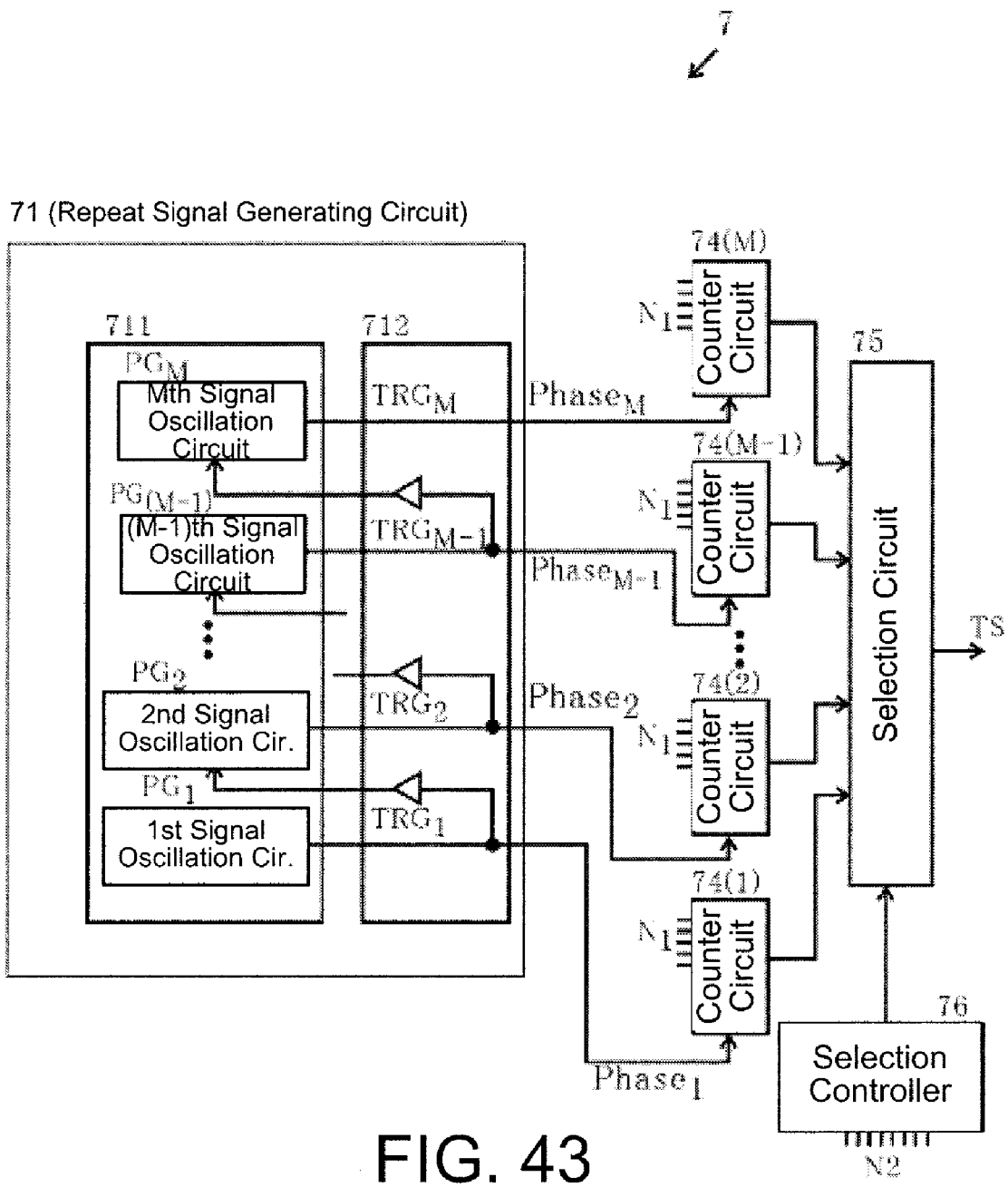
FIG. 43 is a circuit diagram illustrating another specific example of the timing signal generating circuit shown in FIG. 39.

FIG. 43 is a circuit diagram illustrating another specific example of the timing signal generating circuit shown in FIG. 39. In FIG. 43, the output of the first oscillation circuit $PG_1$ is delayed by the delay elements or the delay circuits to generate a driving signal $TRG_2$ and to drive the second oscillation circuit $PG_2$ and the output of the second oscillation circuit $PG_2$ is delayed to generate a driving signal $TRG_3$ and to drive the third oscillation circuit $PG_3$. The fourth oscillation circuit $PG_4$ to the M-th oscillation circuit $PG_M$ are driven in the same way. In FIG. 43, the delay elements or the delay circuits on the output sides of the first oscillation circuit $PG_1$ to the (M−1)-th oscillation circuit $PG_{M-1}$ constitute the phase shift circuit 712.

Figure 44:
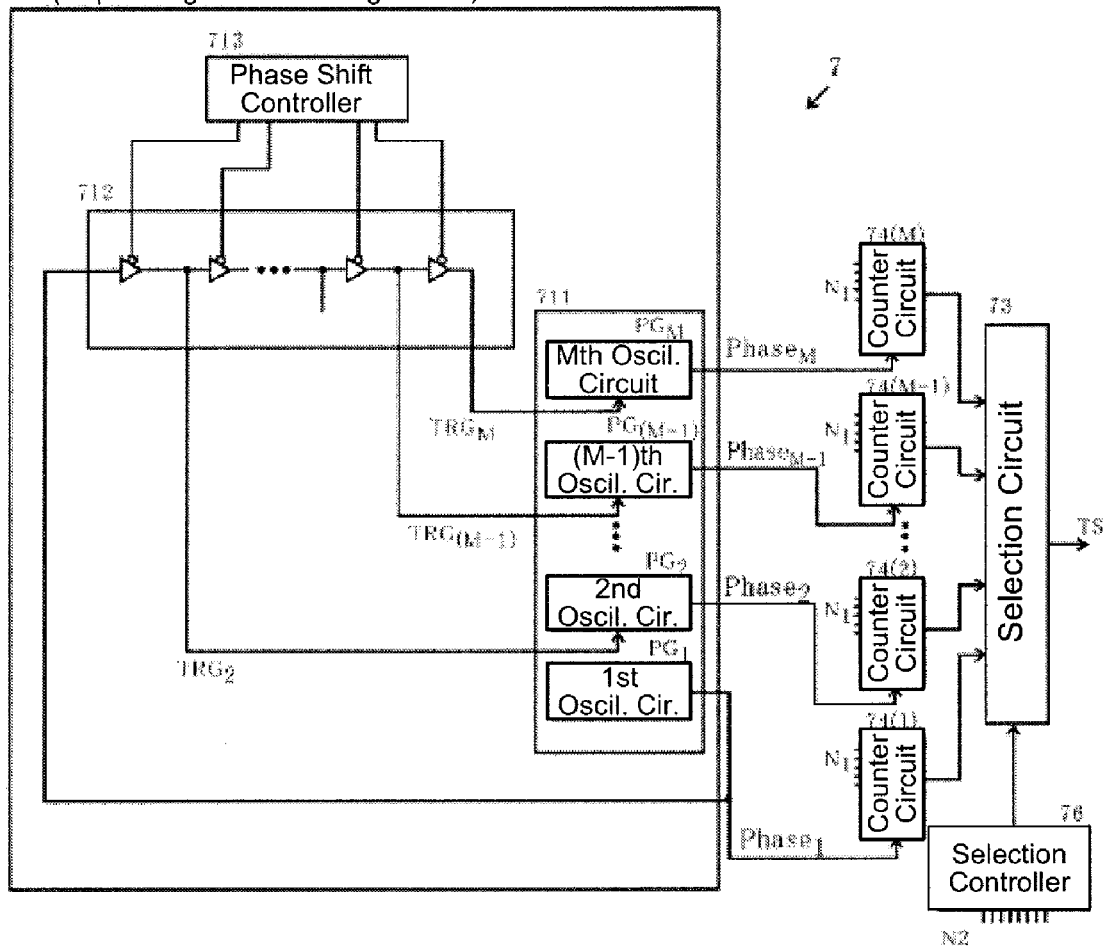
FIG. 44 is a circuit diagram illustrating another specific example of the timing signal generating circuit shown in FIG. 39.

FIG. 44 is a circuit diagram illustrating another specific example of the timing signal generating circuit shown in FIG. 39. In FIG. 44, the phase shift circuit 712 is driven by the output of the first oscillation circuit $PG_1$ instead of the external signal.

Figure 45:
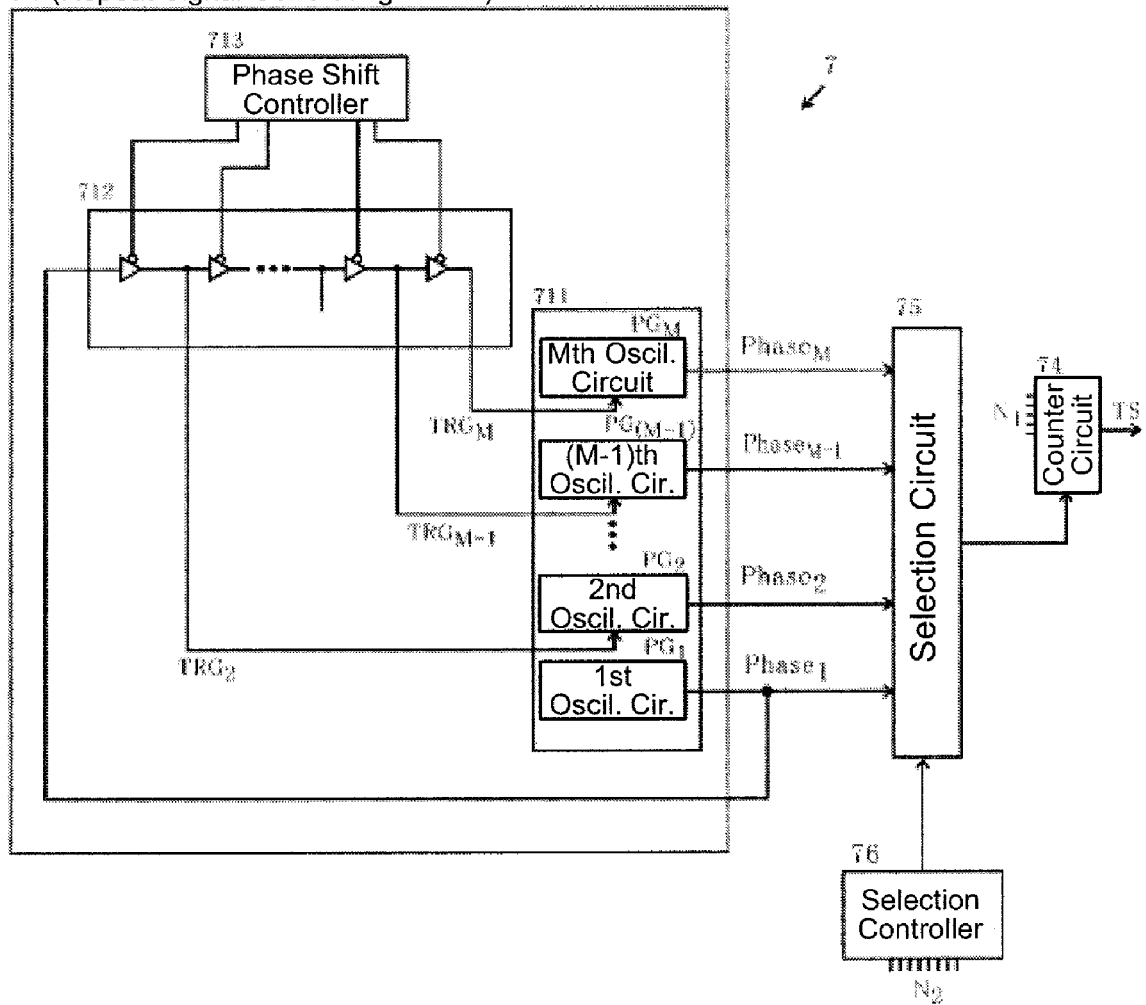
FIG. 45 is a circuit diagram specifically illustrating the timing signal generating circuit shown in FIG. 40.

FIG. 45 is a circuit diagram illustrating a specific example of the timing signal generating circuit shown in FIG. 40. In FIG. 45, the output signals of the repeat signal generating circuit 71 (the output signals $Phase_1, Phase_2, \ldots,$ and $Phase_M$ of the oscillation circuit 711) are output to the selection circuit 75. The selection circuit 75 selects a signal corresponding to the lower cipher $N_2$ of the timing value and outputs the selected signal to the counter circuit 74. Since the value of the upper cipher $N_1$ is set in the counter circuit 74, the counter circuit 74 outputs the timing signal TS corresponding to a value $N_1N_2$ obtained by combining the value corresponding to the upper cipher $N_1$ and the value corresponding to the lower cipher $N_2$ by outputting the count end signal.

The output of the first oscillation circuit $PG_1$ is input to the phase shift circuit 51 to generate the driving timings of the second oscillation $PG_2$ to the M-th oscillation circuit $PG_M$. However, an external signal may be input to the phase shift circuit 51 to generate the driving timings of the first oscillation circuit $PG_1$ to the M-th oscillation circuit $PG_M$ or the second oscillation circuit $PG_2$ may be driven by the use of the output of the first oscillation circuit $PG_1$, the third oscillation circuit $PG_3$ may be driven by the use of the second oscillation circuit $PG_2$, and a next-stage oscillation circuit may be sequentially driven by the use of the output of the front-stage oscillation circuit.

The delay circuits may have individual configurations. For example, an integration circuit, a gate element, a monostable multi-vibrator, or the like may be used as the delay circuit. A circuit not changing the delay time may be used as the delay circuit or it may be configured to be programmable as shown in FIGS. 46 to 49. In the delay circuits shown in FIGS. 46 to 49, a lot of delay times can be generated by weighting the delay times of the delay circuit elements (the delay elements or the delay circuits) and switching and combining the delay times by the use of switches (semiconductor switches).

When a delay circuit group including a serial connection of the delay elements or a serial connection of the delay circuits is used as the delay circuit, it may be difficult to equalize the characteristics of the delay circuit groups but it is possible to construct a delay circuit having a small error by employing the following delay circuit.

Figure 46:
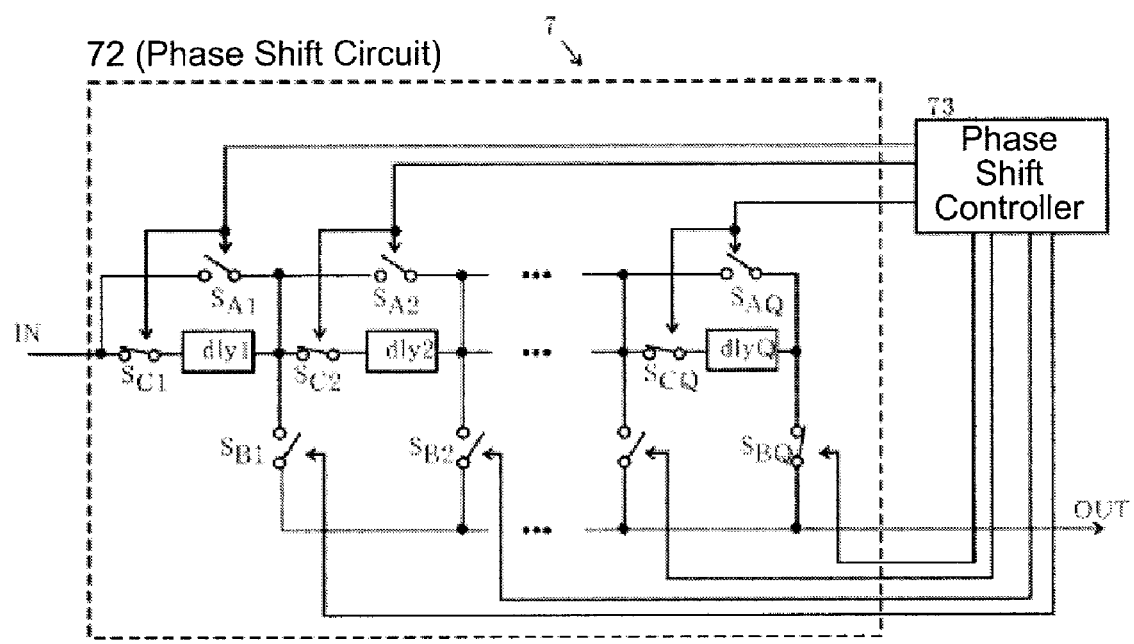
FIG. 46 is a diagram illustrating a specific example of a delay circuit.

In FIG. 46, the delay circuit 70 includes a phase shift circuit 72 and a phase shift controller 73. The delay circuit 70 may include (a) a serial-connection circuit group (represented by $dly_1$ to $dly_Q$ in FIG. 46) including Y−1 first delay circuits with a delay time $T \cdot Y^0$, Y−1 second delay circuits with a delay time of $T \cdot Y^1, \ldots,$ and Y−1 P-th delay circuits with a delay time of $T \cdot Y^{P-1}$, (b) a bypass switch group (represented by $S_{A1}, S_{A2}, \ldots,$ and $S_{AQ}$ in FIG. 46) including Y−1 first bypass switches connected between both terminals of the first delay circuits, Y−1 second bypass switches connected between both terminals of the second delay circuits, $\ldots,$ and Y−1 P-th bypass switches connected between both terminals of the P-th delay circuits, and (c) an output switch group (represented by $S_{B1}, S_{B2}, \ldots,$ and $S_{BQ}$ in FIG. 46) including Y−1 first output switches connected between a terminal apart from a signal input side of the first delay circuits and a signal output terminal, Y−1 second output switches connected between a terminal apart from a signal input side of the second delay circuits and a signal output terminal, $\ldots,$ and Y−1 P-th output switches connected between a terminal apart from a signal input side of the P-th delay circuits and a signal output terminal.

In this case, short-circuit preventing switches $S_{C1}, S_{C2}, \ldots,$ and $S_{CQ}$ being turned on or off in synchronization with the bypass switches $S_{A1}, S_{A2}, \ldots,$ and $S_{AQ}$ of the delay circuits can be connected in series to the delay circuits $dly_1$ to $dly_Q$. The short-circuit prevent switch $S_{Ck}$ (where k=1, 2, $\ldots,$ and Q) is turned off when the bypass switch $S_{Ak}$ (where k=1, 2, $\ldots,$ and Q) is turned on, and is turned on when the bypass switch $S_{Ak}$ (where k=1, 2, $\ldots,$ and Q) is turned off.

When Y=5, a circuit generating delay times of T to 124T can be configured, for example, by the serial-connection delay circuit group of the delay circuits with four delay times $T \cdot 5^0$, four delay times $T \cdot 5^1$, and four delay times $T \cdot 5^2$.

Figure 47:
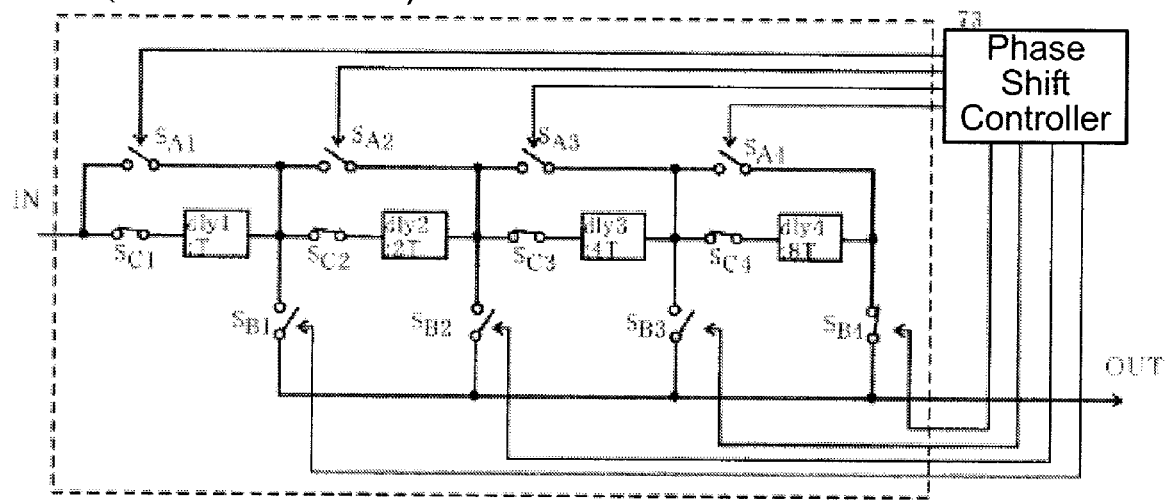
FIG. 47 is a diagram illustrating another specific example of the delay circuit.

FIG. 47 is a diagram illustrating the delay circuit with Y=2. In FIG. 47, the delay circuit 70 includes a phase shift circuit 72 and a phase shift controller 73. The phase shift circuit 72 includes Q delay circuits $dly_1$ to $dly_Q$ and switch groups $S_{A1}$ to $S_{AQ}$ and $S_{B1}$ to $S_{BQ}$ and the delay circuits $dly_1$ to $dly_Q$ can generate the delay times of $2^0 \cdot T, 2^1 \cdot T, \ldots,$ and $2^{M-1} \cdot T$. The phase shift controller 73 controls the turning-on or off of the switch groups $S_{A1}$ to $S_{AQ}$ and $S_{B1}$ to $S_{BQ}$ to combine the switches and to generate the delay times of 0, T, 2T, $\ldots,$ and $2^{M-1}T$.

That is, when Y=2, the number of delay circuits with the same delay time need not be two or more, the delay circuit can generate the maximum delay time of 15T, and an advantage similar to that when 15 delay circuits with the delay time T are connected in series can be obtained. Similarly, an advantage similar to that when 1023 delay circuits in maximum are connected in series can be obtained using 10 delay circuits.

Figure 48:
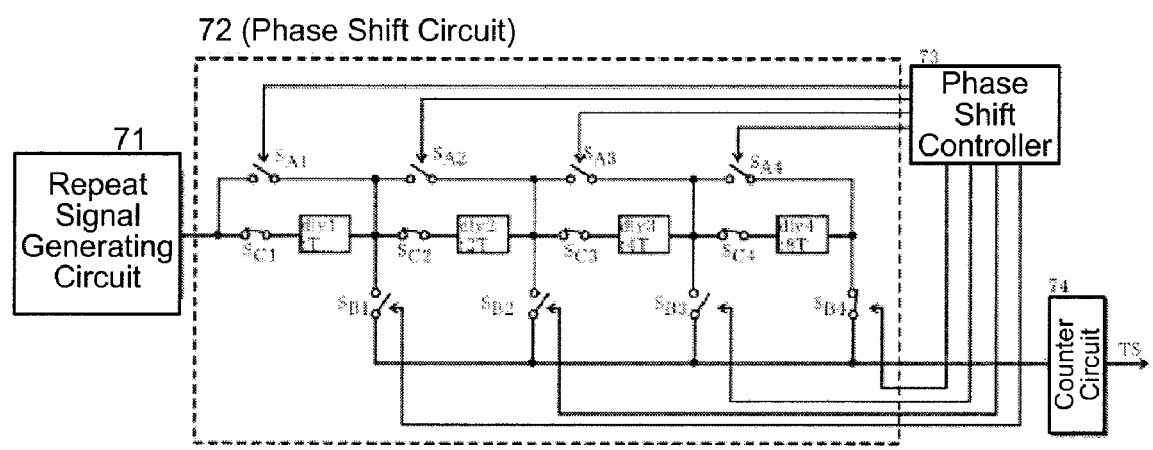
FIG. 48 is a diagram illustrating an example of a phase shift circuit employing the circuit shown in FIG. 46.

FIG. 48 is a diagram illustrating an example of the timing signal generating circuit employing the circuit shown in FIG. 47. In FIG. 48, the repeat signal generating circuit 71 is disposed at a previous stage of the phase shift circuit 72 and the counter circuit 74 is disposed at a subsequent stage of the phase shift circuit 72.

FIG. 49 is a diagram illustrating a relation between the delay times of the signals output from the timing signal generating circuit and the ON/OFF statuses of the switch groups $S_{A1}$ to $S_{AQ}$ and $S_{B1}$ to $S_{BQ}$ of the phase shift circuit 72. When the delay time due to the switches cannot be neglected, it is possible to weight the delay time in consideration of the delay time.

The timing signal generating circuit according to the invention can be replaced with the configurations of (18) to (27).

(18) A timing signal generating circuit generating predetermined timings (such as period, ON time, OFF time, duty ratio, dead time, and ratio of dead time to period) of a processing signal, for example, a timing signal generating circuit accurately generating a level-transition timing signal of a processing signal which is transited by two levels or more in one period, comprising (A) a periodic signal generating circuit outputting a first periodic signal, a second periodic signal having a frequency higher than that of the first periodic signal, . . . , and an M-th periodic signal having a frequency higher than that of the (M−1)-th periodic signal (where M is an integer of 2 or greater), (B) a counter circuit group including a first counter circuit counting the first periodic signal, a second counter circuit counting the second periodic signal, . . . , an M-th counter circuit counting the M-th periodic signal, (C) a setting device distributing a predetermined timing value to a time axis, expressing the values of the predetermined timing value distributed to the time axis by the number of periods $N_1$ of the first periodic signal, the number of periods $N_2$ of the second periodic signal, . . . , and the number of periods $N_M$ of the M-th periodic signal, setting the number of periods $N_1$ of the first periodic signal in the first counter circuit, setting the number of periods $N_2$ of the second periodic signal in the second counter circuit, . . . , and setting the number of periods $N_M$ of the M-th periodic signal, and (D) a timing signal generating circuit generating timing signals on the basis of end signals when the counting operations of the first counter circuit to the M-th counter circuit are ended.

(19) The timing signal generating circuit according to (18), wherein the timing signal generating circuit includes a signal selecting circuit.

(20) The timing signal generating circuit according to (18) or (19), wherein the processing signal is a pulse signal of which the pulse width is modulated or an output pulse signal of a voltage-controlled oscillator.

(21) The timing signal generating circuit according to any one of (18) to (20), wherein the periodic signal generating circuit includes a first frequency signal generating circuit to an M-th frequency signal generating circuit.

(22) The timing signal generating circuit according to (21), further comprising a frequency controller activating only one of the first frequency signal generating circuit to the M-th frequency signal generating circuit at the time of starting the counting, activating the frequency signal generating circuit not activated yet when the counting of the periodic signals output from the activated frequency signal generating circuit is ended by a predetermined counter circuit, and activating the frequency signal generating circuit not activated yet when the counting of the periodic signals output sequentially from the activated frequency signal generating circuits is ended by a predetermined counter circuit, a signal selecting circuit selecting a count end signal (signal output at the time of ending the counting-up or the counting-down) output from the counter circuit corresponding to the finally activated frequency signal generating circuit at the time of ending the counting and outputting the selected count end signal as a timing signal, and a signal selection controller controlling the signal selecting circuit to select the count end signal.

(23) The timing signal generating circuit according to any one of (18) to (22), wherein the periodic signal generating circuit includes a variable frequency oscillation circuit and outputs the first periodic signal to the M-th periodic signal.

(24) A timing signal generating circuit in which plural units of the timing signal generating circuit according to any one of (18) to (23) are connected in series, wherein the minimum frequency of the periodic signal of the subsequent-stage unit is higher than the maximum frequency of the periodic signal generating circuit of the previous-stage unit.

(25) The timing signal generating circuit according to any one of (18) to (24), wherein the subsequent stage of the counter circuit is provided with a phase shift circuit shifting a phase by a predetermined quantity in one period of the signal of the maximum frequency among the frequencies generated from the periodic signal generating circuit, and a phase shift controller selecting the phase to be output from the phase shift circuit.

(26) The timing signal generating circuit according to any one of (18) to (25), wherein the subsequent stage of the counter circuit is provided with a phase shift circuit shifting a phase by a quantity smaller than one period of the signal of the maximum frequency among the frequencies generated from the periodic signal generating circuit, and a phase shift controller selecting a phase of the signal to be output from the phase shift circuit.

(27) The timing signal generating circuit according to any one of (18) to (25), further comprising:

a phase shift circuit group including a first phase shift circuit shifting a phase by a width smaller than one period of the first periodic signal and greater than the periods of the other periodic signals and being disposed at the subsequent stage of the first counter circuit, a second phase shift circuit shifting a phase by a width smaller than one period of the second periodic signal and greater than the periods of the other periodic signal and being disposed at the subsequent stage of the second counter-circuit, . . . , and an M-th phase shift circuit shifting a phase by a width smaller than one period of the M-th periodic signal and greater than the periods of the other periodic signals and being disposed at the subsequent stage of the M-th counter circuit; and a phase shift controller selecting a phase of the signal to be output from the phase shift circuits.

In the timing signal generating circuits, it is possible to accurately generate a level-transition timing signal of a processing signal, which has a constant period or a varying period and is transited by at least two levels in one period, at a fine timing. Particularly, in the oscillation circuit (periodic signal generating circuit) provided to a PWM device or a VCO, it is possible to accurately set the width of the ON/OFF time of the periodic signals at fine timings. That is, in the timing signal generating circuits, even when an oscillator of which the main clock is several tens MHz is used, it is possible to finely and accurately generate the timing signals (signals for determining the transition timing of a processing signal) by only operating partially the clock of several tens to several hundreds GHz and it is possible to provide a PWM having a control device with low power consumption or a VCO having a control device with low power consumption.

In the timing signal generating circuits, since the frequency controller can deactivate the frequency signal generating circuits of which the counting is not started, it is possible to further reduce the power consumption.

Figure 50:
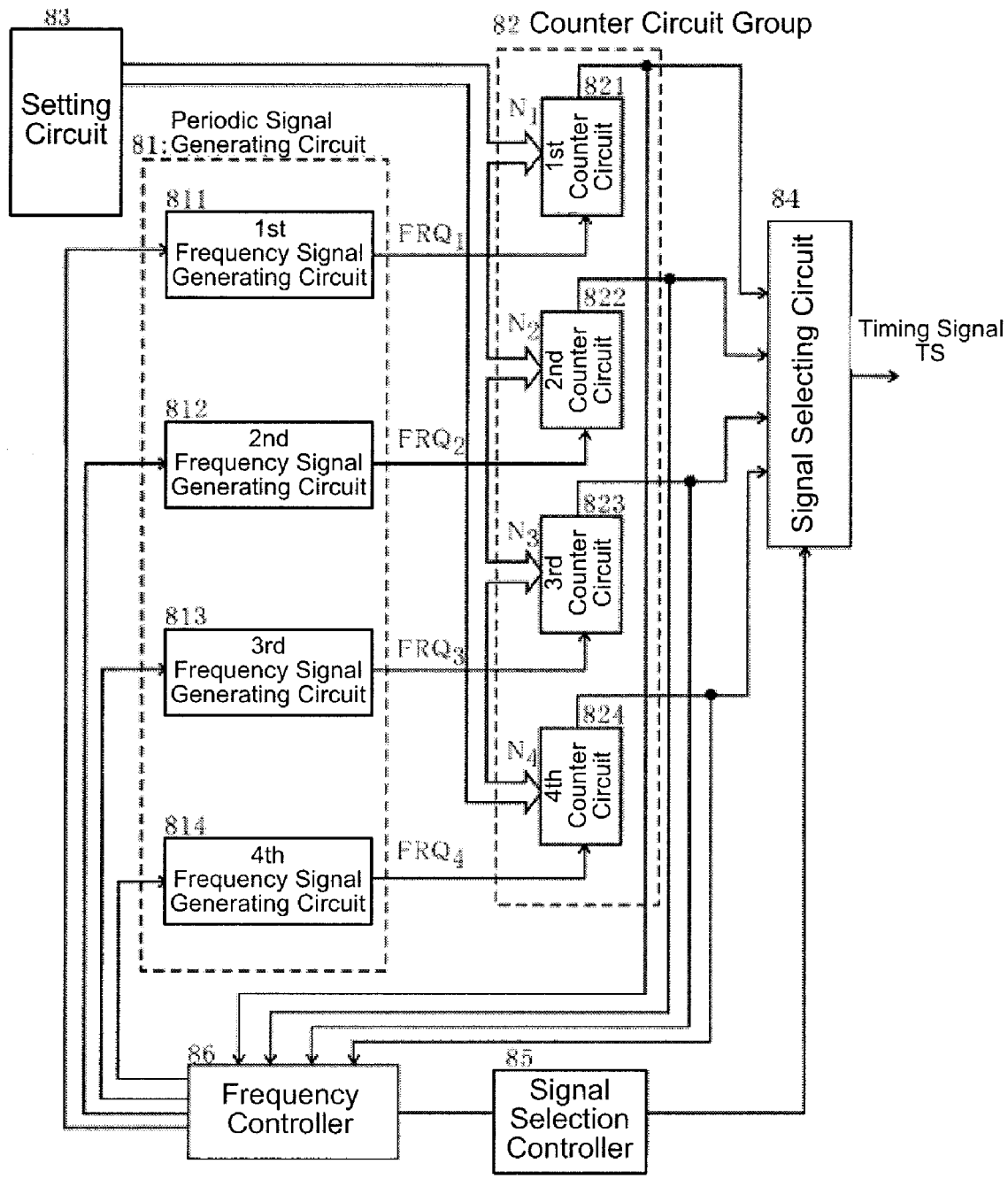
FIG. 50 is a diagram illustrating an example of the timing signal generating circuit according to the invention.

FIG. 50 is a diagram illustrating an example of the timing signal generating circuit. In FIG. 50, the timing signal generating circuit 8 generates a level-transition timing signal of a processing signal having a constant or varying period and being transited by two or more levels in one period. Specifically, the processing signal is a pulse signal of which the pulse width is modulated (PWM) or an output pulse signal of the voltage-controlled oscillator VCO.

The timing signal generating circuit 8 includes a periodic signal generating circuit 81, a counter circuit group 82, a frequency controller 86, a signal selecting circuit (corresponding to the timing signal generating circuit of the invention), and a signal selection controller 85.

The periodic signal generating circuit 81 includes a first frequency signal generating circuit 811 generating a first periodic signal $FRG_1$, a second frequency signal generating circuit 812 generating a second periodic signal $FRG_2$, a third frequency signal generating circuit 813 generating a third periodic signal $FRG_3$, and a fourth frequency signal generating circuit 814 generating a fourth periodic signal $FRG_4$. The second periodic signal $FRG_2$ is higher in frequency than the first periodic signal $FRG_1$, the third periodic signal $FRG_3$ is higher in frequency than the second periodic signal $FRG_2$, the fourth periodic signal $FRG_4$ is higher in frequency than the third periodic signal $FRG_3$, and the first periodic signal $FRG_1$, the second periodic signal $FRG_2$, the third periodic signal $FRG_3$, and the fourth periodic signal $FRG_4$ are output through different lines.

The counter circuit group 82 includes a first counter circuit 821 counting the first periodic signal $FRG_1$, a second counter circuit 822 counting the second periodic signal $FRG_2$, a third counter circuit 823 counting the third periodic signal $FRG_3$, and a fourth counter circuit 824 counting the fourth periodic signal $FRG_4$. The timing values (timing value A) at which the processing signal is transited in level are assigned and set to the counter circuits by the setting circuit 83. In this example, $N_1$ is set in the first counter circuit 821, $N_2$ is set in the second counter circuit 822, $N_3$ is set in the third counter circuit 823, and $N_4$ is set in the fourth counter circuit 824.

In this example, the frequency controller 86 activates only the first frequency signal generating circuit 811 (deactivates the other frequency signal generating circuits) at the time of starting its counting, and activates the second frequency signal generating circuit 812 when the counting of the first periodic signal $FRG_1$ output from the first frequency signal generating circuit 811 is ended by the first counter circuit 821. The frequency controller activates the third frequency signal generating circuit 813 when the counting of the second periodic signal $FRG_2$ output from the second frequency signal generating circuit 812 is ended by the second counter circuit 822, and activates the fourth frequency signal generating circuit 814 when the counting of the third periodic signal $FRG_3$ output from the third frequency signal generating circuit 813 is ended by the third counter circuit 823.

In this example, the frequency controller 86 controls the frequency signal generating circuit 81, but may control the first frequency signal generating circuit 811, the second frequency signal generating circuit 812, the third frequency signal generating circuit 813, and the fourth frequency signal generating circuit 814 and may control the first counter circuit 821 to the fourth counter circuits 824 of the counter circuit group 82 to start their counting. For example, the first counter circuit 821 may be activated when the first frequency signal generating circuit 811 operates, the second counter circuit 822 may be activated when the second frequency signal generating circuit 812 operates, the third counter circuit 823 may be activated when the third frequency signal generating circuit 813 operates, and the fourth counter circuit 824 may be activated when the fourth frequency signal generating circuit 814 operates. The frequency controller 86 does not control the operation of the frequency signal generating circuit 81 (activates all the first frequency signal generating circuit 811, the second frequency signal generating circuit 821, the third frequency signal generating circuit 823, and the fourth frequency signal generating circuit 824), but may control the counter circuits 821 to 824 of the counter circuit group 82 to start their counting.

The signal selecting circuit 84 outputs the timing signal when receiving a signal output from the counter circuit (one of the first to fourth counter circuits) counting the finally activated frequency signal generating circuit at the time of ending the counting. When the frequency controller 86 does not control the operation of the frequency signal generating circuit 81 but controls the counter circuits 821 to 824 of the counter circuit group 82 to start their counting, the signal selecting circuit outputs a timing signal when receiving a signal output from the finally activated counter circuit (one of the first to fourth counter circuits).

In the example shown in FIG. 50, the finally activated frequency signal generating circuit is the first frequency signal generating circuit 811 when $N_2$, $N_3$, and $N_4$ are zero, is the second frequency signal generating circuit 812 when $N_2$ is not zero and $N_3$ and $N_4$ are zero, is the third frequency signal generating circuit 813 when $N_3$ is not zero and $N_4$ is zero, and is the fourth frequency signal generating circuit 814 when $N_4$ is not zero.

The signal selection controller 85 stores $N_1$, $N_2$, $N_3$, and $N_4$ in advance, controls the selection of the signal selecting circuit 84 on the basis of the $N_1$, $N_2$, $N_3$, and $N_4$, and allows the signal selecting circuit 84 to select a signal (timing signal TS) to be output when all the counting of the periodic signals are ended by the counter circuits 821 to 824.

Figure 51:
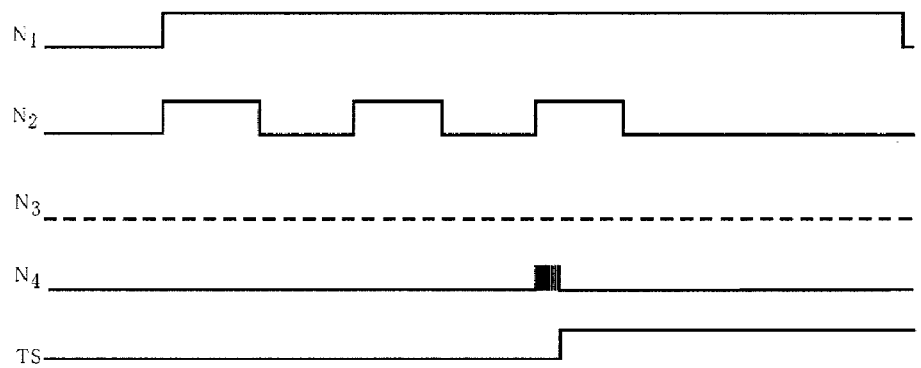
FIG. 51 is a timing diagram illustrating an operation of the timing signal generating circuit shown in FIG. 50.
Figure 52:
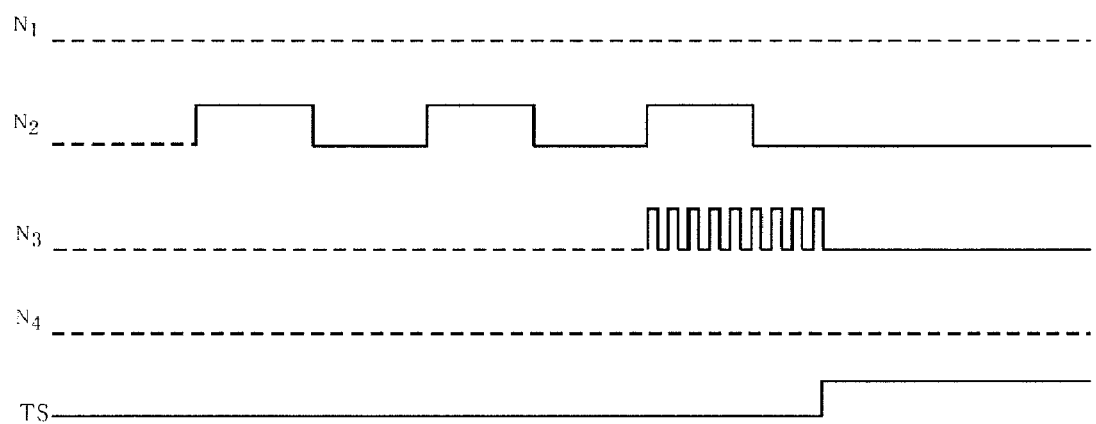
FIG. 52 is a timing diagram illustrating another operation of the timing signal generating circuit shown in FIG. 50.

FIGS. 51 and 52 are timing diagrams illustrating an example of the operation of the timing signal generating circuit 8 shown in FIG. 50. In FIG. 51, an example where $N_1$, $N_2$, and $N_4$ are not zero and $N_3$ is zero is shown. First, when the counting of $N_1$ is started by the first counter circuit 821 and the counting of $N_1$ is ended by the first counter circuit 821, the counting of $N_2$ is started by the second counter circuit 822. When the counting of $N_2$ is ended by the second counter circuit 822, the counting is not performed by the third counter circuit 823 but the counting of $N_4$ is started by the fourth counter circuit 824. When the counting of $N_4$ is ended by the fourth counter circuit 824, a count end signal is output from the fourth counter circuit 824 to the signal selecting circuit 84 and then the signal selecting circuit 84 outputs the timing signal TS.

FIG. 52 shows an example where $N_2$ and $N_3$ are not zero but $N_1$ and $N_4$ are zero. In this case, the counting of $N_1$ is not performed by the first counter circuit 821, but the counting of $N_2$ is first started by the second counter circuit 822. When the counting of $N_2$ is ended by the second counter circuit 822, the counting of $N_3$ is started by the third counter circuit 823. That is, when the counting of $N_3$ is ended by the third counter circuit 823, the counting operation is not performed by the fourth counter circuit 824, but the count end signal is output from the third counter circuit 823 to the signal selecting circuit 84 and then the signal selecting circuit 84 outputs the timing signal TS.

Figure 53:
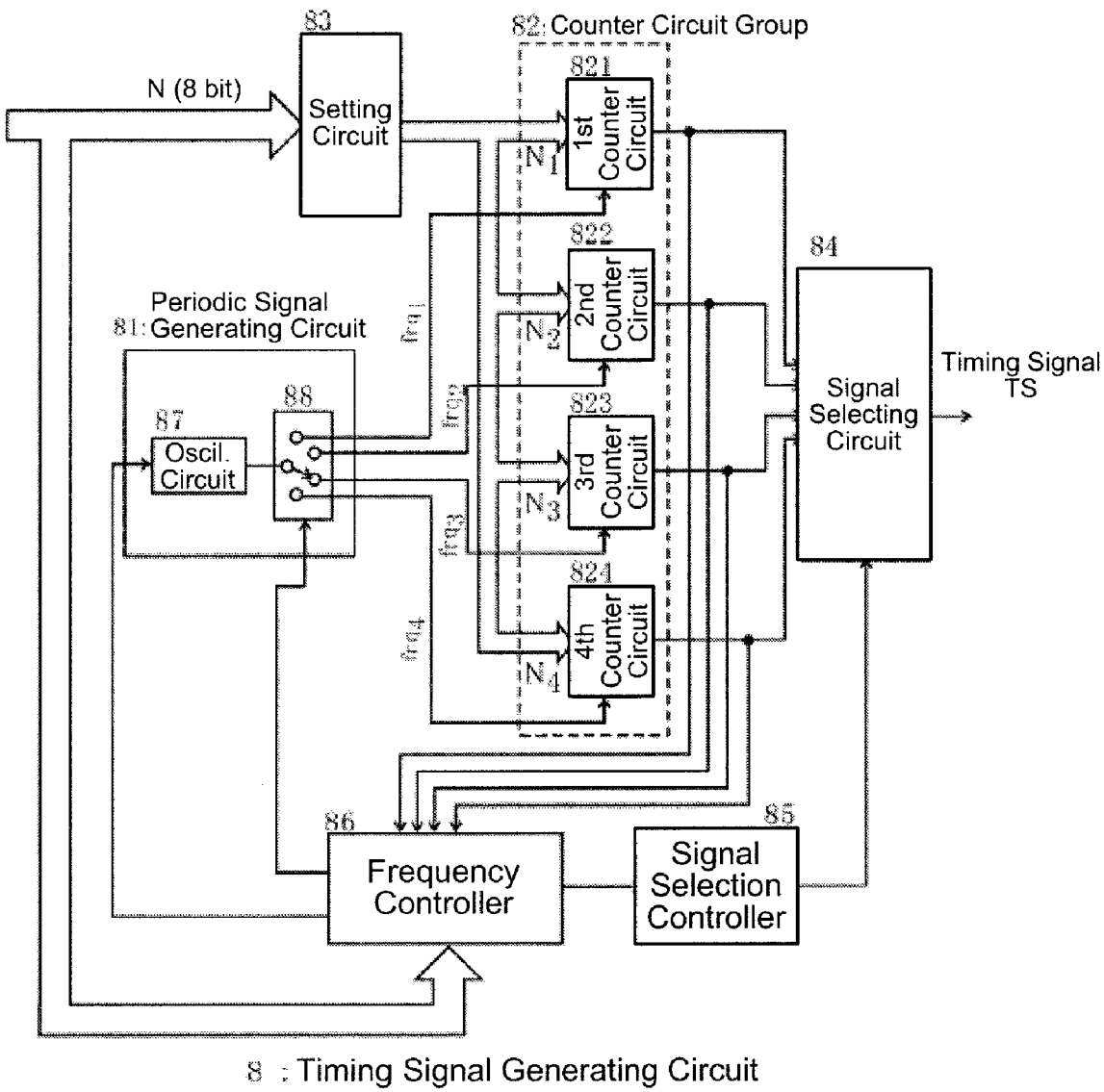
FIG. 53 is a diagram illustrating another example of the timing signal generating circuit according to the invention.

FIG. 53 is a diagram illustrating another example of the timing signal generating circuit according to the invention. In the timing signal generating circuit 8 shown in FIG. 50, the periodic signal generating circuit 81 includes plural frequency signal generating circuits, but the periodic signal generating circuit 81 of the timing signal generating circuit 8 according to this example includes a single oscillation circuit 87. The oscillation circuit 87 is a circuit generating four frequencies and a selection switch (multiplexer) 88 is disposed at the subsequent stage of the oscillation circuit 87, as shown in FIG. 53, in this example.

The frequency controller 86 sequentially outputs four frequencies $frq_1$, $frq_2$, $frq_3$, and $frq_4$ from the periodic signal generating circuit 81 (all the four frequencies may not be output) and the oscillation circuit 87 is connected to the first counter circuit 821 when the frequency is $frq_1$, the second counter circuit 822 when the frequency is $frq_2$, the third counter circuit 823 when the frequency is $frq_3$, and the fourth counter circuit 824 when the frequency is $frq_4$.

A specific example of the periodic signal generating circuit used in FIG. 53 (another example of the timing signal generating circuit according to the invention) will be described with reference to FIGS. 54(A) and 54(B).

Figure 54:
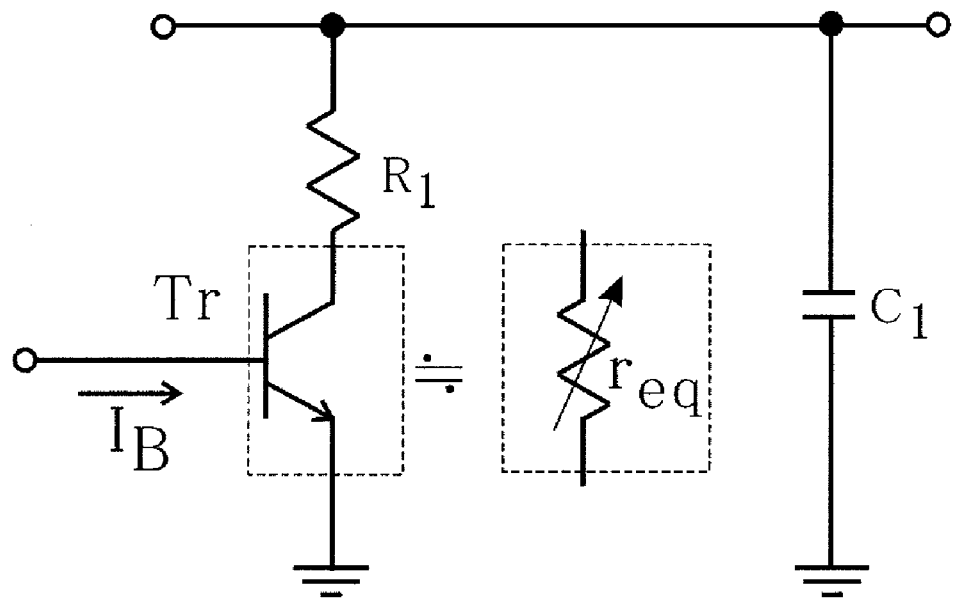
FIG. 54 is a diagram illustrating a specific example of a periodic signal generating circuit used in FIG. 53, where
Figure 54:
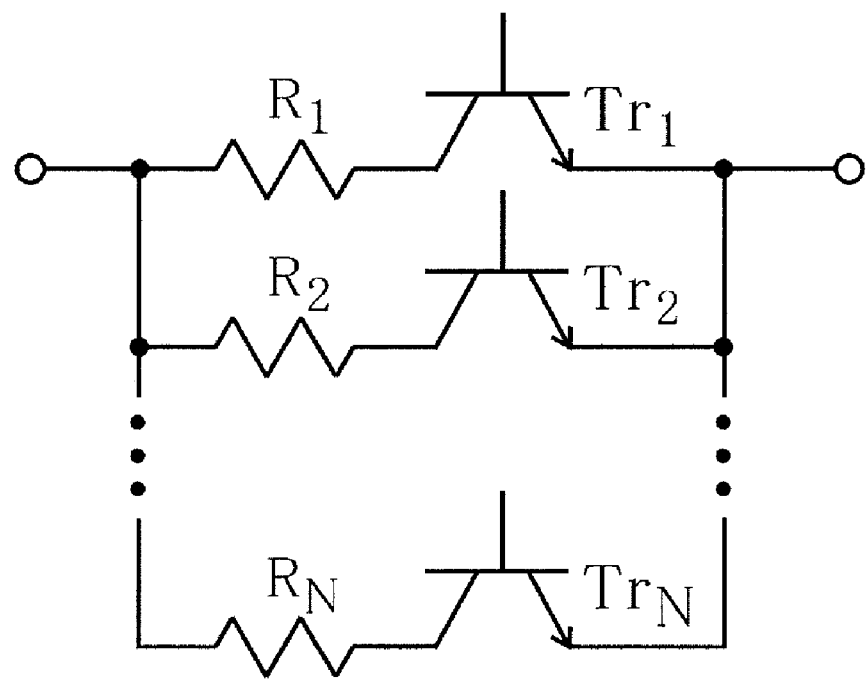

FIG. 54(A) illustrates a part of the oscillation circuit 87, where a bipolar transistor Tr is connected in series to a resistor $R_1$. In FIG. 54(A), the main current I of the transistor Tr is controlled in a non-saturated region (the control current is the base current $I_B$), the transistor Tr operates as a variable resistor $r_{eq}$, and the resistance in the resonance circuit can be continuously varied, that is, the oscillation frequency can be varied.

In FIG. 54(B), the periodic signal generating circuit is constructed by connecting serial connection circuit groups of the transistor $Tr_k$ (where k=1, 2, 3, ..., M) and the resistor $R_k$ disposed in a main current path of the transistor in parallel to each other. In the periodic signal generating circuit, the transistor $Tr_k$ operates as a switch and the resistance in the resonance circuit can be step-like varied, that is, the oscillation frequency can be varied.

In the timing signal generating circuit according to this example, similarly to the above-mentioned timing signal generating circuit, it is possible to count a large number using a small-capacity counter circuit and to generate a desired timing therefrom. In a circuit manufactured by a CMOS process, the power consumption depends on the frequency of the rising edge or the falling edge. This example capable of reducing the frequency of the rising edge or the falling edge of the periodic signals is preferably manufactured by the CMOS process. In a circuit manufactured by a TTL manufacturing process, the power consumption depends on the length of the ON period. Accordingly, in this circuit, it is possible to reduce the power consumption by reducing the duty ratio of the ON time at a low frequency, as described later (see FIG. 62).

Figure 55:
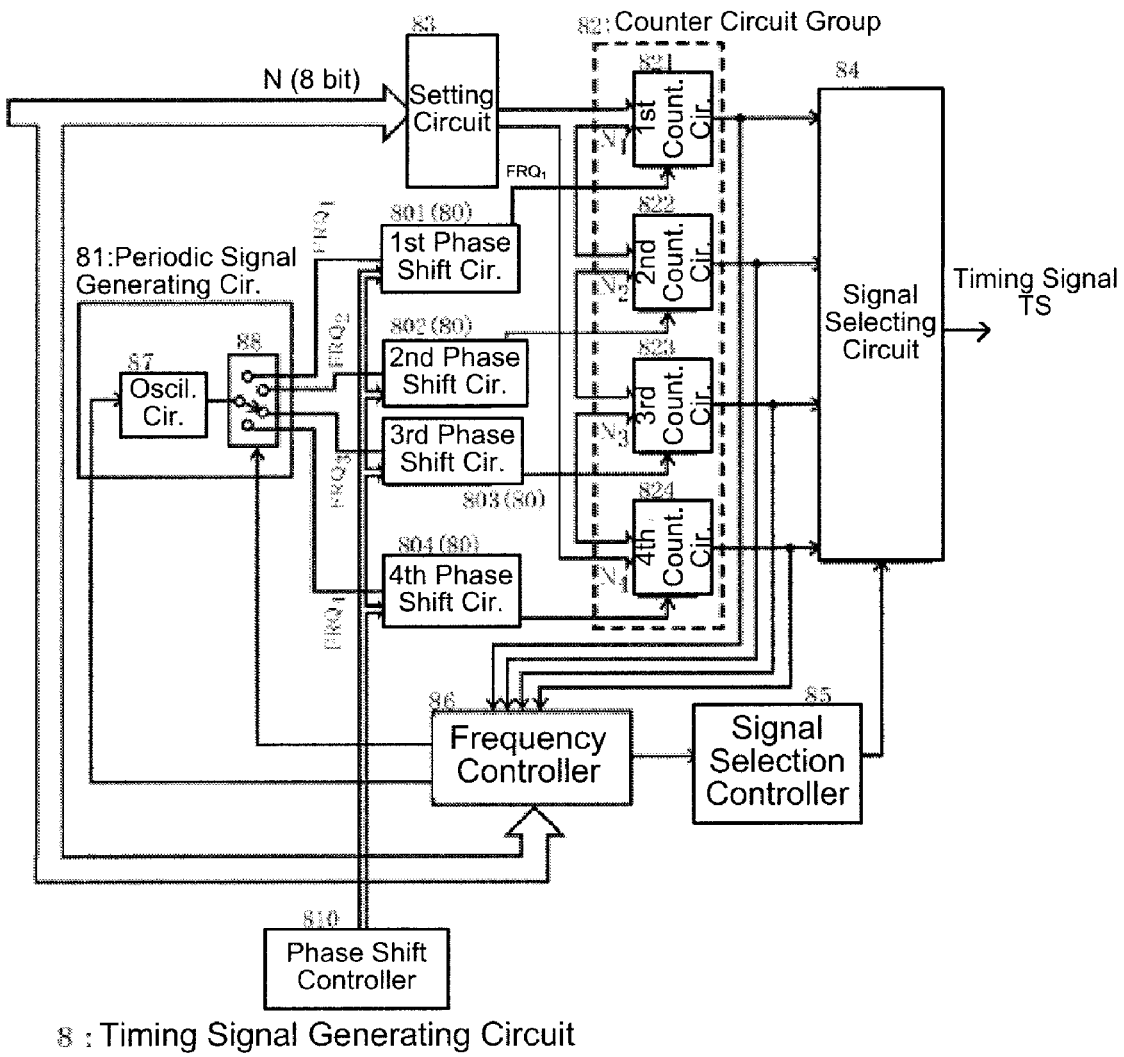
FIG. 55 is a diagram illustrating a modified example where a phase shift circuit group is disposed at a previous stage of a memory device group in the timing signal generating circuit shown in FIG. 53.

FIG. 55 is a diagram illustrating a modified example where a phase shift circuit group 80 is disposed at the previous stage of the memory device group 89 in the timing signal generating circuit 8 shown in FIG. 53. The phase shift circuit group 80 previous to the first counter circuit 821 includes a first phase shift circuit 801, a second phase shift circuit 802, a second phase shift circuit 803, and a fourth phase shift circuit 804.

In the timing signal generating circuit 8 shown in FIG. 55, the phase shift circuits 803 to 804 can compensate for the fineness between the frequency signals generated from the frequency signal generating circuits 811 to 814. The phase shift controller 801 can control any phase shift quantity.

Figure 56:
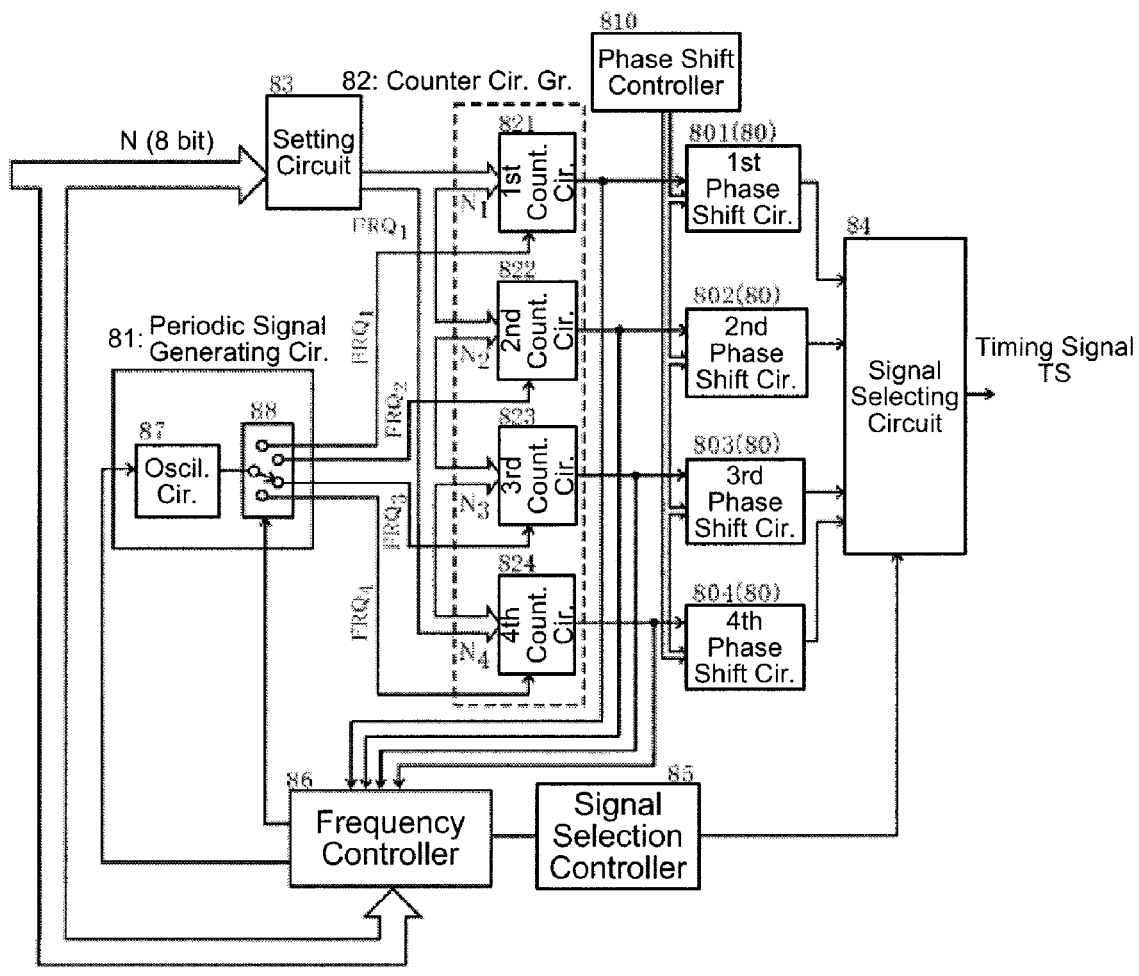
FIG. 56 is a diagram illustrating a modified example where a phase shift circuit group is disposed at a subsequent stage of the memory device group in the timing signal generating circuit shown in FIG. 53.

The first phase shift circuit 801 shifts a phase by a width smaller than one period of the first periodic signal (greater than the frequency of the first periodic signal) and greater than the period of the other periodic signals (smaller than the frequency of the first periodic signal), the second phase shift circuit 802 shifts a phase by a width smaller than one period of the second periodic signal and greater than the period of the other periodic signals, ..., and the M-th phase shift circuit 802 shifts a phase by a width smaller than one period of the M-th periodic signal and greater than the period of the other periodic signals, FIG. 56 is a diagram illustrating a modified example of the timing signal generating circuit 8 shown in FIG. 53 where the phase shift circuit group 80 is disposed at the subsequent stage of the memory device group 89. In this case, by disposing one phase shift circuit at the subsequent stage (at the previous stage of the counter circuit group 82) of the selection switch 88, it is possible to compensate for the fineness between the frequency signals generated from the frequency signal generating circuits 811 to 814.

Four phase shift circuits 801 to 804 are provided in the timing signal generating circuit shown in FIG. 55 or 56, but instead, one phase shift circuit may be disposed at the subsequent stage (at the previous stage of the counter circuit group 82) of the selection switch 88 to compensate for the fineness between the frequency signals generated from the frequency signal generating circuits 811 to 814.

In the timing signal generating circuit shown in FIG. 53, a phase shift circuit may be disposed at the subsequent stage of the selection circuit. In this case, the phase shift circuit can shift a phase by a width smaller than one period of the maximum frequency signal among the frequency signals generated from the periodic signal generating circuit.

The example where the phase shift circuit is disposed in the timing signal generating circuit 8 shown in FIG. 53 is described above, but four phase shift circuit groups may be disposed at the previous stage or the subsequent stage of the counter circuit group 82 in the timing signal generating circuit 8 shown in FIG. 50 or the phase shift circuit may be disposed at the subsequent stage of the signal selecting circuit 84.

Figure 57:
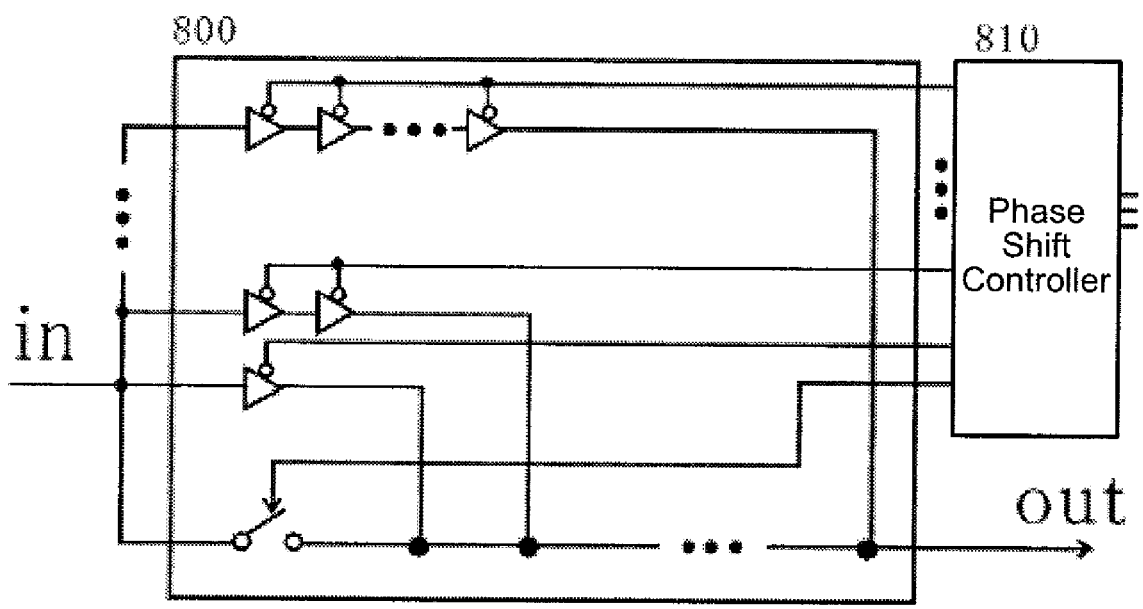
FIG. 57 is a diagram illustrating an example of the phase shift circuit.

FIG. 57 shows an example of the phase shift circuit. In the phase shift circuit shown in FIG. 57, the phase shift controller can control tri-state delay elements to output a signal with one of delay times T, 2T, ..., and MT.

Figure 58:
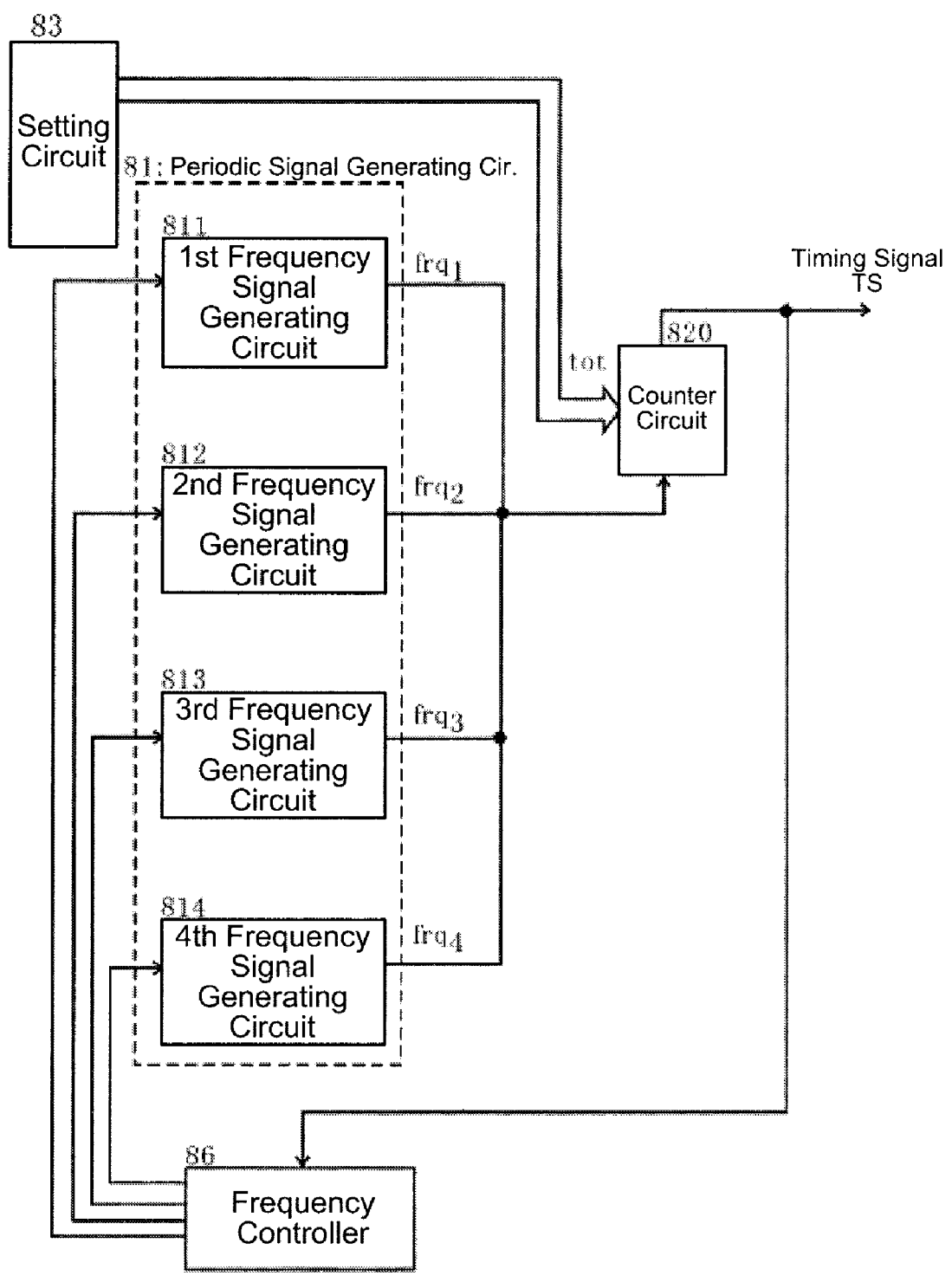
FIG. 58 is a diagram illustrating another example of the timing signal generating circuit according to the invention.

Another example of the timing signal generating circuit usable in the invention will be described now. The timing signal generating circuit 8 includes a periodic signal generating circuit 81, a counter circuit 820, a setting circuit 83, and a frequency controller 86, as shown in FIG. 58.

The periodic signal generating circuit 81 generates periodic signals having a varying frequency. The periodic signal generating circuit 81 is configured to sequentially output signals $frq_1$, $frq_2$, ..., and $frq_M$ of a first frequency $f_1$, a second frequency $f_2$, ..., and an M-th frequency $f_M$.

A preset value is a total sum of the number of signals $q_1$ of the first frequency $f_1$, the number of signals $q_2$ of the second frequency $f_2$, ..., and the number of signals $q_M$ of the M-th frequency $f_M$:

$$tot = q_1 + q_2 + \ldots + q_M.$$

The counter circuit 820 receives and counts the periodic signals and outputs a count end signal when the count value reaches the preset value.

The setting circuit 83 sets the preset value tot in the counter circuit 820.

The frequency controller 86 controls the frequencies of the periodic signals output from the periodic signal generating circuit 81 and allows the periodic signal generating circuit 81 to output $q_1$ signals $frq_1$ of the first frequency $f_1$, to output $q_2$ signals $frq_2$ of the second frequency $f_2$, ..., and to output $q_M$ signals $frq_M$ of the M-th frequency $f_1$.

In the timing signal generating circuit 8 according to the invention, a register is disposed in the counter circuit and can output a predetermined signal (a signal indicating a count end of the corresponding frequency signal) to the frequency controller when the count value reaches $q_1$, $(q_1+q_2)$, ..., and $(q_1+q_2+\ldots+q_{M-1})$.

Figure 59:
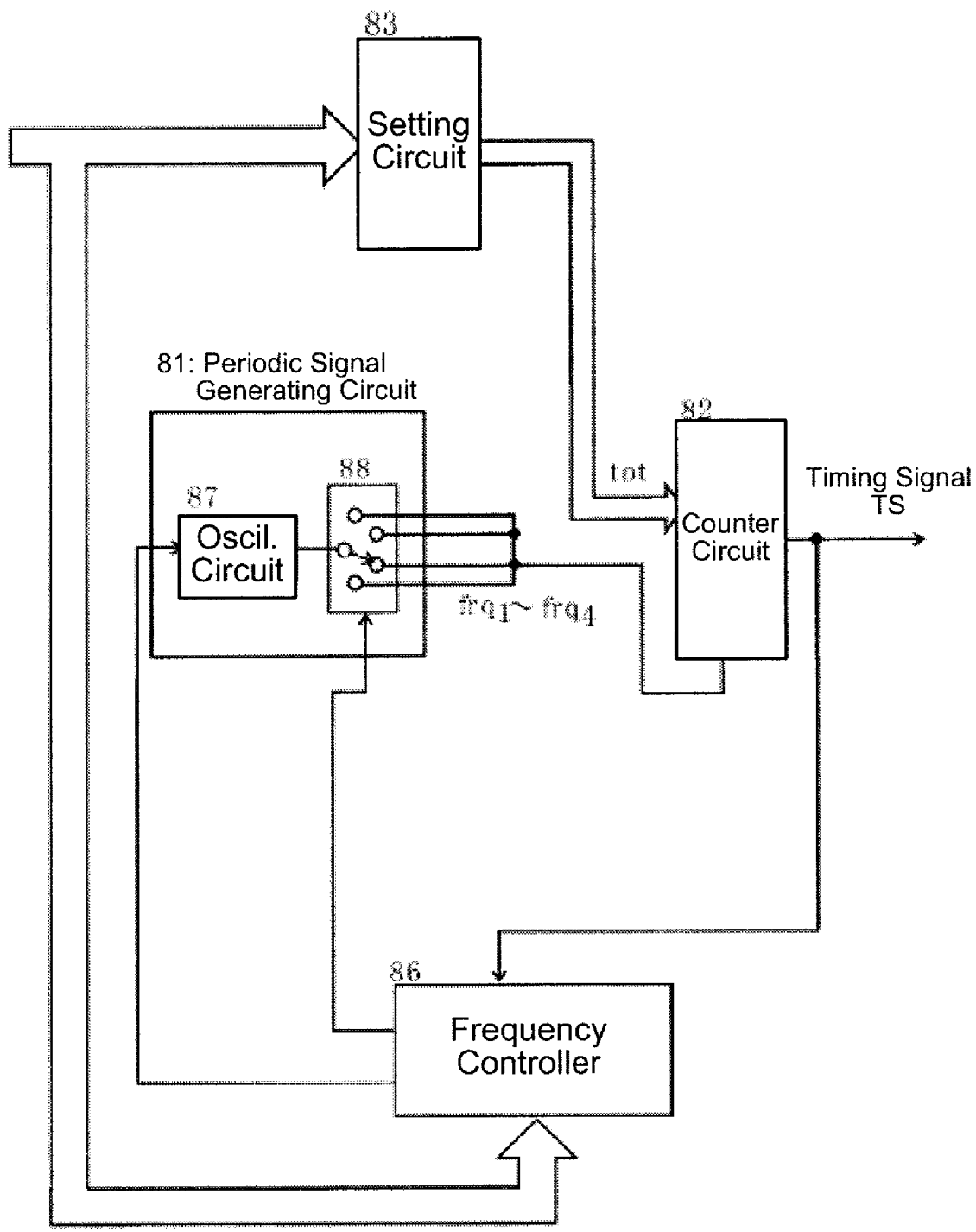
FIG. 59 is a diagram illustrating an example where the periodic signal generating circuit includes a single oscillation circuit.

The periodic signal generating circuit 81 can include plural frequency signal generating circuits as described above, or may include a single oscillation circuit as shown in FIG. 59. In FIG. 59, the periodic signal generating circuit 81 includes an oscillation circuit 87 and a selection switch (multiplexer) 88.

In the timing signal generating circuit 8 shown in FIGS. 58 and 59, it is possible to count a large number using a small-capacity counter circuit and to generate a desired timing (represented by a numerical value tot) therefrom.

Figure 60A:
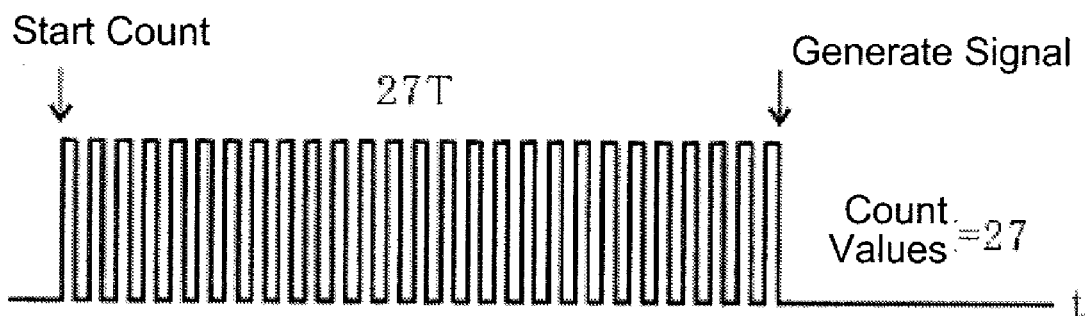
FIG. 60(A) is a waveform diagram illustrating a usual counting operation of counting "27" at a high frequency and FIGS. 60(B) and 60(C) are waveform diagrams illustrating a counting operation of counting signals at different frequencies by the use of a single counter circuit.
Figure 60B:
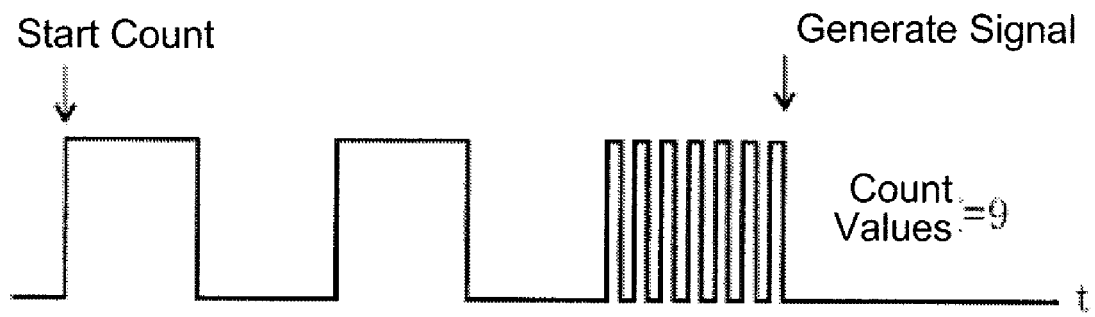
Figure 60C:
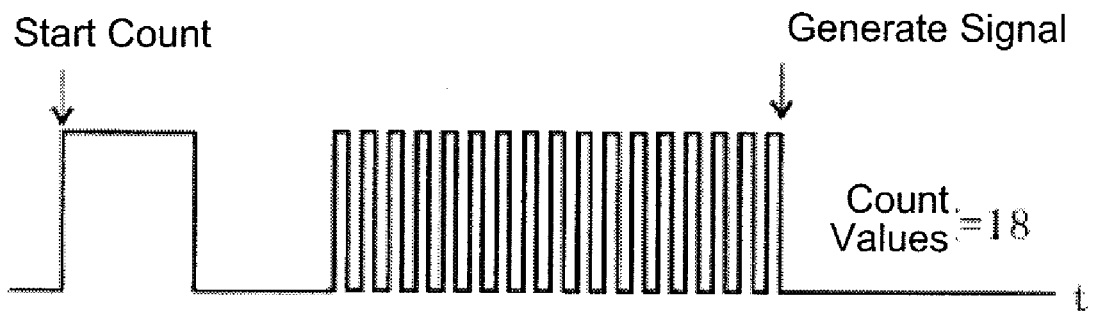

FIG. 60(A) shows a usual counting operation of counting "27" at a high frequency $f_H$ (period $T_H$). FIGS. 60(B) and 60(C) are waveform diagrams illustrating an example where signals of different frequencies are counted by a single counter circuit.

As shown in FIG. 60(B), if signals of a low frequency $f_L=f_H/10$ (period $T_L=10T_H$) are counted as "2" and signals of a high frequency $f_H$ are counted as "7", it means that the signals of the high frequency $f_H$ are counted as "27." As shown in FIG. 60(C), if signals of a low frequency $f_L=f_H/10$ (period $T_L=10T_H$) are counted as "1" and signals of a high frequency $f_H$ are counted as "17", it means that the signals of the high frequency $f_H$ are counted as "27."

Figure 61A:
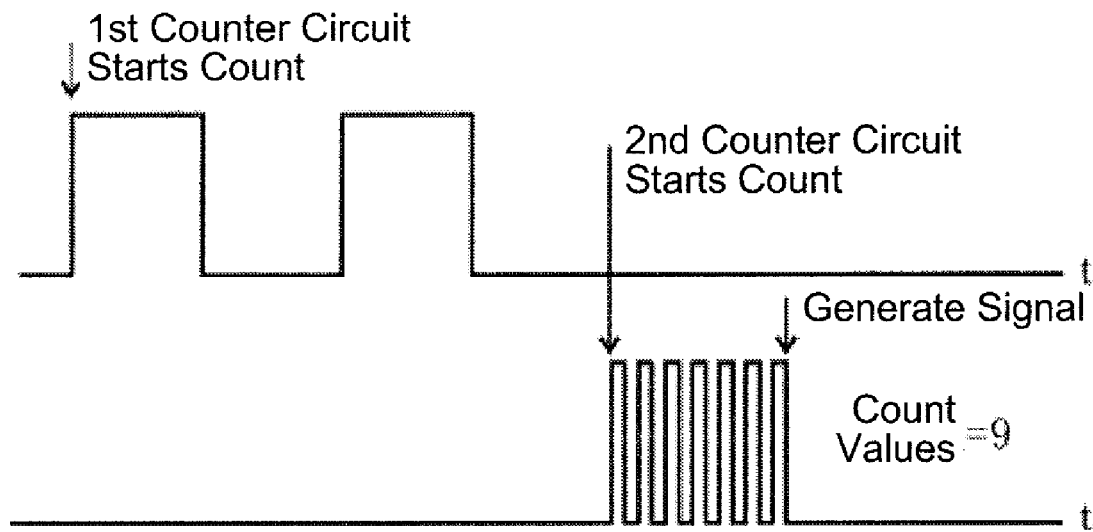
FIGS. 61(A) and 61(B) are waveform diagrams illustrating a counting operation of counting signals at different frequencies by the use of two counter circuits.
Figure 61B:
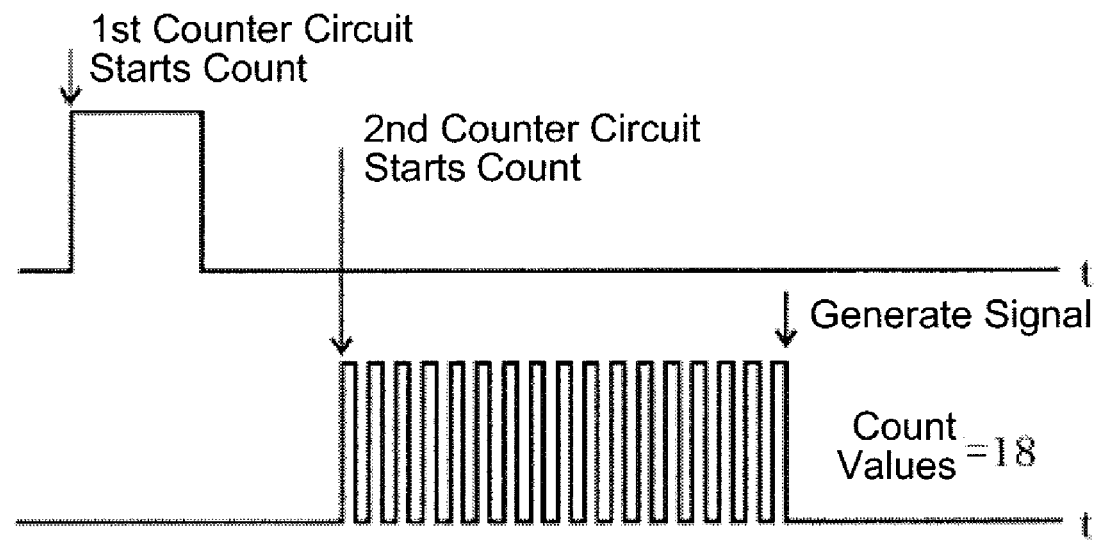

FIGS. 61(A) and 61(B) are waveform diagrams illustrating an operation of counting signals of different frequencies by the use of two counter circuits. As shown in FIG. 61(A), if signals of a low frequency $f_L=f_H/10$ (period $T_L=10T_H$) are counted as "2" and signals of a high frequency $f_H$ are counted as "7", it means that the signals of the high frequency $f_H$ are counted as "27" (see FIG. 60(A)). As shown in FIG. 61(B), if signals of a low frequency $f_L=f_H/10$ (period $T_L=10T_H$) are counted as "1" and signals of a high frequency $f_H$ are counted as "17", it means that the signals of the high frequency $f_H$ are counted as "27."

Figure 62A:
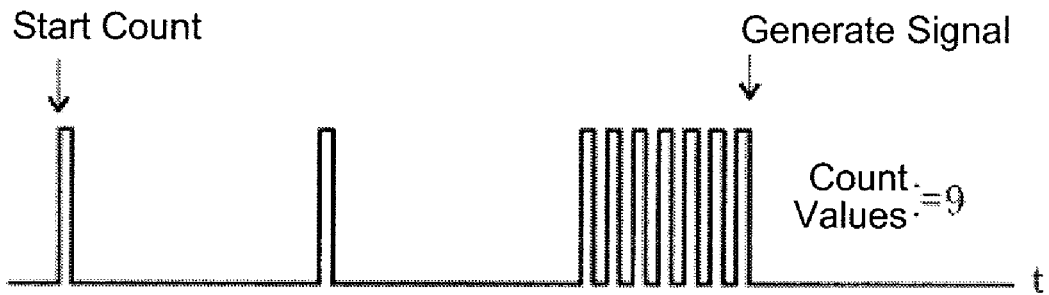
FIG. 62 is a diagram illustrating an example where power consumption is reduced by reducing a duty ratio of an ON time of a low-frequency signal.
Figure 62B:
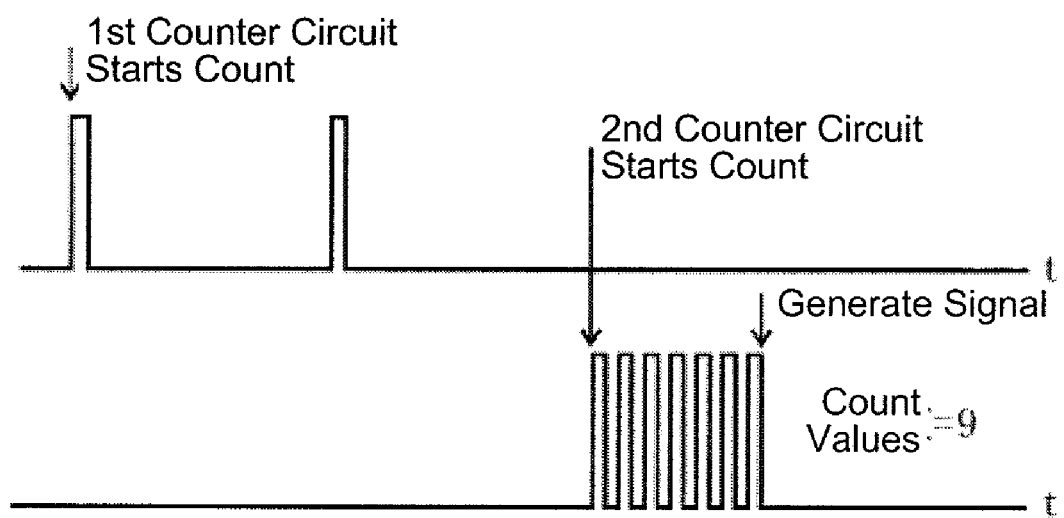

In a circuit manufactured by a CMOS process, the power consumption depends on the frequency of the rising edge or the falling edge. This example capable of reducing the frequency of the rising edge or the falling edge of the periodic signals is preferably manufactured by the CMOS process. In a circuit manufactured by a TTL manufacturing process, the power consumption depends on the length of the ON period. Accordingly, in this circuit, it is possible to reduce the power consumption by reducing the duty ratio of the ON time at a low frequency, as described later as shown in FIG. 62.

The value set in the register of the counter circuit 820 may be $q_1, (q_1+q_2), \ldots$, and $(q_1+q_2+\ldots+q_{M-1})$. In this case, it takes time for a process for change to a next frequency and an error may occur. When this error causes a problem, a value obtained by subtracting a predetermined number (for example, subtracting "1") therefrom may be set in the registers. Specifically, $q_1, (q_1+q_2), \ldots$, and $(q_1+q_2+\ldots+q_{M-1})$ as the values to be set in the registers are counted and then the process for change to a next frequency can be performed.

The frequency controller or the periodic signal generating circuit can have a function of counting the number of signals $q_1, q_2, \ldots$, and $q_{M-1}$ every frequency $f_1, f_2, \ldots$, and $f_{M-1}$. In this case, when the frequency controller or the periodic signal generating circuit counts $q_1, (q_1+q_2), \ldots$, and $(q_1+q_2+\ldots+q_{M-1})$, signals of a next frequency may be output from the periodic signal generating circuit, or the process for change to a next frequency may be performed after counting $q_1, (q_1+q_2), \ldots$, and $(q_1+q_2+\ldots+q_{M-1})$.

Figure 63A:
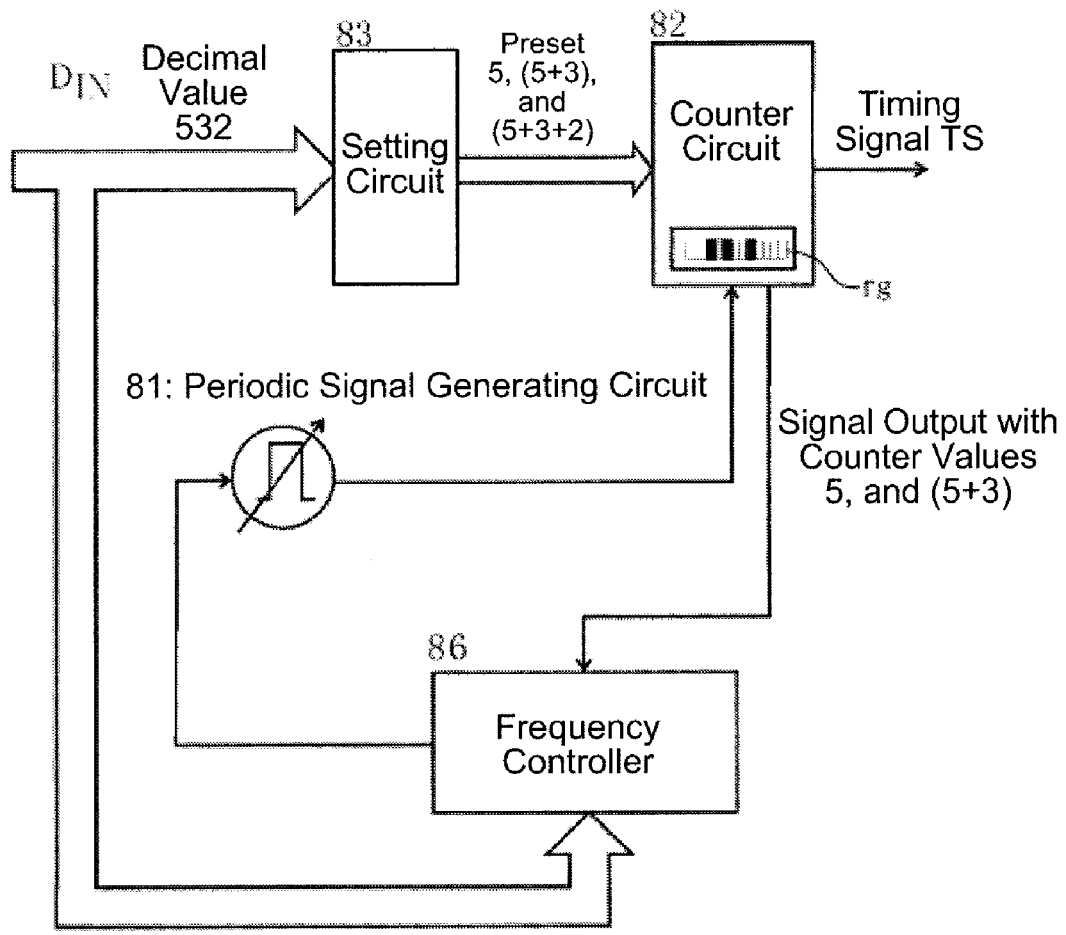
FIG. 63 is a diagram illustrating another example of the timing signal generating circuit according to the invention.
Figure 63B:
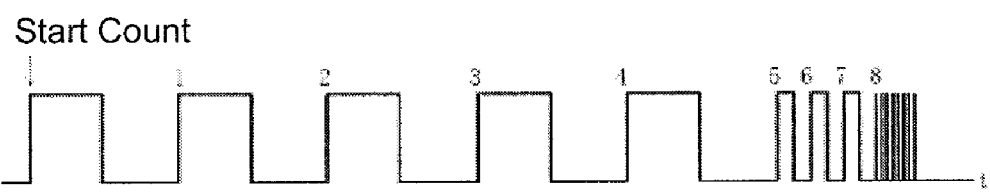

The timing signal generating circuit shown in FIG. 63 includes a periodic signal generating circuit 81, a counter circuit 820, a setting circuit 83, and a frequency controller 86. The periodic signal generating circuit 81 outputs one of signals $frq_1$, $frq_2$, and $frq_3$ of predetermined frequencies $f_1$, $f_2$, and $f_3$ in accordance with a control signal from the frequency controller 86. The periodic signal generating circuit 81 is substantially the same as the periodic signal generating circuit 81 described with FIG. 58 or 59.

The counter circuit 820 includes a register rg. In this example, the setting circuit 83 acquires a value of "532" in a decimal system, sets the acquired value in the register not shown in the counter circuit 820, and sets "5", "8" (=5+3), and "10" (=5+3+7) in the register rg.

The frequency controller 86 outputs an ON signal to the periodic signal generating circuit 81 and the periodic signal generating circuit 81 outputs a signal of the frequency $f_1$. The counter circuit 820 outputs a signal indicating that the count of signals of the frequency $f_1$ is ended to the frequency controller 86 when the count value reaches "5."

That is, the frequency controller 86 first outputs signals of the frequency $f_2$ from the periodic signal generating circuit 81. The counter circuit 820 outputs a signal indicating that the count of signals of the frequency $f_2$ is ended to the frequency controller 86 when the count value reaches "8."

Thereafter, the frequency controller 86 outputs signals of the frequency $f_3$ from the periodic signal generating circuit 81. The counter circuit 820 outputs a signal indicating that the count of signals of the frequency $f_3$ is ended to the frequency controller 86 when the count value reaches "10 (=5+3+2)."

Figure 64:
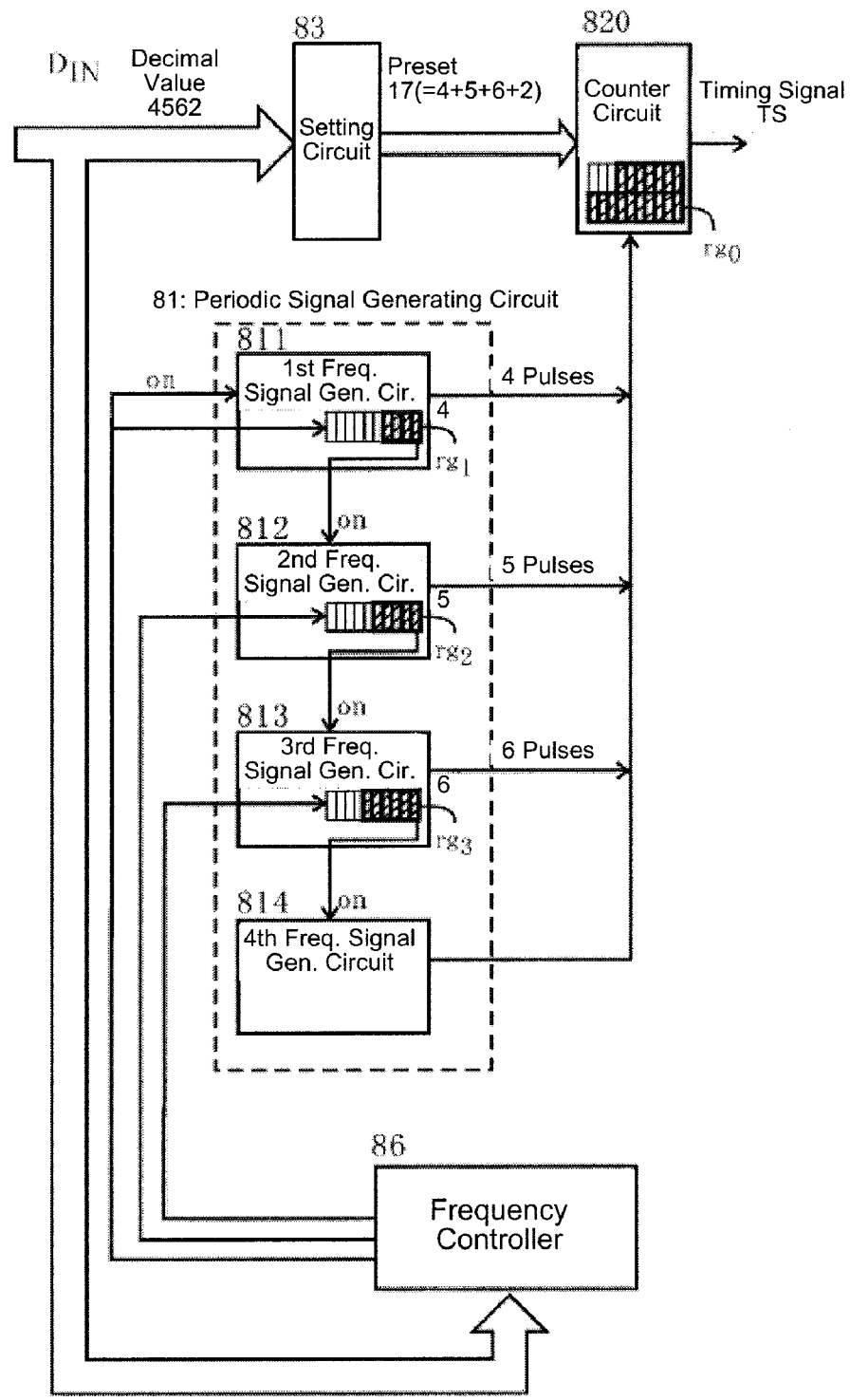
FIG. 64 is a diagram illustrating another example of the timing signal generating circuit according to the invention.

The timing signal generating circuit 8 shown in FIG. 64 includes a periodic signal generating circuit 81, a counter circuit 820, a setting circuit 83, and a frequency controller 86, similarly to the timing signal generating circuit 8 shown in FIG. 63.

The setting circuit 83 acquires a value of "4562" in a decimal system and this value is set in a register $rg_0$ of the counter circuit 820. The periodic signal generating circuit 81 includes a frequency signal generating circuit 811 having a register $rg_1$ generating signals of the frequency $f_1$, a frequency signal generating circuit 812 having a register $rg_2$ generating signals of the frequency $f_2$, a frequency signal generating circuit 813 having a register $rg_3$ generating signals of the frequency $f_3$, and a frequency signal generating circuit 814 having a register $rg_4$ generating signals of the frequency $f_4$. In this example, the frequency controller 86 acquires a value of "456" which is a value of three upper ciphers of the "4562" and "4", "5", and "6" are set in the registers $rg_1$, $rg_2$, and $rg_3$, respectively.

The frequency controller 86 outputs the ON signal to the frequency signal generating circuit 811 and the periodic signal generating circuit 811 outputs the signals of a frequency $f_1$ by the number of values ("4") set in the register $rg_1$ to the counter circuit 820. The frequency signal generating circuit 811 outputs the ON signal to the frequency signal generating circuit 812 after outputting four signals, and the frequency signal generating circuit 812 outputs the signals of a frequency $f_2$ by the number of values ("5") set in the register $rg_2$ to the counter circuit 820. The frequency signal generating circuit 812 outputs the ON signal to the frequency signal generating circuit 813 after outputting five signals, and the frequency signal generating circuit 813 outputs the signals of a frequency $f_3$ by the number of values ("6") set in the register $rg_3$ to the counter circuit 820. The frequency signal generating circuit 813 outputs the ON signal to the frequency signal generating circuit 814 after outputting six signals, and the frequency signal generating circuit 814 outputs the signals of a frequency $f_4$ to the counter circuit 820. The counter circuit 820 counts the signals of the frequency $f_4$ until the count value reaches "17."

Figure 65:
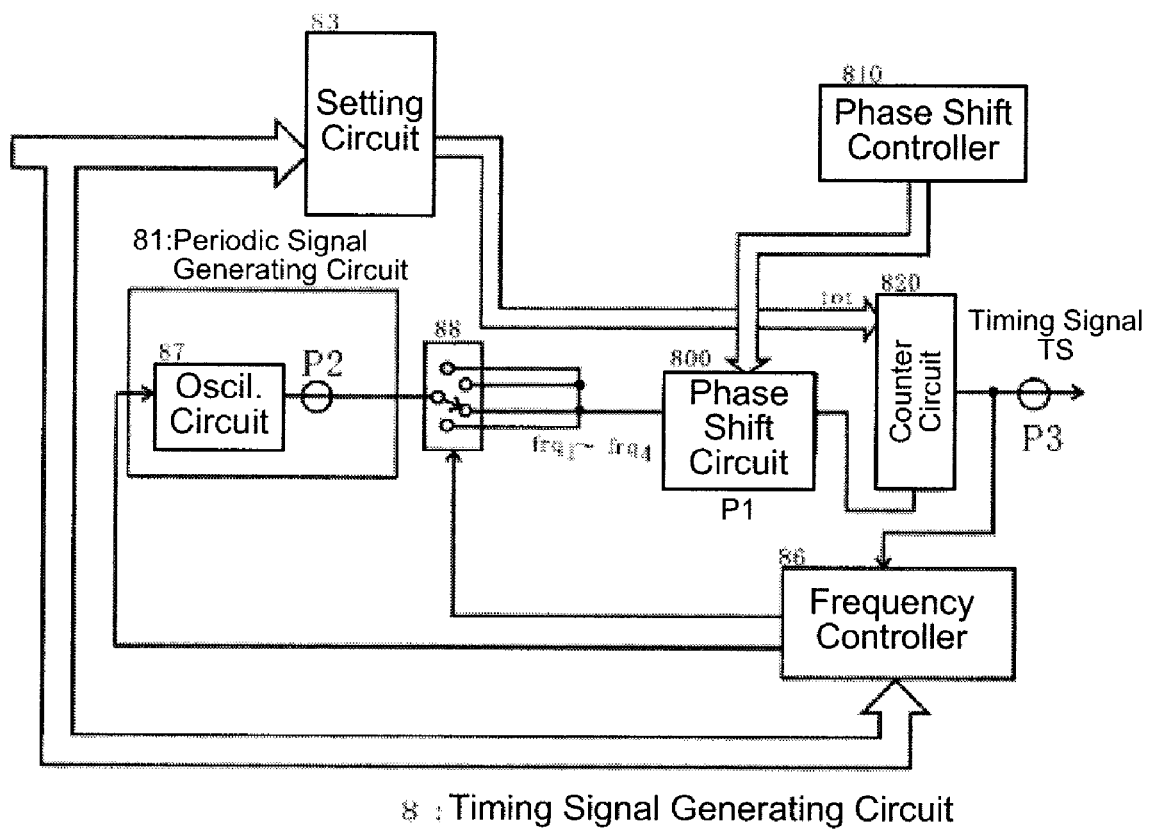
FIG. 65 is a diagram illustrating an example where the phase shift circuit is disposed in the timing signal generating circuit shown in FIG. 59.

FIG. 65 is a diagram illustrating an example where a phase shift circuit 800 is disposed in the timing signal generating circuit 8 shown in FIG. 59. In FIG. 65, the phase shift circuit 800 is disposed at a position of P1 (at the subsequent stage of the selection switch 88), but may be disposed at a position of P2 (at the previous stage of the selection switch 88) or at a position of P3 (at the subsequent stage of the counter circuit 820). The shift width is smaller than one period of the signal of the maximum frequency among the frequencies usually generated from the periodic signal generating circuit. The phase shift controller 810 can select what phase of signal the phase shift circuit 800 should output. The phase shift circuit 800 may be equal to the phase shift circuit shown in FIG. 57.

The plural units of the timing signal generating circuits according to the invention shown in FIGS. 50, 53, 55, 56, 58, 59, 63, 64, and 65 may be connected in series to generate timing signals. In this case, the minimum frequency of the subsequent-stage unit is greater than the maximum frequency of the periodic signal generating circuit of the subsequent-stage unit.

The pulses of which the phases are shifted can be generated from the following pulse generating circuits (28) to (36).

(28) A pulse generating circuit comprising:
an integration circuit receiving a rectangular or substantially-rectangular pulse and outputting a gradually increasing or decreasing signal obtained by integrating the pulse signal;
a reference signal output circuit outputting a constant value or a varying value as a reference signal; and
a comparison circuit comparing the output of the integration circuit with the output of the reference signal output circuit and outputting a pulse rising or falling at a timing when the difference between the outputs varies.

(29) The pulse generating circuit according to (28), wherein the reference signal output circuit includes a D/A converter and a low-pass filter is further provided at the subsequent stage of the D/A converter.

(30) The pulse generating circuit according to (28) or (29), wherein plural groups of the integration circuit, the reference signal output circuit, and the comparison circuit are provided in parallel and a selection circuit is provided at the subsequent stage of the comparison circuit.

(31) The pulse generating circuit according to (28) or (29), wherein plural groups of the integration circuit, the reference signal output circuit, and the comparison circuit are provided in series.

(32) The pulse generating circuit according to (28) or (29), wherein the integration circuit includes plural integration circuit elements and a selection circuit selecting the outputs of the integration circuit elements, and/or
wherein the reference signal output circuit includes plural reference signal output circuit elements and a selection circuit selecting the outputs of the reference signal output circuit elements.

(33) The pulse generating circuit according to (28) or (29), wherein a plural number of the integration circuits is provided and the comparison circuit is provided on the output sides of the integration circuits, and
wherein the plural comparison circuits compare the outputs of the plural integration circuits and the reference signal output circuit with each other.

(34) The pulse generating circuit according to (28) or (29), wherein a plural number of the reference signal output circuits is provided and the comparison circuit is provided on the output sides of the reference signal output circuits, and
wherein the plural comparison circuits compare the outputs of the plural reference signal output circuits and the integration circuit with each other.

(35) The pulse generating circuit according to any one of (28) to (34), wherein an output stage is provided with a waveform synthesizing circuit synthesizing the rectangular or substantially-rectangular pulse signal and the output signal of the comparison circuit.

(36) The pulse generating circuit according to any one of (28) to (35), wherein a counter circuit is further provided at the previous stage or the subsequent stage of the waveform synthesizing circuit, and
wherein a pulse signal of a frequency lower than that of the pulse signal is generated and a turning-on and/or turning-off timing signal of a processing pulse is generated.

A desired waveform can be generated from an input pulse signal and a reference signal, and specifically, it is possible to finely adjust the rising edge or the falling edge of the PWM device or the like (set the ON or Off time width of a pulse with a resolution higher than that of the oscillation circuit) or it is possible to adjust the dead time and the period with high precision.

In the pulse generating circuit, even when the resolution of the D/A converter used for the reference signal is lowered by connecting the integration circuits in series, it is possible to obtain the same advantage as using the D/A converter with a high resolution and to obtain a timing signal with a high resolution, by repeating the generation of timing signal in a rising time gradually shortened via several stages.

Figure 66A:
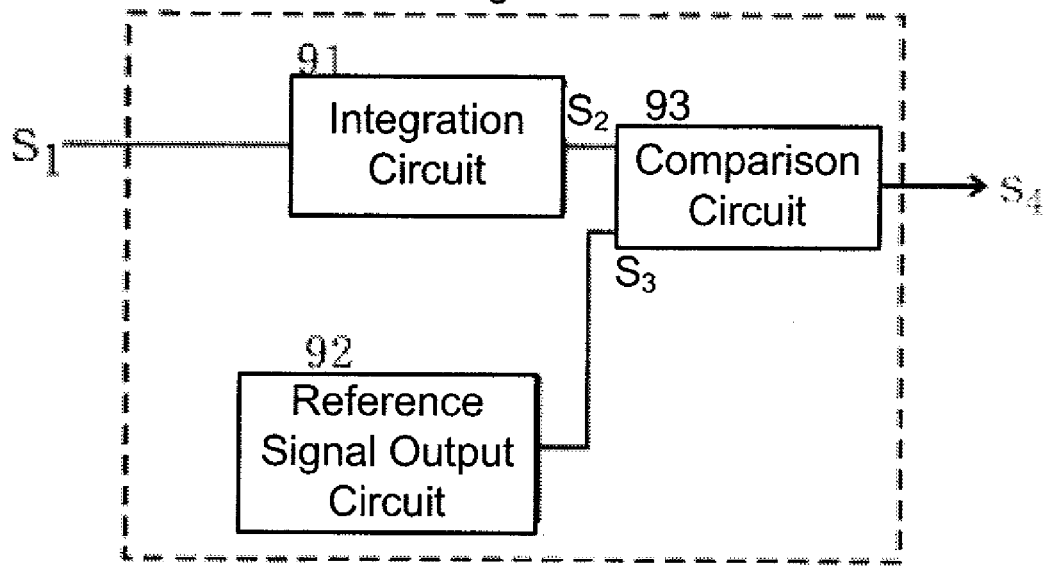
FIG. 66(A) is a diagram illustrating a basic configuration and FIG. 66(B) is a diagram illustrating an example where an integration circuit includes plural elements.

FIG. 66(A) is a diagram illustrating an example of the pulse generating circuit. In FIG. 66(A), the pulse generating circuit 9 includes an integration circuit 91, a reference signal output circuit 92, and a comparison circuit 93.

The integration circuit 91 receives a rectangular or substantially-rectangular pulse signal and outputs a gradually increasing or decreasing signal obtained by integrating the pulse signal. The integration circuit 91 may be formed by a circuit (circuit including a capacitor and a resistor) not including an active element or may be formed by a circuit including an active element.

The reference signal output circuit 92 outputs a constant value or a varying value as a reference signal. The reference signal output circuit 92 can be formed by a D/A converter. When the reference signal output circuit 92 outputs a varying value, a low-pass filter may be provided at the subsequent stage of the D/A converter to smooth the output of the D/A converter.

The comparison circuit 93 compares the output of the integration circuit 91 with the output of the reference signal output circuit 92 and outputs a signal obtained by adding a temporal modulation to the rectangular or substantially-rectangular pulse signal.

Figure 66B:
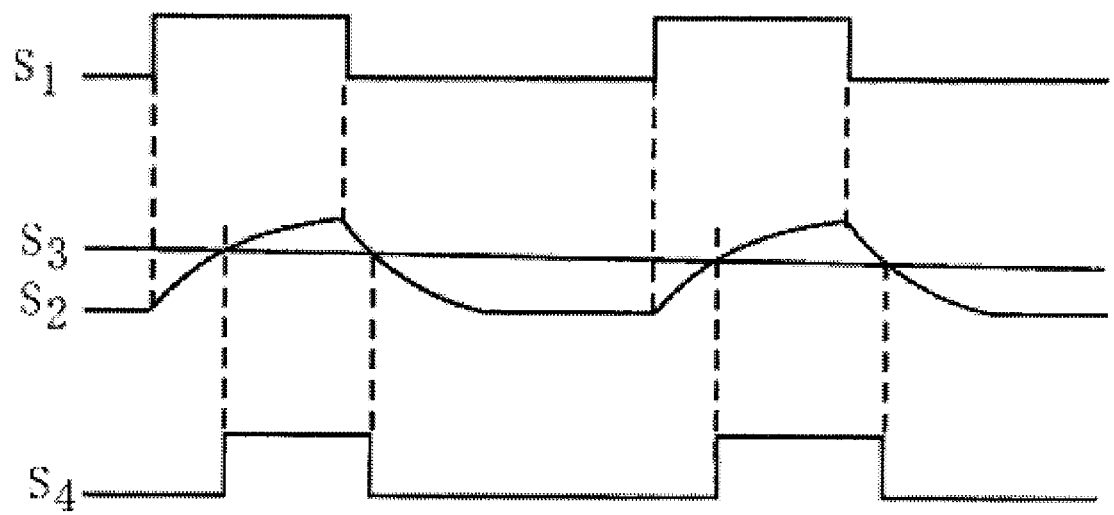

FIG. 66(B) is a diagram illustrating examples of the input $S_1$ of the integration circuit 9 (the input of the pulse generating circuit 9), the output $S_2$ of the integration circuit 91, the output $S_3$ of the reference signal output circuit 92, and the output $S_4$ of the comparison circuit 93.

Figure 67A:
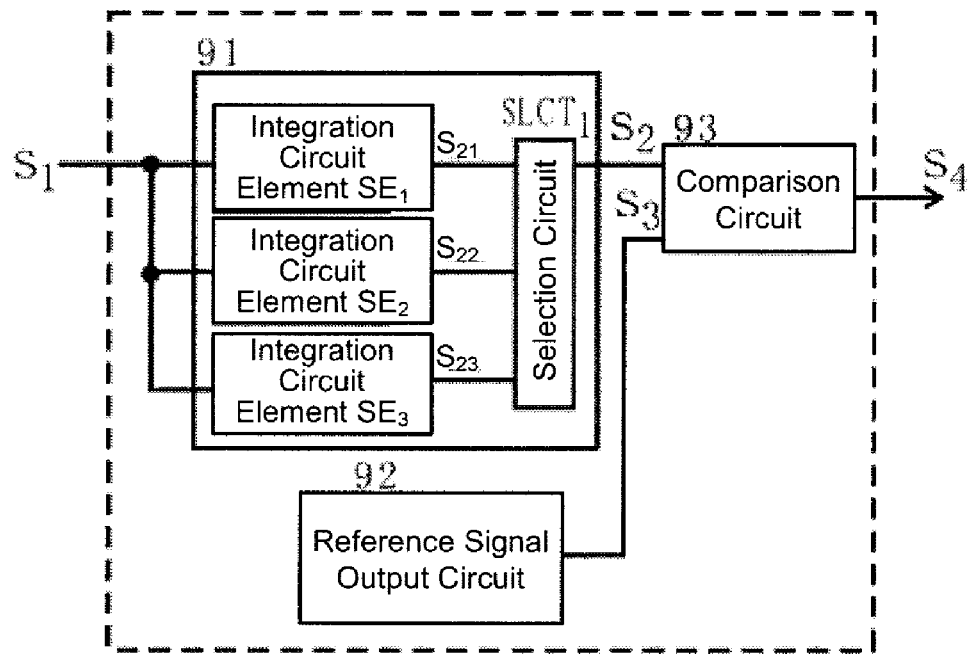
FIG. 67(A) is a diagram illustrating an example where the integration circuit includes three integration circuit elements and a selection circuit and FIG. 67(B) is a diagram illustrating an example where a reference signal output circuit includes three reference signal output circuit elements.

In the pulse generating circuit 9, as shown in FIG. 67(A), the integration circuit 91 may include plural integration circuit elements ($SE_1$, $SE_2$, and $SE_3$ in FIG. 67(A)) and a selection circuit $SLCT_1$.

Figure 67B:
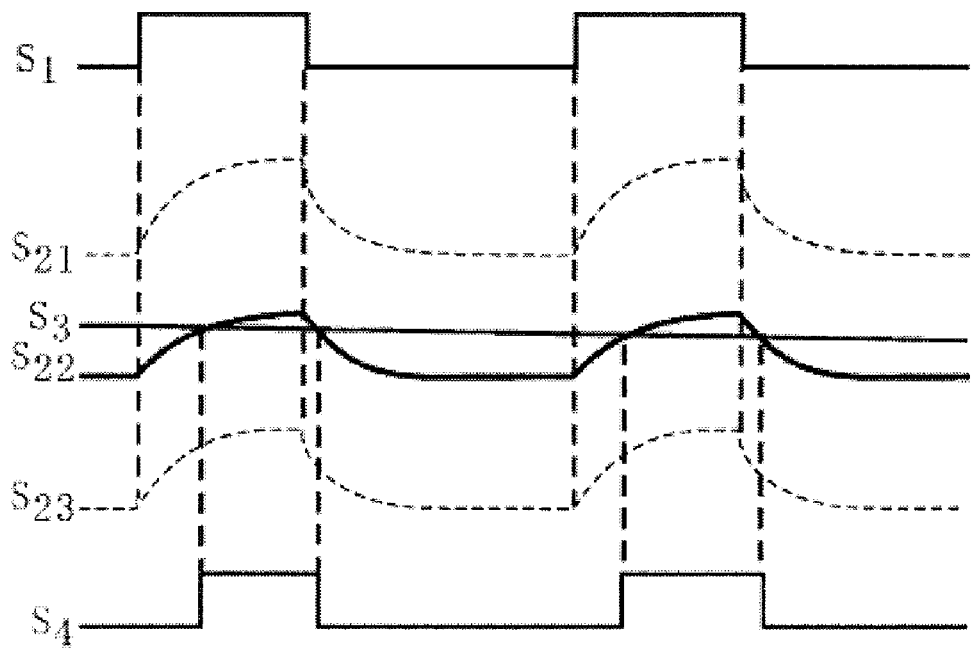

The selection circuit $SLCT_1$ can select one of the integration circuit elements $SE_1$, $SE_2$, and $SE_3$ in accordance with an instruction from a selection controller not shown. FIG. 67(B) shows examples of the input $S_1$ of the pulse generating circuit (the inputs of the integration circuit elements $SE_1$, $SE_2$, and $SE_3$), the outputs $S_{21}$, $S_{22}$, and $S_{23}$ of the integration circuit elements $SE_1$, $SE_2$, and $SE_3$, the output $S_2$ of the selection circuit $SLCT_1$, the output $S_3$ of the reference signal output circuit 92, and the output $S_4$ of the comparison circuit 93.

Figure 68A:
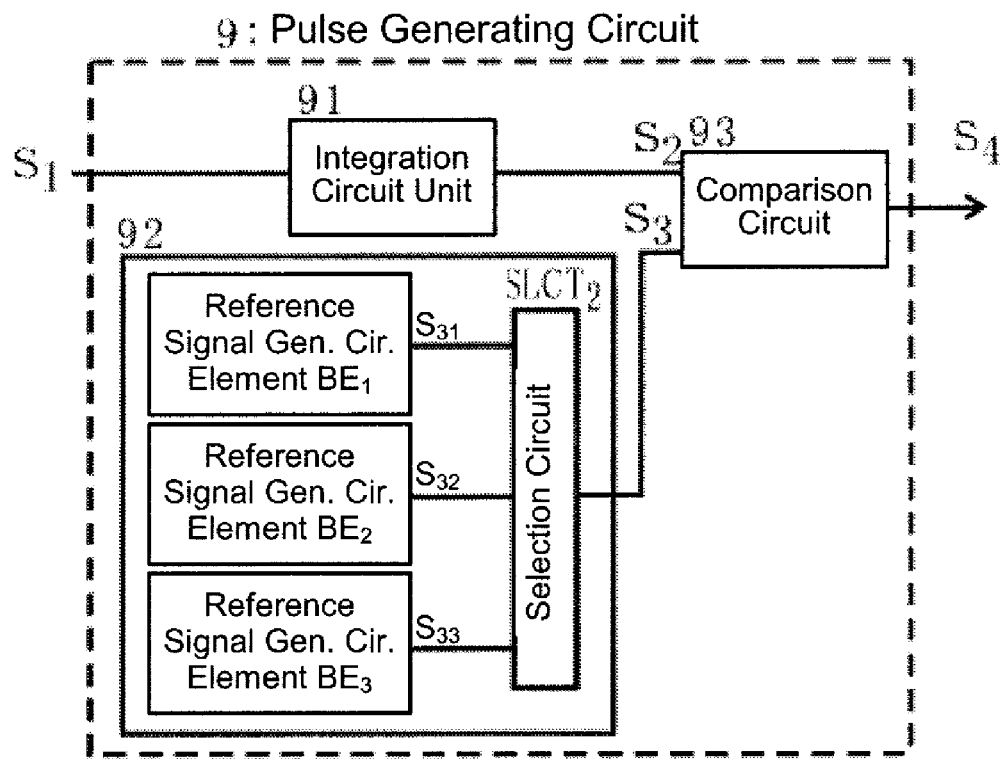
FIG. 68(A) is a diagram illustrating an example (one selection circuit) where the integration circuit includes three integration circuit elements and a selection circuit and the reference signal output circuit includes three reference signal output circuit elements and FIG. 68(B) is a diagram illustrating an example (two selection circuits) where the integration circuit includes three integration circuit elements and a selection circuit and the reference signal output circuit includes three reference signal output circuit elements.
Figure 68B:
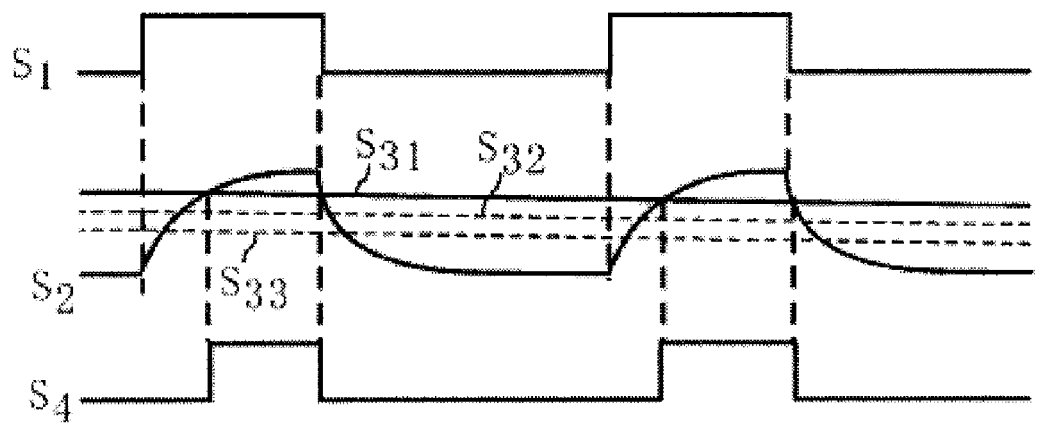

As shown in FIG. 68(A), the reference signal output circuit 92 can include plural reference signal output circuit elements ($BE_1$, $BE_2$, and $BE_3$ in FIG. 68(A)) and a selection circuit $SLCT_2$. FIG. 68(B) shows examples of the input $S_1$ of the pulse generating circuit (the input of the integration circuit), the output $S_2$ of the integration circuit, the outputs $S_{31}$, $S_{32}$, and $S_{33}$ of the reference signal generating circuit elements $BE_1$, $BE_2$, and $BE_3$, the output $S_3$ of the selection circuit $SLCT_2$, and the output $S_4$ of the comparison circuit 93.

Figure 69:
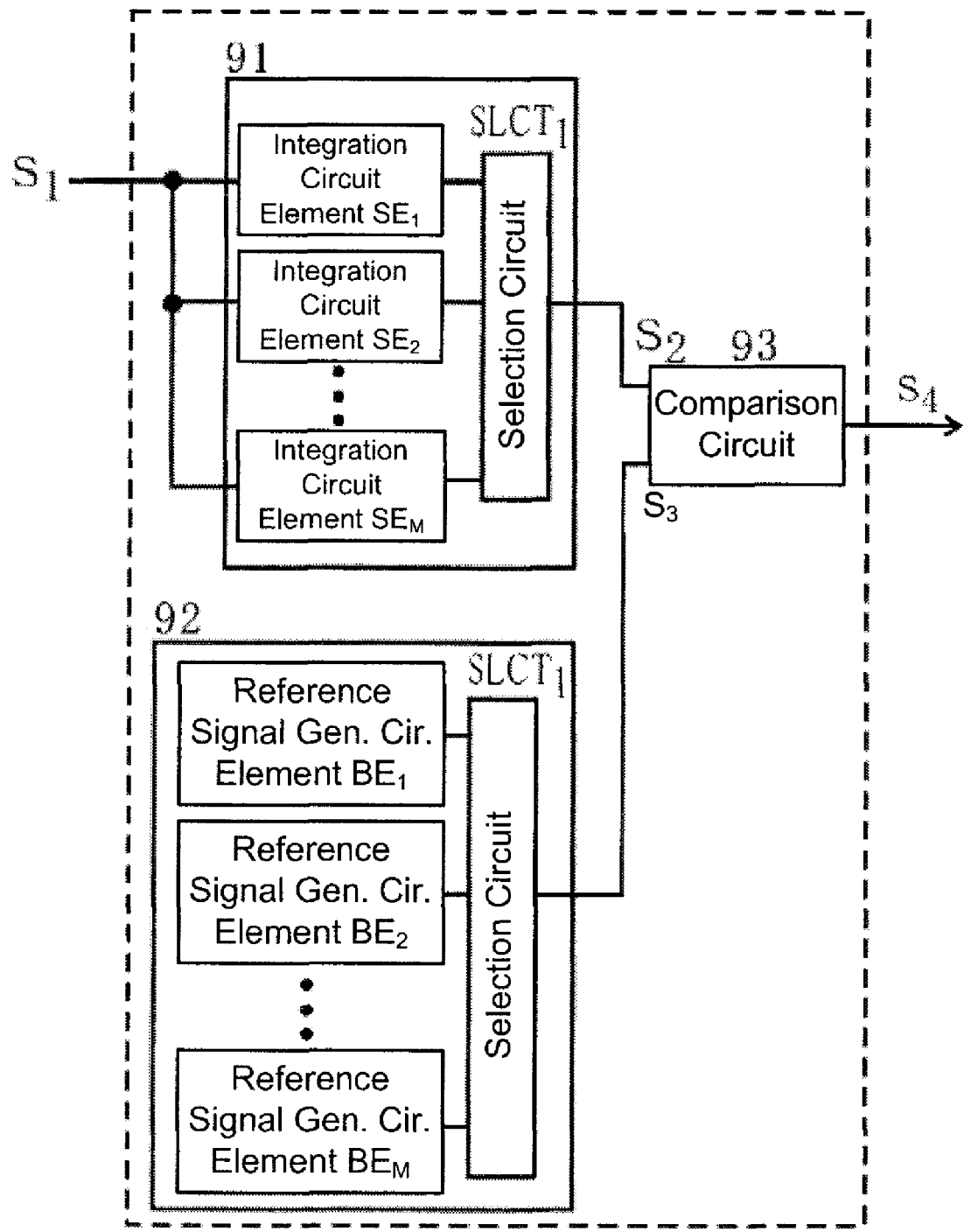
FIG. 69 is a diagram illustrating an example where the integration circuit includes plural integration circuit elements and a comparison circuit includes plural comparison circuit elements.

In the pulse generating circuit 9, as shown in FIG. 69, the integration circuit 91 may include plural integration circuit elements ($SE_1$, $SE_2$, ..., and $SE_M$ in FIG. 69) and a selection circuit $SLCT_1$, and the reference signal output circuit 92 may include plural reference signal output circuit elements ($BE_1$, $BE_2$, ..., and $BE_M$ in FIG. 69) and a selection circuit $SLCT_2$.

Figure 70:
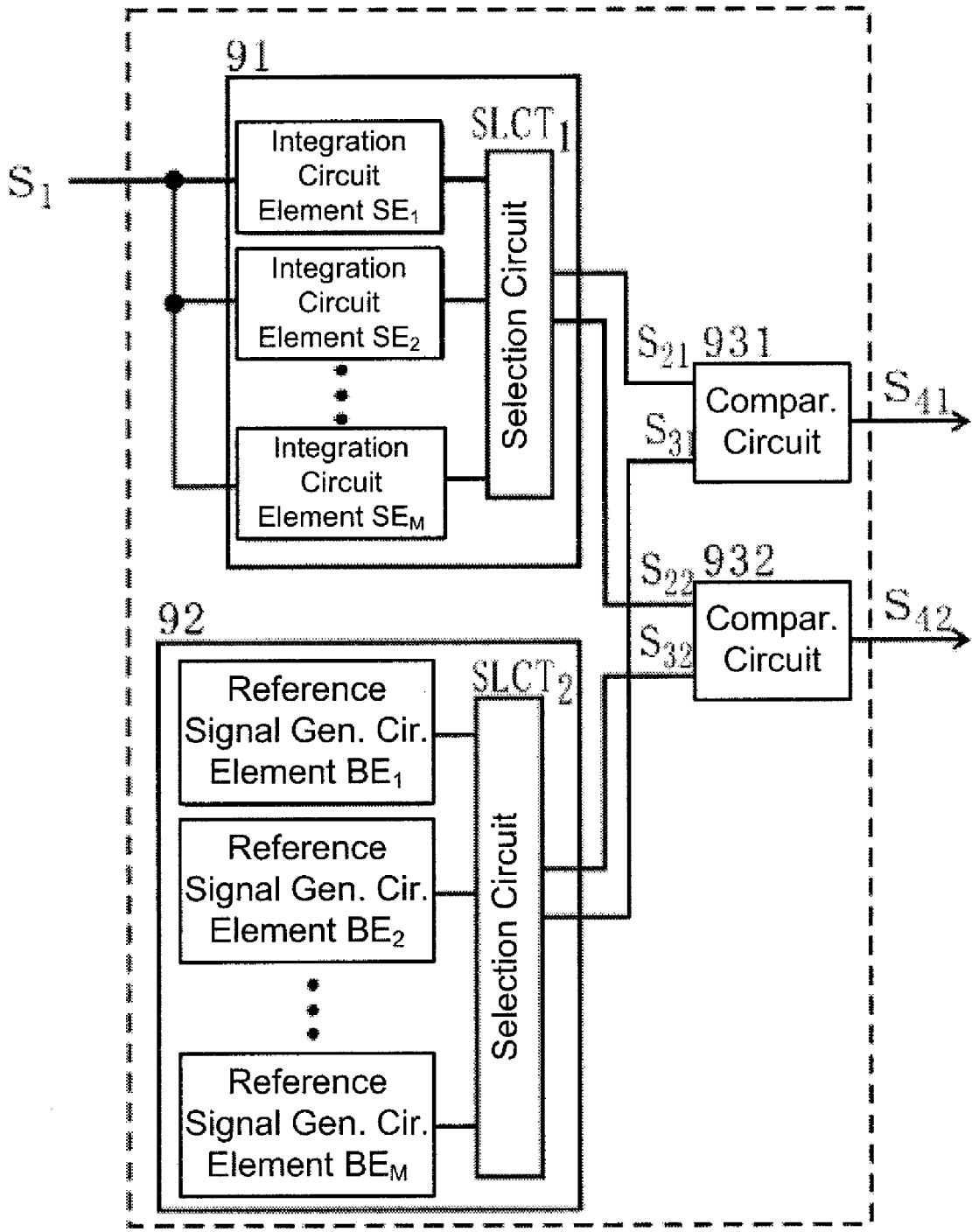
FIG. 70 is a diagram illustrating an example where a waveform synthesizing circuit in the circuit shown in FIG. 69 receives the output of the comparison circuit and synthesizes waveforms.

In the reference signal generating circuit 9, as shown in FIG. 70, the integration circuit may include plural integration circuit elements ($SE_1$, $SE_2$, ..., and $SE_M$ in FIG. 70) and a selection circuit $SLCT_1$ receiving signals therefrom and outputting plural signals (two signals $S_{21}$ and $S_{22}$ in FIG. 70).

The reference signal output circuit 92 may include plural reference signal output circuit elements ($BE_1$, $BE_2$, ..., and $BE_M$ in FIG. 70) and a selection circuit $SLCT_2$ outputting plural signals (two signals $S_{31}$ and $S_{32}$ in FIG. 70), and the comparison circuit 93 may include plural comparison circuit elements (represented by reference signs $CE_1$ and $CE_2$ in FIG. 68(B)). Here, the comparison circuit 93 may include a comparison circuit element $CE_1$ receiving one $S_{21}$ of two signals from the integration circuit 91 and one $S_{31}$ of two signals from the reference signal output circuit 92 and a comparison circuit element $CE_2$ receiving the other $S_{22}$ of two signals from the integration circuit 91 and the other $S_{32}$ of two signals from the reference signal output circuit 92.

In FIGS. 67 and 68, one of the integration circuit 91 and the reference signal output circuit 92 includes a selection circuit ($SLCT_1$ in FIG. 67 and $SLCT_2$ in FIG. 68) In FIGS. 69 and 70, both the integration circuit 91 and the reference signal output circuit 92 include the selection circuits $SLCT_1$ and $SLCT_2$, respectively. However, as shown in FIGS. 71 to 76, the integration circuit 91 and the reference signal output circuit 92 may not include the selection circuit at all.

Figure 71:
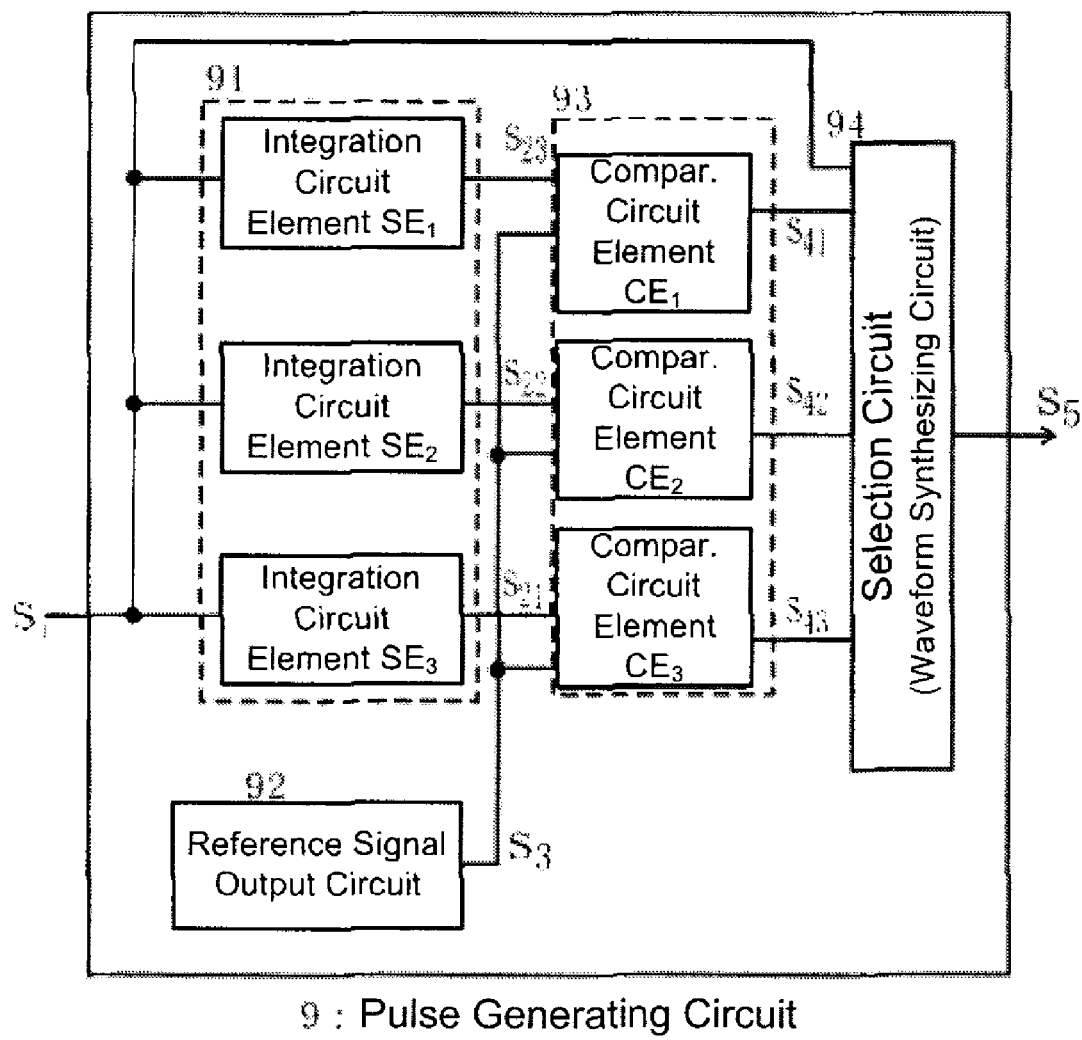
FIG. 71 is a diagram illustrating an example where the integration circuit includes plural integration circuit elements and the comparison circuit includes plural comparison circuit elements.

FIG. 71 is a diagram illustrating an example where the integration circuit 91 includes plural integration circuit elements and the comparison circuit 93 includes plural comparison circuit elements. In FIG. 71, the integration circuit 91 includes three integration circuit elements $SE_1$, $SE_2$, and $SE_3$ and the comparison circuit 93 includes three comparison circuit elements $CE_1$, $CE_2$, and $CE_3$. The outputs $SE_1$, $SE_2$, and $SE_3$ of the integration circuit elements are input to the comparison circuit elements $CE_1$, $CE_2$, and $CE_3$. The integration circuit elements $SE_1$, $SE_2$, and $SE_3$ having different integral characteristics.

The comparison circuit elements $CE_1$, $CE_2$, and $CE_3$ receive the signal $S_3$ from the reference signal output circuit 92 and output the comparison results (signals $S_{41}$ to $S_{43}$) to the waveform synthesizing circuit 94. The waveform synthesizing circuit 94 receives a pulse signal $S_1$ in addition to the signals $S_{41}$ to $S_{43}$ and synthesizes the waveforms on the basis of the received signals. For example, the waveform synthesizing circuit 94 selects one of the signals $S_{41}$, $S_{42}$, and $S_{43}$ by the use of a built-in selection circuit and generates an output pulse $S_5$ from the selected signal and the pulse signal $S_1$.

Figure 72:
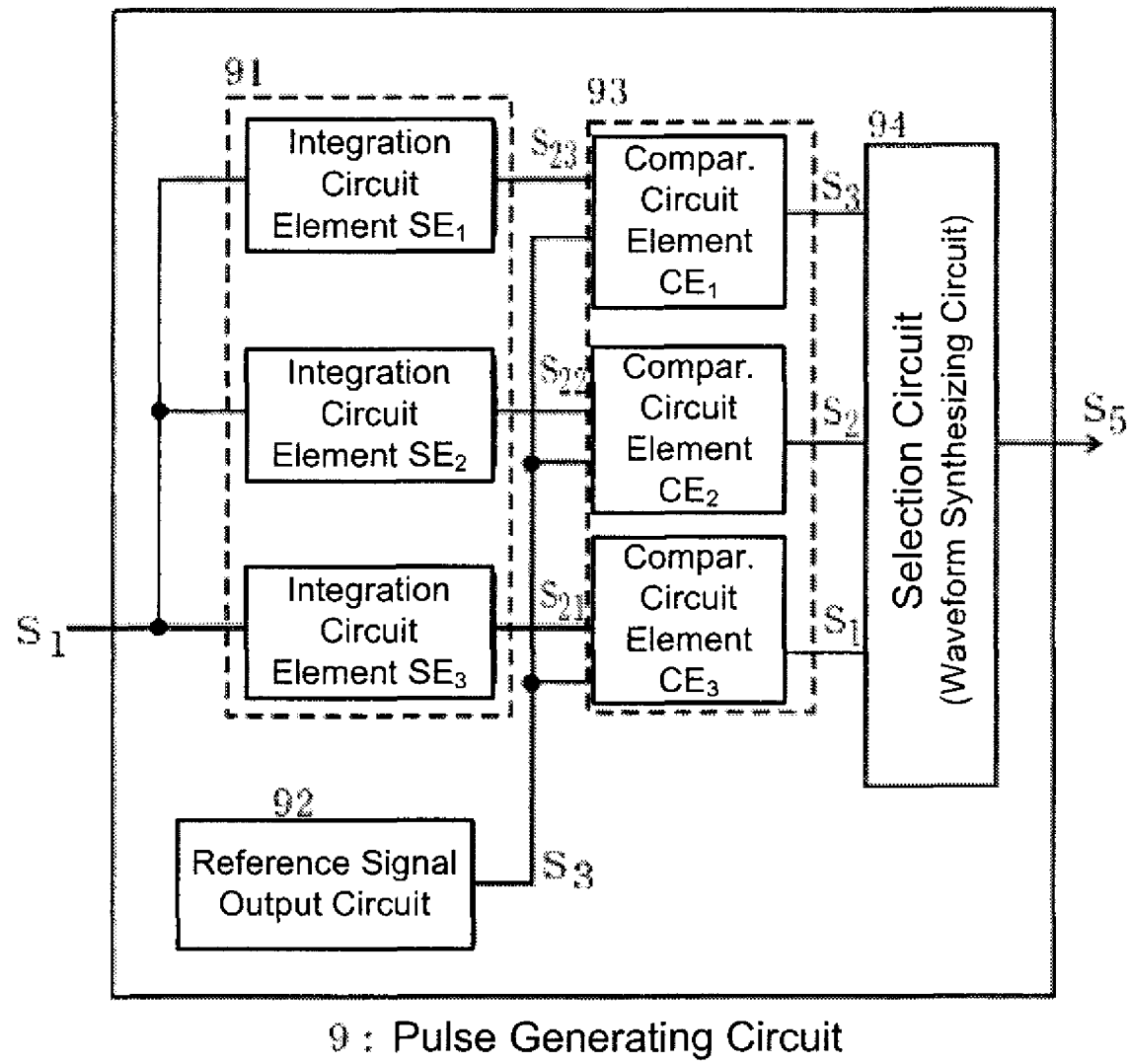
FIG. 72 is a diagram illustrating an example where the waveform synthesizing circuit in the circuit shown in FIG. 71 does not receive a pulse signal but receives the outputs of the comparison circuit elements and synthesizes waveforms.

FIG. 72 shows an example where the waveform synthesizing circuit 94 in the circuit shown in FIG. 71 does not receive the pulse signal $S_1$ but receives the output signals $S_{41}$, $S_{42}$, and $S_{43}$ of the comparison circuit elements $CE_1$, $CE_2$, and $CE_3$ to synthesize the waveforms. In this case, the waveform synthesizing circuit 94 selects two of the signals $S_{41}$, $S_{42}$, and $S_{43}$, for example, by the use of the built-in selection circuit and generate the output pulse $S_5$ from the selected signals.

An example where one of the signals $S_{41}$, $S_{42}$, and $S_{43}$ is selected and the selected signal is synthesized with $S_1$ by the waveform synthesizing circuit 94 is shown in FIG. 71, but one of $S_1$, $S_{41}$, $S_{42}$, and $S_{43}$ may be selected and output, for example, using the selection circuit instead of the waveform synthesizing circuit 94. An example where two of the signals $S_{41}$, $S_{42}$, and $S_{43}$ is selected and the selected signals are synthesized by the waveform synthesizing circuit 94 is shown in FIG. 71, but one of $S_{41}$, $S_{42}$, and $S_{43}$ may be selected and output, for example, using the selection circuit instead of the waveform synthesizing circuit 94.

Figure 73:
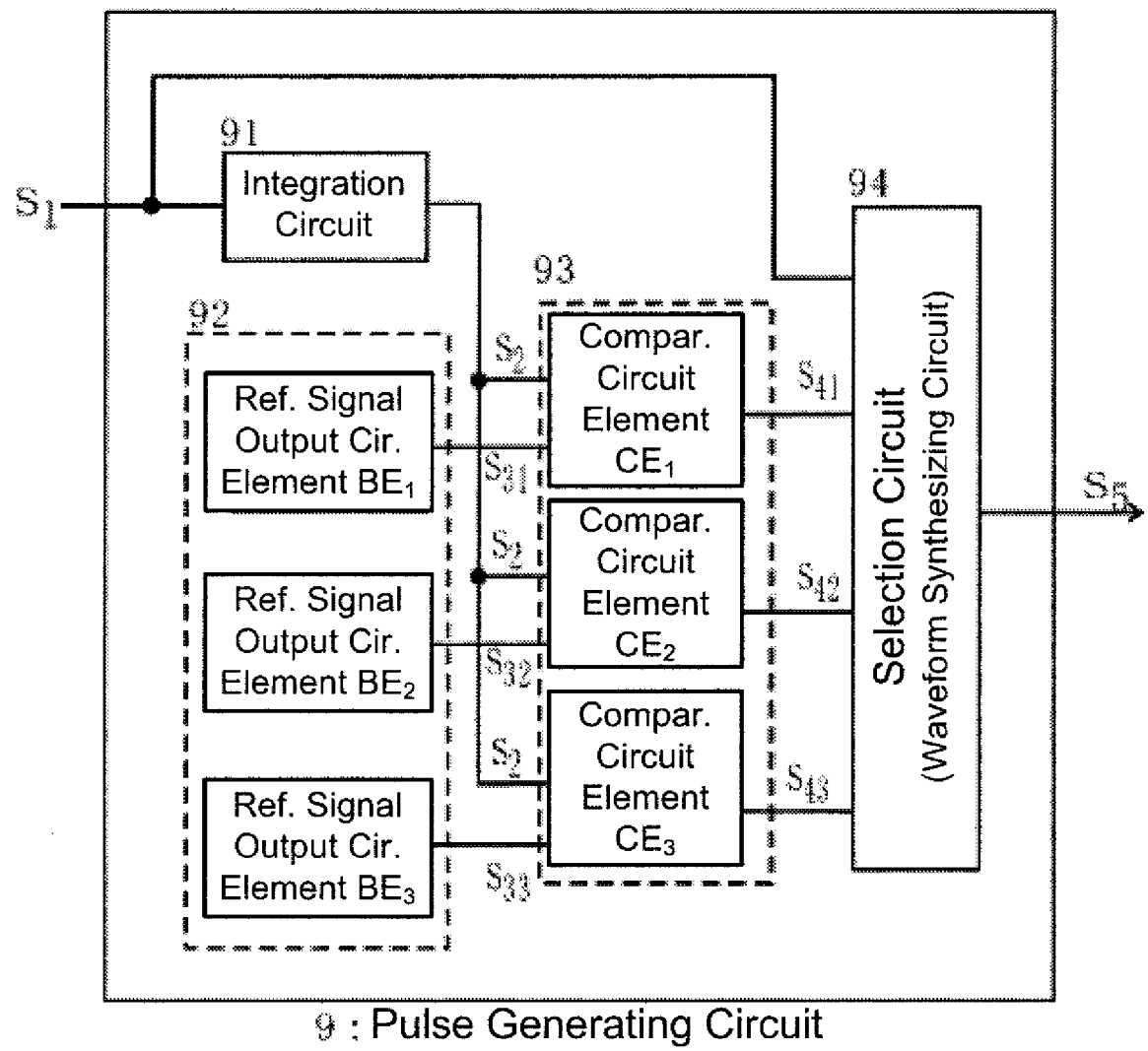
FIG. 73 is a diagram illustrating an example where the reference signal output circuit includes plural reference signal output circuit elements and the comparison circuit includes plural comparison circuit elements.

FIG. 73 is a diagram illustrating an example where the reference signal output circuit 92 includes plural reference signal output circuit elements and the comparison circuit 93 includes plural comparison circuit elements. In FIG. 73, the number of reference signal output circuit elements and the number of comparison circuit elements are three and the outputs $S_{31}$, $S_{32}$, and $S_{33}$ of the reference signal output circuit elements $BE_1$, $BE_2$, and $BE_3$ are input to the comparison circuit elements $CE_1$, $CE_2$, and $CE_3$. The input and output characteristics of the reference signal output circuit elements $BE_1$, $BE_2$, and $BE_3$ are different from each other.

The comparison circuit elements $CE_1$, $CE_2$, and $CE_3$ receive the signal $S_2$ from the integration circuit 91 and output the comparison results (signals $S_{41}$ to $S_{43}$) to the waveform synthesizing circuit 94. The waveform synthesizing circuit 94 receives the pulse signal $S_1$ in addition to the signals $S_{41}$ to $S_{43}$ and synthesizes the waveforms on the basis of the received signals.

Figure 74:
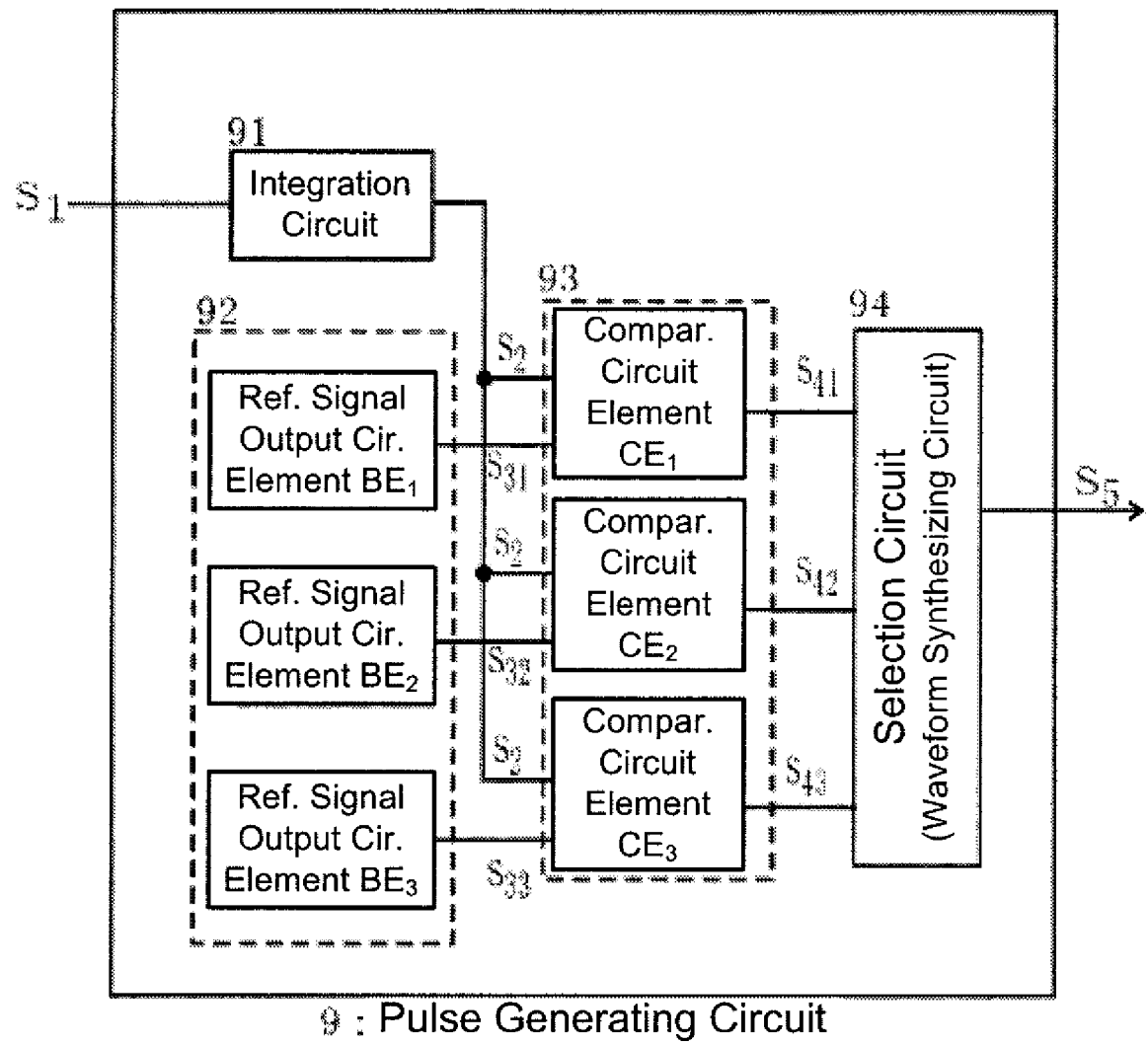
FIG. 74 is a diagram illustrating an example where the waveform synthesizing circuit in the circuit shown in FIG. 73 receives the output of the comparison circuit and synthesizes waveforms.

FIG. 74 shows an example where the waveform synthesizing circuit 94 in the circuit shown in FIG. 73 does not receive the pulse signal $S_1$ but receives the outputs $S_{41}$ to $S_{43}$ of the comparison circuit elements $CE_1$, $CE_2$, and $CE_3$ to synthesize the waveforms.

An example where one of the signals $S_{41}$, $S_{42}$, and $S_{43}$ is selected and the selected signal is synthesized with $S_1$ by the waveform synthesizing circuit 94 is shown in FIG. 73, but one of $S_1$, $S_{41}$, $S_{42}$, and $S_{43}$ may be selected and output, for example, by the use of the selection circuit instead of the waveform synthesizing circuit 94.

Figure 75:
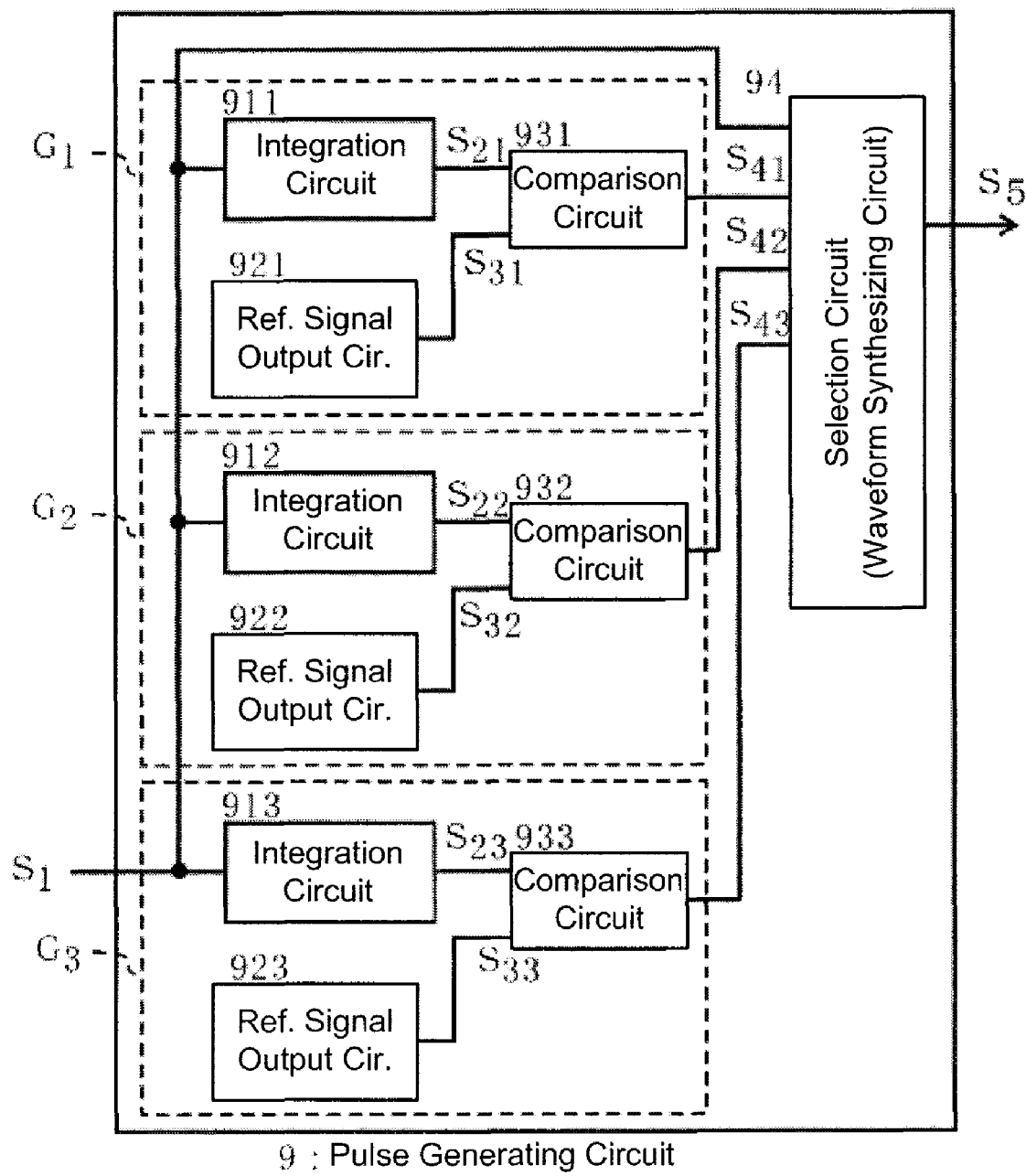
FIG. 75 is a diagram illustrating an example of a pulse generating circuit in which plural sets of the integration circuit, the reference signal output circuit, and the comparison circuit are provided and the waveform synthesizing circuit is shared.

FIG. 75 shows an example of the pulse generating circuit 9 in which a group $G_1$ of an integration circuit 911, a reference signal output circuit 921, and a comparison circuit 931, a group $G_2$ of an integration circuit 912, a reference signal output circuit 922, and a comparison circuit 932, and a group $G_3$ of an integration circuit 913, a reference signal output circuit 923, and a comparison circuit 933 are provided and the waveform synthesizing circuit 94 is used in common. In the pulse generating circuit 9 shown in FIG. 75, different pulses (the signals $S_{41}$, $S_{42}$, and $S_{43}$ from the comparison circuit elements $CE_1$, $CE_2$, and $CE_3$) are generated from the groups $G_1$, $G_2$, and $G_3$ and the waveform synthesizing circuit 94 generates a proper waveform from the generated signals and the input pulse signal $S_1$. The pulse generating circuit shown in FIG. 75 is the same as the waveform synthesizing circuit (a combination of FIGS. 71 and 73) in which the integration circuit 91, the reference signal output circuit 92, and the comparison circuit 93 each include three elements and the waveform synthesizing circuit 94 receives the pulse signal $S_1$.

Figure 76:
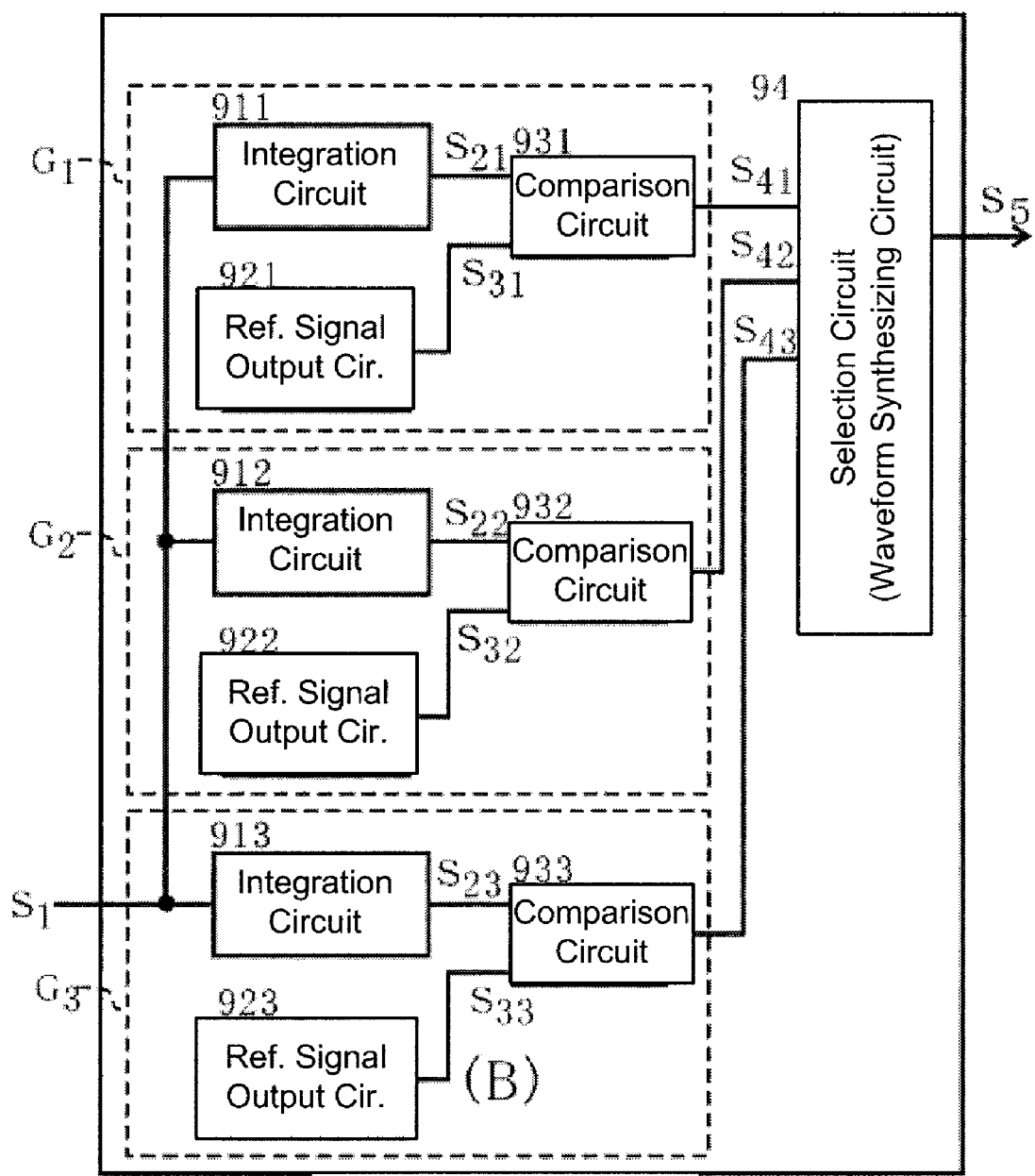
FIG. 76 is a diagram illustrating another example of the pulse generating circuit in which plural sets of the integration circuit, the reference signal output circuit, and the comparison circuit are provided and the waveform synthesizing circuit is shared.

FIG. 76 is a diagram illustrating an example where the pulse generating circuit 9 shown in FIG. 75 does not receive the input pulse signal $S_1$. In the pulse generating circuit shown in FIG. 76, different pulses ($S_{41}$, $S_{42}$, and $S_{43}$ from the comparison circuit elements $CE_1$, $CE_2$, and $CE_3$) are generated from the groups $G_1$, $G_2$, and $G_3$, and a proper waveform $S_5$ is generated on the basis of the generated signals by the waveform synthesizing circuit 94. The pulse generating circuit shown in FIG. 76 is the same as the waveform synthesizing circuit (a combination of FIGS. 72 and 74) in which the integration circuit 91, the reference signal output circuit 92, and the comparison circuit 93 each include three elements and the waveform synthesizing circuit 94 does not receive the pulse signal $S_1$.

Figure 77:
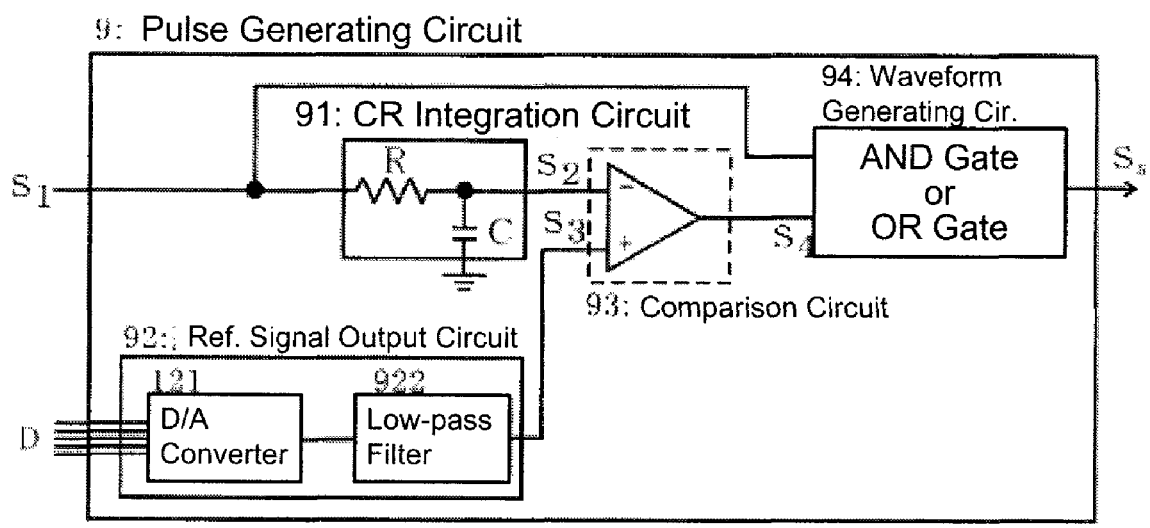
FIG. 77 is a diagram illustrating a specific example of the pulse generating circuit used in the invention.

FIG. 77 is a diagram specifically illustrating the pulse generating circuit 9 shown in FIG. 66.

In this example, the integration circuit 91 includes a CR circuit, the reference signal output circuit 92 includes a D/A converter 921 and a low-pass filter 922, the comparison circuit 93 includes an analog amplifier (OP AMP), and the waveform synthesizing circuit 94 includes an AND circuit (or an OR circuit).

Figure 78:
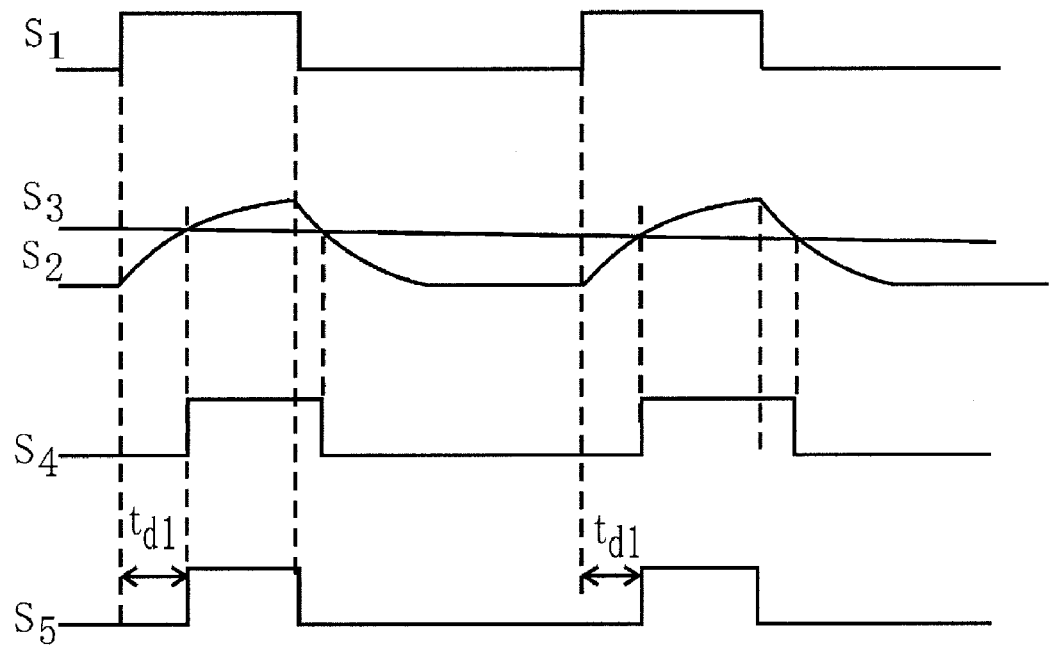
FIG. 78 is a diagram illustrating an example of waveforms of the pulse generating circuit, where
Figure 78:
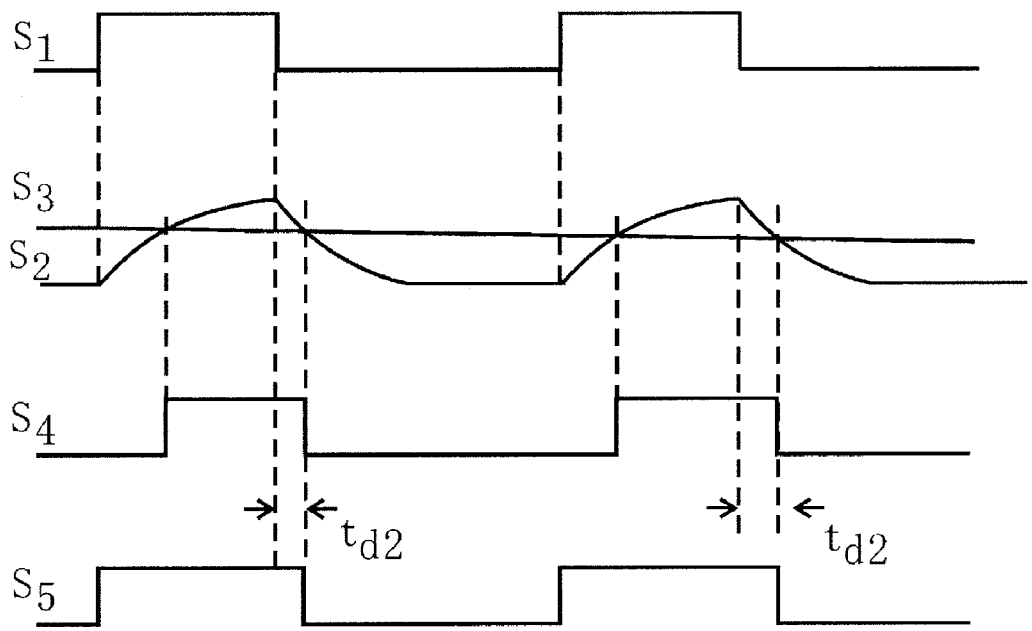

Examples of operation waveforms of the pulse generating circuit 9 shown in FIG. 73 or 74 are shown in FIGS. 78(A) and 78(B). FIG. 78(A) shows an example where the waveform synthesizing circuit 94 includes an AND circuit and FIG. 78(B) shows an example where the waveform synthesizing circuit 94 is an OR circuit.

In a system sufficiently operating with basic clock frequencies used to generate the pulse signal $S_1$, the above-mentioned pulse generating circuit is not effective greatly. Due to the delay $t_{d1}$ of $S_5$ in FIG. 78(A) resulting from the pulse generating circuit 9 and the delay $t_{d2}$ of $S_5$ in FIG. 78(B), the rising edge (FIG. 78(A)) and the falling edge (FIG. 78(B)) of $S_5$ can be generated as if a clock higher in frequency than the basis clock is used.

Figure 79:
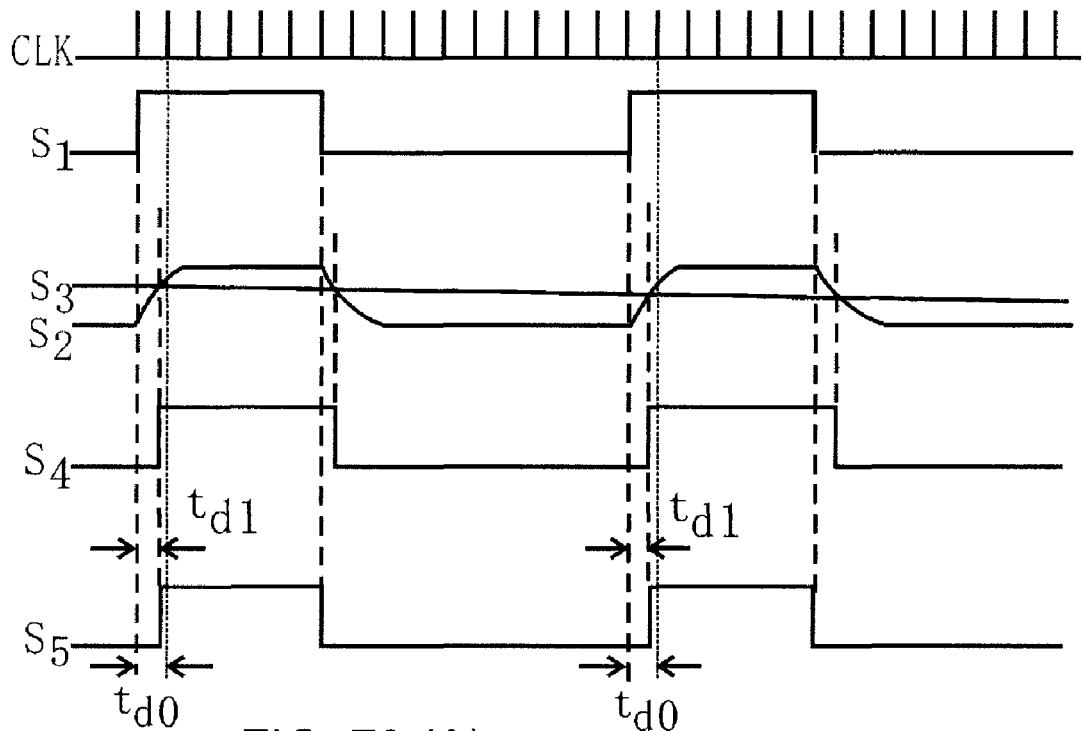
FIG. 79 is a diagram illustrating another example of waveforms of the pulse generating circuit, where
Figure 79:
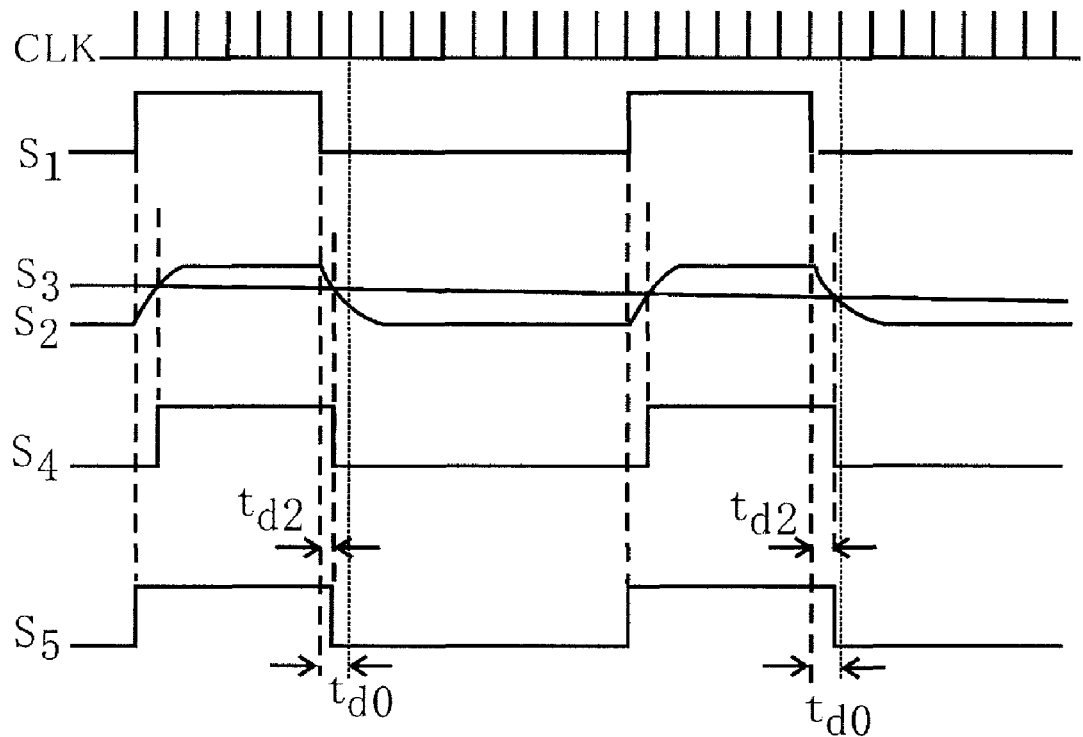

FIGS. 79(A) and 79(B) show examples of operation waveforms for generating a timing signal with a resolution higher than that of the basic clock CLK used to generate the pulse signal $S_1$. FIG. 79(A) shows an example where the waveform synthesizing circuit 94 includes an AND circuit and FIG. 79(B) shows an example where the waveform synthesizing circuit 94 is an OR circuit. Since the delay $t_{d1}$ of the rising edge of $S_5$ in FIG. 79(A) can be set shorter than the period $t_{d0}$ of the clock CLK and the delay $t_{d1}$ of the falling edge of $S_5$ in FIG. 79(B) can be set shorter than the period $t_{d0}$ of the clock CLK, it is possible to perform substantially the same process as using a clock higher than the clock CLK.

Figure 80:
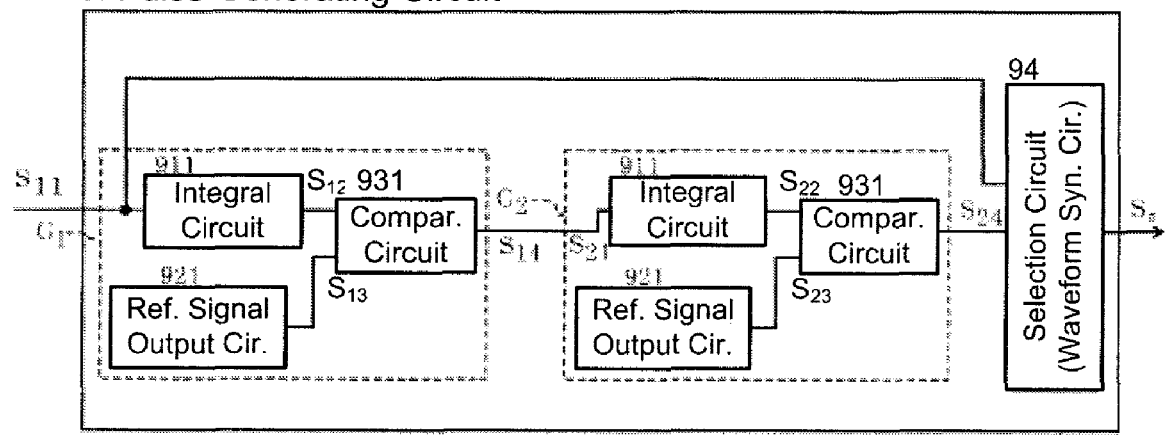
FIG. 80 is a diagram illustrating an example of the pulse generating circuit including plural sets of the integration circuit, the reference signal output circuit, and the comparison circuit connected in series.
Figure 81:
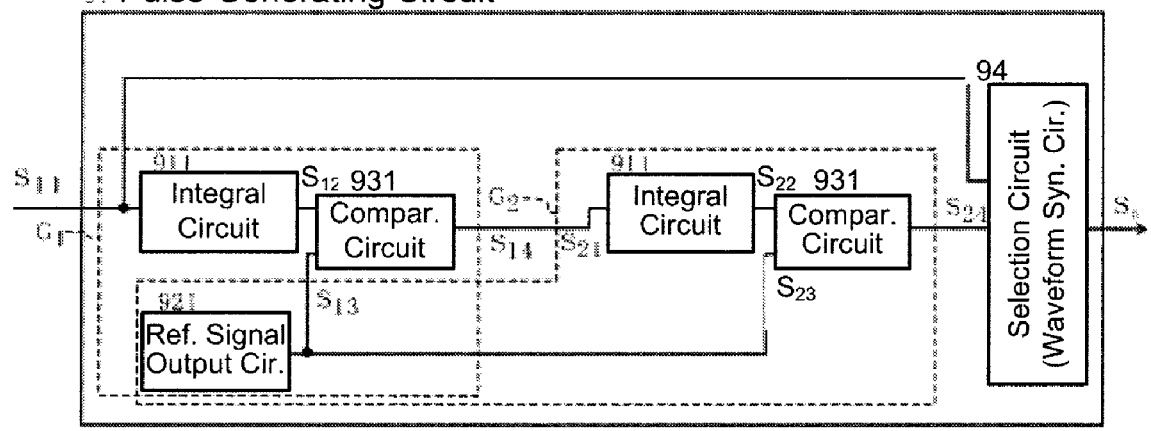
FIG. 81 is a diagram illustrating an example where the reference signal output circuit is shared in the pulse generating circuit shown in FIG. 80.

FIG. 80 is a diagram illustrating an example where plural groups of an integration circuit, a reference signal output circuit, and a comparison circuit are provided in the pulse generating circuit. In the pulse generating circuit 9 shown in FIG. 80, two groups $G_1$ and $G_2$ of the integration circuit 911, the reference signal output circuit 921, and the comparison circuit 931 are connected in series and the waveform synthesizing circuit 94 is provided at the subsequent stage of the group $G_2$. The waveform synthesizing circuit 94 acquires the input $S_{11}$ of the group $G_1$ and the input $S_{24}$ of the group $G_2$ and generates a proper waveform $S_5$ on the basis of the acquired signals.

The time constant of the integration circuit 911 in the group $G_2$ is greater than the time constant of the integration circuit 911 in the group $G_2$.

Accordingly, a fine edge timing of the group $G_1$ is generated and a finer edge timing of the group $G_2$ is generated.

Figure 82:
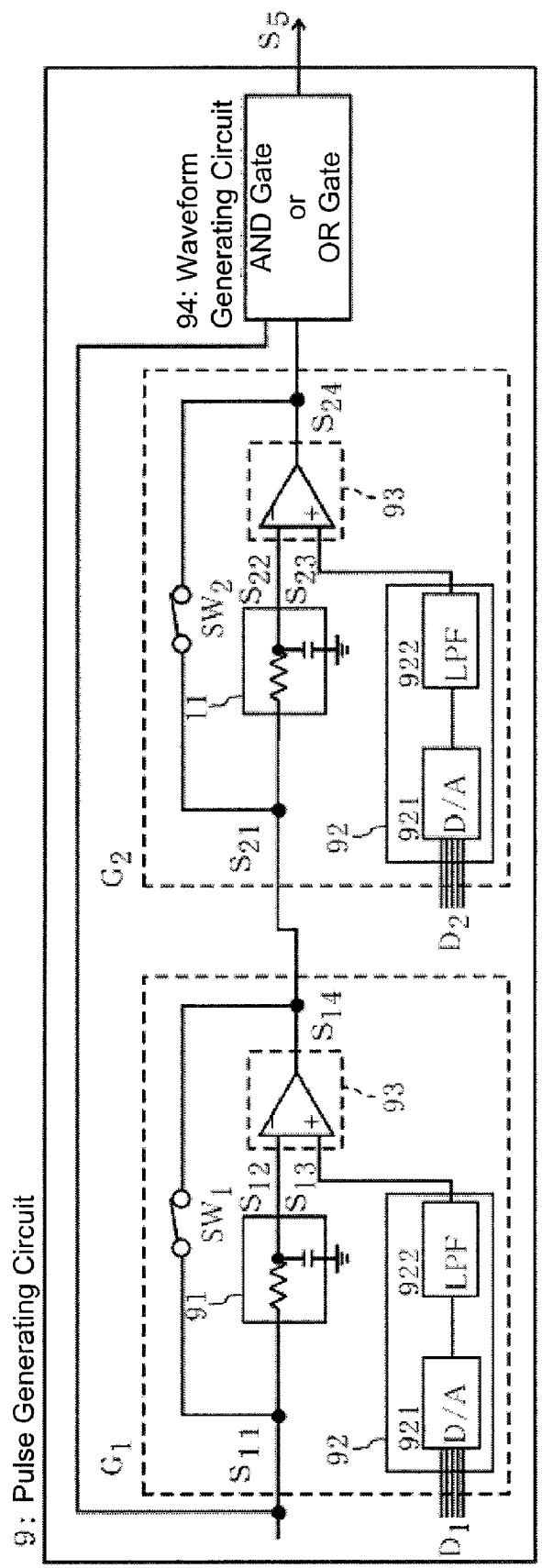
FIG. 82 is a diagram illustrating a specific example of the pulse generating circuit shown in FIG. 80.

FIG. 82 is a circuit diagram specifically illustrating the pulse generating circuit 9 shown in FIG. 80. In the pulse generating circuit 9 shown in FIG. 80, the groups $G_1$ and $G_2$ each include switches $SW_1$ and $SW_2$ switching the serial connection of the integration circuit 911 and the reference signal output circuit 921 and can select one of the serial connections of the groups $G_1$ and $G_2$. A switching may be disposed in one of the groups $G_1$ and $G_2$.

Figure 83:
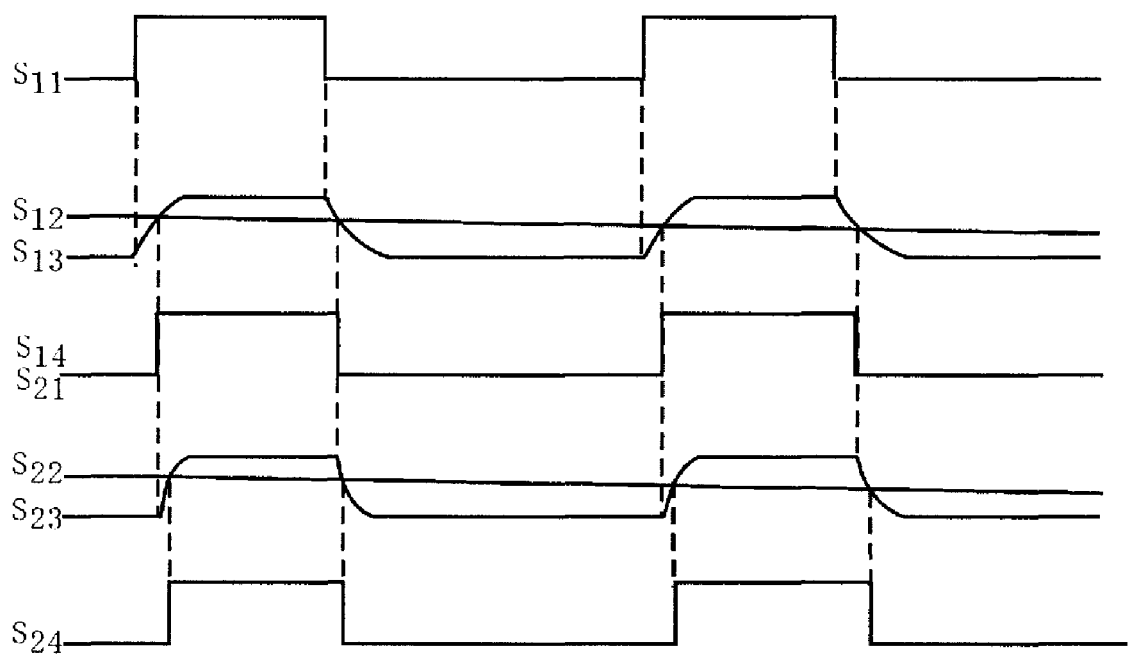
FIG. 83 is a diagram illustrating an example of operation waveforms of the pulse generating circuit shown in FIG. 82.

In the pulse generating circuit 9 according to this example, as can be seen from the operation waveforms (the output of the waveform synthesizing circuit 94 is not shown) of FIG. 83, the same edge (edge with the same precision) as using a clock higher than the basic clock is generated by the group $G_1$ of the integration circuit 911, the reference signal output circuit 921, and the comparison circuit 931 at the previous stage and the finer edge is obtained by the group $G_2$ of the integration circuit 911, the reference signal output circuit 921, and the comparison circuit 931 at the subsequent stage.

Figure 84A:
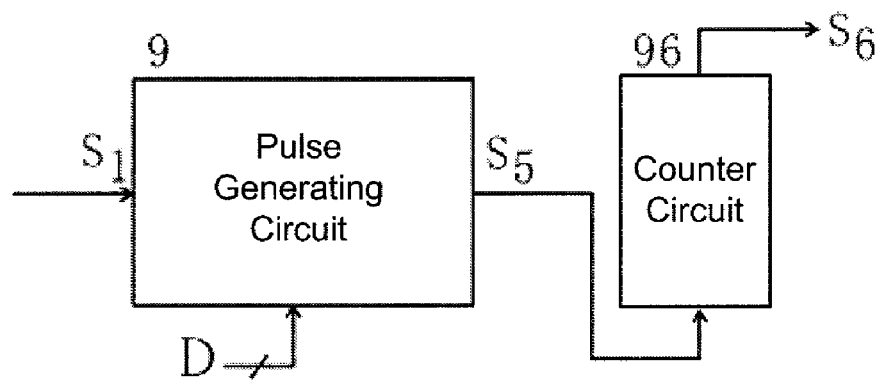
FIG. 84(A) is a diagram illustrating the pulse generating circuit in which a counter circuit is further disposed at a previous stage of the pulse generating circuit shown in FIG. 66 or 67 and FIG. 84(B) is a timing diagram illustrating an operation of the pulse generating circuit shown in FIG. 84(A).
Figure 84B:
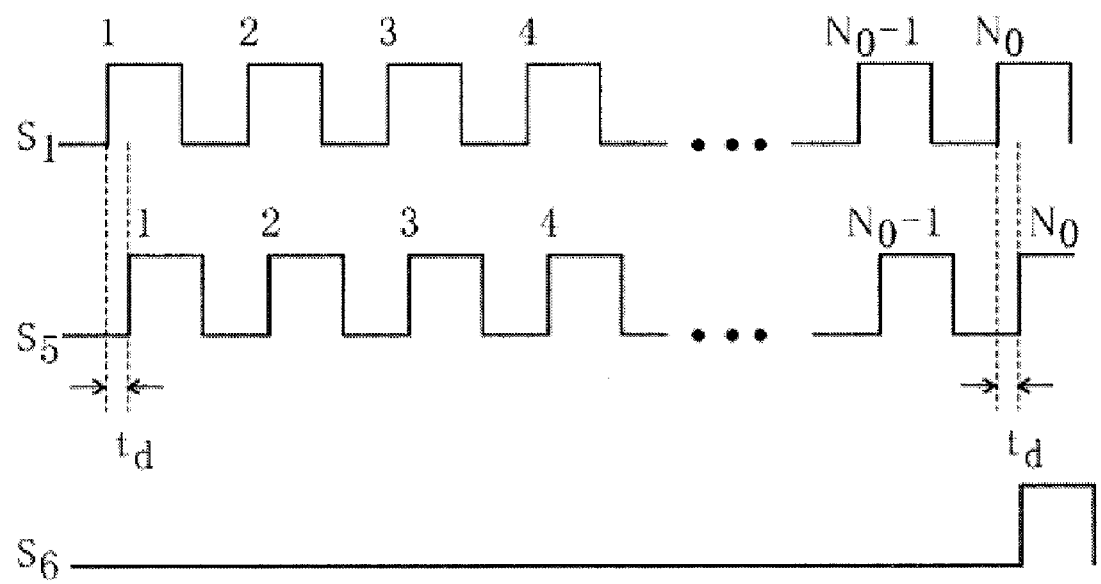

FIG. 84(A) is a diagram illustrating the pulse generating circuit in which a counter circuit 96 is further disposed at a subsequent stage of the pulse generating circuit 9 shown in FIG. 66 or the like and FIG. 84(B) is a timing diagram illustrating an operation of the pulse generating circuit 2 shown in FIG. 84(A). As shown in FIG. 84(B), it is possible to generate a pulse signal of a frequency equal to or less than the frequency of the pulse signal and to generate turning-on or turning-off timing of a processing wave not shown.

INDUSTRIAL APPLICABILITY

The invention can be applied to a PWM control device and a VCO.

The invention claimed is:

1. An analog-digital converter circuit comprising:
    a periodic signal output circuit receiving a temporally-varying analog signal as an input, replacing the analog signal with N serial periodic signals of a frequency corresponding to a magnitude of the analog signal, and outputting the N serial periodic signals;
    N pulse counting devices counting a number of pulses of the N serial periodic signals; and
    a digital signal generating circuit receiving the N serial periodic signals as an input and generating a digital signal corresponding to the magnitude of the analog signal from the periodic signals every sampling period,
    wherein the periodic signal generating circuit includes N converters converting a magnitude of an electric signal into a frequency and the converters generate the N serial periodic signals, and allows a first to j-th pulse counting devices of the N pulse counting devices to count a count value X and allows the other pulse counting devices to count a count value X−1 in each sampling period by sequentially delaying and generating the N serial periodic signals, and
    wherein the digital signal generating circuit converts the analog signal to the digital signal with a resolution N times higher than that for converting the analog signal into the digital signal in the sampling period on the basis of counting statuses of the N pulse counting devices.

2. The analog-digital converter circuit according to claim 1, wherein the periodic signal output circuit sequentially generates the N serial periodic signals at a delay time interval of [approximate value of one period (T) of periodic signals]÷N.

3. The analog-digital converter circuit according to claim 1, wherein the converters include an integration circuit and the periodic signals generated by the converters have a time period from an operation start of the integration circuits with an input voltage to an operation end as one period.

4. The analog-digital converter circuit according to claim 1, wherein the periodic signal output circuit includes at least one converter converting a magnitude of an electric signal into a frequency and at least one delay circuit delaying and outputting the output signal of the converter, and the at least one converter and the delay circuit generate the N serial periodic signals.

5. A timing signal generating circuit comprising:
a periodic signal output circuit outputting M serial periodic signals of a frequency;
M comparison pulse counting devices receiving the M serial periodic signals corresponding to a magnitude of a digital signal and outputting a predetermined signal when a count value reaches a predetermined value; and
a signal generating circuit receiving the predetermined M signals from the M comparison pulse counting devices and generating a timing signal at a time interval corresponding to the magnitude of the digital signal from the predetermined signals every reference period,
wherein a first count value is set in a first to k-th comparison pulse counting devices of the M comparison pulse counting devices and a second count value is set in the other comparison pulse counting devices, and
wherein the signal generating circuit generates the timing signal with a resolution N times higher than that for generating the timing signal by the use of one comparison pulse counting device on the basis of output statuses of the M comparison pulse counting devices by receiving the M serial periodic signals sequentially delayed.

6. The timing signal generating circuit according to claim 5, wherein the M serial periodic signals are sequentially input at a delay time interval of [approximate value of one period (T) of periodic signals]÷M.

7. The timing signal generating circuit according to claim 5, wherein a distribution circuit setting the count value is provided to the M comparison pulse counting devices.

8. The timing signal generating circuit according to claim 5, wherein the periodic signal output circuit includes M converters converting a magnitude of an electric signal into a frequency and the converters generate the periodic signals.

9. The timing signal generating circuit according to claim 5, wherein the converters include an integration circuit and the periodic signals generated by the converters have a time period from an operation start of the integration circuits with an input voltage to an operation end as one period.

10. A control device comprising:
an analog-digital converter circuit including:
    a periodic signal output circuit receiving a temporally-varying analog signal as an input, replacing the analog signal with N serial periodic signals of a frequency corresponding to a magnitude of the analog signal, and outputting the N serial periodic signals;
    N pulse counting devices counting a number of pulses of the N serial periodic signals; and
    a digital signal generating circuit receiving the N serial periodic signals as an input and generating a digital signal corresponding to the magnitude of the analog signal from the periodic signals every sampling period,
    wherein the periodic signal generating circuit allows a first to j-th pulse counting devices of the N pulse counting devices to count a count value X and allows the other pulse counting devices to count a count value X−1 in each sampling period by sequentially delaying and generating the N serial periodic signals, and
    wherein the digital signal generating circuit converts the analog signal to the digital signal with a resolution N times higher than that for converting the analog signal into the digital signal in the sampling period on the basis of counting statuses of the N pulse counting devices;
a timing signal generating circuit including:
    a periodic signal output circuit outputting M serial periodic signals of a frequency;
    M comparison pulse counting devices receiving the M serial periodic signals corresponding to a magnitude of a digital signal and outputting a predetermined signal when a count value reaches a predetermined value; and
    a signal generating circuit receiving the predetermined M signals from the M comparison pulse counting devices and generating a timing signal at a time interval corresponding to the magnitude of the digital signal from the predetermined signals every reference period,
    wherein a first count value is set in a first to k-th comparison pulse counting devices of the M comparison pulse counting devices and a second count value is set in the other comparison pulse counting devices, and
    wherein the signal generating circuit generates the timing signal with a resolution N times higher than that for generating the timing signal by the use of one comparison pulse counting device on the basis of output statuses of the M comparison pulse counting devices by receiving the M serial periodic signals sequentially delayed; and
a digital signal processing circuit,
wherein the analog-digital converter circuit digitalizes an analog output of a control target,
wherein the digital signal processing circuit processes the digitalized signal and generates a digital timing value, and
wherein the timing signal generating circuit generates a controlling timing signal on the basis of the digital timing value.

11. The control device according to claim 10, wherein the periodic signal output circuit used in the analog-digital converter circuit and the periodic signal output circuit used in the timing signal generating circuit are shared.

12. The control device according to claim 10, wherein the digital signal processing circuit performs a digital filter operation, one operation of P control, I control, and D control, or a combination thereof.

13. The control device according to claim 10, wherein the control target is a power converter circuit including a switching element,
    wherein the analog-digital converter circuit receives an output voltage of the power converter circuit as an input, and
    wherein the timing signal generating circuit outputs an ON/OFF timing signal to the switch element of the power converter circuit.

* * * * *